US007112396B2

(12) United States Patent
Miyake et al.

(10) Patent No.: US 7,112,396 B2
(45) Date of Patent: Sep. 26, 2006

(54) MULTICOLOR IMAGE FORMING MATERIAL

(75) Inventors: Kazuhito Miyake, Shizuoka (JP); Mitsuru Yamamoto, Shizuoka (JP); Tetsunori Matsushita, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 36 days.

(21) Appl. No.: 10/509,798

(22) PCT Filed: Mar. 31, 2003

(86) PCT No.: PCT/JP03/04106

§ 371 (c)(1),
(2), (4) Date: Sep. 29, 2004

(87) PCT Pub. No.: WO03/086773

PCT Pub. Date: Oct. 23, 2003

(65) Prior Publication Data

US 2005/0153229 A1 Jul. 14, 2005

(30) Foreign Application Priority Data

| | | |
|---|---|---|
| Apr. 1, 2002 | (JP) | 2002-098802 |
| May 27, 2002 | (JP) | 2002-152500 |
| Jul. 25, 2002 | (JP) | 2002-216943 |
| Jul. 25, 2002 | (JP) | 2002-217154 |

(51) Int. Cl.
*G03F 7/34* (2006.01)
*G03F 7/11* (2006.01)

(52) U.S. Cl. .................. 430/200; 430/201; 430/271.1; 428/32.8

(58) Field of Classification Search ................ 430/200, 430/271.1, 201; 428/32.8
See application file for complete search history.

(56) References Cited

U.S. PATENT DOCUMENTS

| | | | | |
|---|---|---|---|---|
| 5,089,372 | A * | 2/1992 | Kirihata et al. | 430/167 |
| 5,935,902 | A * | 8/1999 | Imamura | 503/227 |
| 6,468,634 | B1 * | 10/2002 | Miyake et al. | 428/32.6 |
| 6,818,591 | B1 * | 11/2004 | Arai et al. | 503/201 |
| 2002/0009664 | A1 * | 1/2002 | Wachi et al. | 430/200 |
| 2002/0187418 | A1 * | 12/2002 | Nakamura et al. | 430/200 |

FOREIGN PATENT DOCUMENTS

| | | | |
|---|---|---|---|
| JP | 8-267916 | A | 10/1996 |
| JP | 11-334230 | A | 12/1999 |
| JP | 11-334231 | A | 12/1999 |
| JP | 11-348438 | A | 12/1999 |
| JP | 2000-351282 | A | 12/2000 |
| JP | 2002-274069 | A | 9/2002 |
| JP | 2002-362045 | A | 12/2002 |

OTHER PUBLICATIONS

International Search Report for PCT/JP03/04106 dated Jul. 8, 2003.

* cited by examiner

*Primary Examiner*—Richard L. Schilling
(74) *Attorney, Agent, or Firm*—Sughrue Mion, PLLC

(57) ABSTRACT

It is intended to provide a multicolor image forming material for recording an image by irradiation with laser light comprising an image receiving sheet having an image receiving layer and at least four heat transfer sheets having a light-heat conversion layer and an image forming layer, wherein the light-heat conversion layer contains a polyamide-imide of a specific structure and a cyanine colorant of a specific structure. It is further intended to provide a multiple color image forming material wherein the difference in the visible light range between the reflectance of the image forming layer of each heat transfer sheet before the irradiation with laser light and recording of an image and the reflectance of the image forming layer transferred to the image receiving layer of the image receiving sheet due to the irradiation with laser light is 10% or less, and a multiple color image forming material wherein the color difference between the color hue of the image forming layer of each heat transfer sheet immediately after the transfer to the image forming layer of the image forming sheet due to the irradiation with laser light and before exposure and the color hue thereof after exposure does not exceed 2.

10 Claims, 4 Drawing Sheets

MULTICOLOR IMAGE FORMING MATERIAL

TECHNICAL FIELD

This invention relates to an image forming material which comprises heat transfer sheets and an image receiving sheet and is usable in a method of forming a multicolor image by irradiation with laser light.

BACKGROUND ART

In the field of graphic arts, a printing plate is produced using a set of color separations of a color original which are prepared using lithographic films. In general, color proofs are prepared from color separations in order to inspect for errors in color separation and to check the need for color correction and the like before final printing (practical printing operation). Color proofs are required to realize high resolution enabling accurate half tone reproduction and high processing stability. To obtain color proofs close to actual prints, it is desirable for the materials of color proofs to be the same as those used on press, i.e., the same paper as the base material and the same pigments as the coloring materials. There is a higher demand for a dry process involving no processing solutions for the preparation of color proofs.

With the recent spread of computerized systems in prepress work, recording systems for preparing color proofs directly from digital signals have been developed. Such computerized systems, particularly contemplated for preparing high quality color proofs, are generally capable of reproducing dot images at 150 lines or more per inch. In order to obtain high quality proofs from digital signals, a laser beam is used as a recording head, which is capable of modulation according to digital signals and focusing into a small spot diameter. Hence it is demanded to develop image forming materials that exhibit high sensitivity to laser light and high resolution enabling reproduction of highly precise dot images.

Image forming materials known useful in image transfer methods using laser light include a thermal melt transfer sheet, which comprises a support, a light-heat conversion layer capable of absorbing laser light to generate heat, and an image forming layer having a pigment dispersed in a heat fusible matrix (e.g., a wax or a binder) in the order described (JP-A-5-58045). In the image forming method with the use of such a thermal transfer sheet of this type, the laser-irradiated area of the light-heat conversion layer generates heat to melt the image forming layer, and the molten part of the image forming layer is transferred to the image receiving sheet laminated on the transfer sheet, thereby forming an image on the image receiving sheet.

JP-A-6-219052 teaches a heat transfer sheet comprising a support, a light-heat conversion layer containing a light-heat converting substance, a heat release layer as thin as 0.03 to 0.3 μm, and an image forming layer containing a colorant in this order. In the case of this heat transfer sheet, the heat release layer reduces its bonding strength between the image forming layer and the light-heat conversion layer upon being irradiated with laser light. As a result, a high precision transfer image is formed on the image receiving sheet provided on the heat transfer sheet. This image formation method using the above-described heat transfer sheet utilizes so-called "ablation". That is, a laser-irradiated area of the heat release layer decomposes and vaporizes, resulting in reduction of the strength bonding the image forming layer and the light-heat conversion layer in that area. As a result, the image forming layer of that area is transferred to the image receiving sheet laminated thereon.

These imaging methods are advantageous in that images can be formed on printing paper having an image receiving layer (adhesive layer) and that a multicolor image can easily be obtained by successively transferring images of different colors onto the same image receiving sheet. The method utilizing ablation is particularly advantageous for ease of forming a highly precise image and is useful to prepare color proofs (direct digital color proofs: DDCPs) or precise mask images.

With the spread of desk-top publishing (DPT) work, printing companies adopting a computer-to-plate (CTP) system have a strong demand for a DDCP system, which eliminates the need of intermediate film or plate output as has been involved in traditional analog proofing. In recent years, DDCPs with higher quality, higher stability, and larger sizes have been demanded as good approximations to the final prints.

Laser thermal transfer systems are capable of image formation at high resolution. Options include (1) laser sublimation, (2) laser ablation, and (3) laser melt.

Using any of the above-described systems, it is required that a multicolor image forming material comprising a heat transfer sheet and an image receiving sheet shows a high sensitivity of a recorded image and little change in color hue before and after exposure. It is also required to improve the stability with time of a liquid coating composition for the light-heat conversion layer.

In recent years, multibeams of laser light using a plurality of laser beams are employed for shorten recording time in image recording with laser-irradiation. In the case of recording with multibeam laser light by using an existing heat transfer sheet, it is sometimes observed that the transfer image formed on the image receiving sheet shows an only insufficient image density. A serious lowering in the image density arises observed particularly in high-energy laser recording. As the results of studies by the present inventors, it is found out that a lowering in image density is caused by uneven transfer occurring in high-energy laser irradiation.

In the case of recording an image by laser irradiation, there arises another problem that a light-heat converting substance contained in the light-heat conversion layer or its decomposition product migrates into the image forming layer and then is transferred together with the image forming layer, thereby worsening the color hue of the transfer image thus formed.

It is also required to solve these problems.

DISCLOSURE OF THE INVENTION

An object of the present invention is to provide a large size DDCP capable of providing a high quality, a high stability, a good approximation to final printed products. More specifically speaking, an object of the present invention is to provide a multicolor image forming material which is usable in a multicolor image formation method and has the following characteristics:

(1) in thin film heat transfer of colorants, a heat transfer sheet being excellent in sensitivity and light-resistance, a liquid coating composition for forming the same being excellent in stability with time, and a light-heat conversion layer not being affected by an illumination light sources when compared with pigment colorants and prints, thereby achieving excellent dot sharpness and stability;

(2) an image receiving sheet stabilizing the image forming layer of a laser energy heat transfer sheet and ensuring image receiving;

(3) enabling transfer onto printing papers including art (coated) paper, mat paper, coated fine paper and so on within range of at least 64 to 157 $g/m^2$ and ensuring the reproduction of delicate textures and accurate paper brightness (high-key parts);

(4) ensuring highly stable transfer release properties; and (5) being capable of forming images, which have excellent image qualities and stable transfer density, on an image receiving sheet even in the case of high-energy laser recording with multibeam laser light under various temperature and humidity conditions.

These objects of the present invention can be achieved by providing the multicolor image forming material according to the invention having the following constitution.

(1) A multicolor image forming material comprising an image receiving sheet having an image receiving layer and at least four heat transfer sheets each having at least a light-heat conversion layer and an image forming layer formed on a support, each of the heat transfer sheets being adapted to be superposed on the image receiving sheet with the image forming layer facing the image receiving layer and irradiated with laser light to transfer the laser-irradiated area of the image forming layer to the image receiving layer of the image receiving sheet to record an image, characterized in that the light-heat conversion layer contains a polyamide-imide as a binger.

(2) The multicolor image forming material as described in the above (1) characterized in that a polyamide-imide represented by the following general formula (I) is used as a binder.

(I)

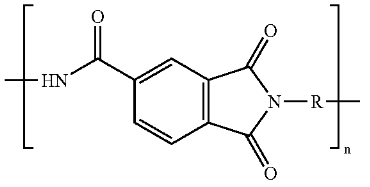

In the general formula (I), R represents a divalent linking group.

(3) A multicolor image forming material as described in the above (1) or (2) characterized in that a colorant represented by the following general formula (I') is used as a light-heat converting substance in the light-heat conversion layer:

General formula (I')

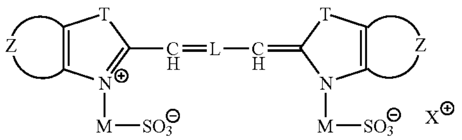

In the general formula (I'), Z represents an atomic group for forming a benzene ring, a naphthalene ring or a heterocyclic aromatic ring.

T represents —O—, —S—, —Se, —N($R^1$)—, —C($R^2$)($R^3$)— or —C($R^4$)═C($R^5$)—, wherein $R^1$, $R^2$and $R^3$ independently represent each an alkyl group, an alkenyl group or an aryl group, and $R^4$ and $R^5$ independently represent each a hydrogen atom, a halogen atom, an alkyl group, an aryl group, an alkoxy group, an aryloxy group, a carboxyl group, an acyl group, an acylamino group, a carbamoyl group, a sulfamoyl group or a sulfonamido group.

L represents a trivalent linking group formed by five or seven methine groups bonded to each other via conjugated double bonds.

M represents a divalent linking group.

$X^+$ represents a cation.

(4) A multicolor image forming material as described in any of the above (1) to (3) characterized in that the polyamide-imide has a glass transition temperature of 260° C. of higher.

(5) A multicolor image forming material as described in any of the above (1) to (4) characterized in that the polyamide-imide has a 5% mass reduction temperature determined by the TGA method of 400° C. or higher.

(6) A multicolor image forming material as described in any of the above (1) to (5) characterized in that the degree of deformation (deformation percentage) calculated in accordance with the following numerical formula (1) in the laser-irradiated area of the light-heat conversion layer observed under a laser microscope is 150% or more: Numerical formula (1)

$$\text{deformation percentage } (\%)=\{(a+b)/(b)\}\times 100$$

wherein a stands for the cross-sectional area of the light-heat conversion layer having been enlarged after irradiation; and (b) stands for the cross-sectional area of the light-heat conversion layer before irradiation.

(7) A multicolor image forming material as described in any of the above (1) to (6) characterized in that the binder in the light-heat conversion layer has a cohesive energy density of 27 or more.

(8) A multicolor image forming material as described in any of the above (1) to (7) characterized in that the ratio of optical density (OD) to layer thickness (μm) (OD/layer thickness) of the light-heat conversion layer is 0.57 or more.

(9) A multicolor image forming material as described in any of the above (1) to (8) characterized in that the ratio of optical density (OD) to layer thickness (μm) (OD/layer thickness) of the image forming layer of the each of the heat transfer sheets is 1.80 or more.

(10) A multicolor image forming material comprising an image receiving sheet having at least an image receiving layer formed on a support and at least four heat transfer sheets each having at least a light-heat conversion layer and an image forming layer formed on a support, each of the heat transfer sheets being adapted to be superposed on the image receiving sheet with the image forming layer facing the image receiving layer and irradiated with laser light to transfer the laser-irradiated area of the image forming layer to the image receiving layer of the image receiving sheet to record an image, characterized in that the difference in the visible light range between the reflectance of the image forming layer of each heat transfer sheet before the irradiation with laser light and recording of an image and the reflectance of the image forming layer transferred to the image receiving layer of the image receiving sheet due to the irradiation with laser light is 10% or less.

(11) A multicolor image forming material comprising an image receiving sheet having at least an image receiving layer formed on a support and at least four heat transfer sheets each having at least a light-heat conversion layer and an image forming layer formed on a support, each of the heat transfer sheets being adapted to be superposed on the image receiving sheet with the image forming layer facing the image receiving layer and irradiated with laser light to transfer the laser-irradiated area of the image forming layer to the image receiving layer of the image receiving sheet to record an image, characterized in that the color difference between the color hue of the image forming layer of each heat transfer sheet immediately after the transfer to the image forming layer of the image forming sheet due to the irradiation with laser light and before exposure and the color hue thereof after exposure does not exceed 2.

(12) A multicolor image forming material as described in the above (10) or (11) characterized in that the light source wavelength of the laser light is from 750 to 850 nm.

(13) A multicolor image forming material as described in any of the above (10) or (12) characterized in that the binder resin in the light-heat conversion layer of each heat transfer sheet has an imide bond.

(14) A multiple color image forming material as described in any of the above (10) to (13) characterized in that the binder resin in the light-heat converting layer of each heat transfer sheet has an SP value determined in accordance with Okitsu's method of 25 or higher.

(15) A multiple color image forming material as described in any of the above (10) to (14) characterized in that a cyanine colorant is employed as the light-heat converting substance in the light-heat conversion layer.

(16) The multiple color image forming material as described in the above (15) characterized in that the cyanine colorant is a colorant represented by the above general formula (I').

(17) A multiple color image forming material as described in any of the above (1) to (16) characterized in that the scanning speed of the laser light on each of the heat transfer sheets is 1 m/sec or higher.

(18) A multiple color image forming material as described in any of the above (1) to (17) characterized in that the energy supplied to the light-heat conversion layer of each of the heat transfer sheets in image recording by laser irradiation is 300 mJ/$m^2$ or less.

(19) A multiple color image forming material as described in any of the above (1) to (18) characterized in that the resolution of a recorded image is 2000 dpi or higher.

BEST MODE FOR CARRYING OUT THE INVENTION

Figure 1A:
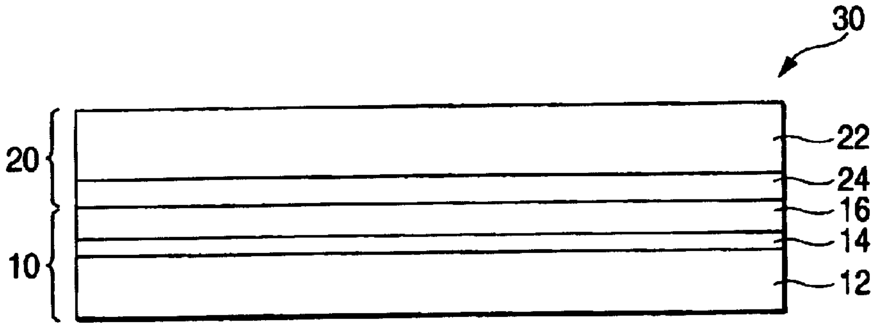
FIG. 1 shows a scheme for forming a multicolor image by thin film thermal transfer by laser beam.

The present inventors previously studied to provide DDCPs of B2/A2 or larger sizes and even of B1/A1 or larger sizes while retaining high image quality, high quality stability, and satisfactory approximation to an actual finished level. As a result, they developed a laser thermal transfer recording system for DDCP, which uses an image forming material characterized by capability of image transfer to the same paper as printing paper, capability of outputting true halftone dots, use of pigments as a colorant, and large sizes of B2 or larger, and an output device combined with high quality content management system (CMS) software. Performance features of this laser thermal transfer recording system reside in (1) sharp dot formation, which offers a good approximation to final prints, (2) a satisfactory color hue approximation to final prints, (3) stable proof quality owing to performance stability against variations of the environment such as temperature and humidity and repetition, (4) a high sensitivity and a high resolution with relieved film fogging troubles of the heat transfer sheet, an excellent light resistance of the light-heat conversion layer, and a high stability with time of a liquid coating composition for forming the same, and (5) a capability of forming an image having excellent color hue and image qualities and a stable transfer density from the heat transfer sheet to the image receiving sheet even in the case of recording with the use of high-energy multibeam laser under conditions differing in temperature and humidity.

From the aspect of material design, technical key points that allow this system to be developed are establishment of thin film heat transfer technology and improvements on the heat transfer materials' capability of being tightly held on a recording drum by suction, capability of high-resolution recording, and heat resistance. More specifically, the developed thermal transfer recording system has been realized by (1) introduction of an infrared absorbing colorant, which permits thickness reduction of a light-heat conversion layer, and a specific combination of a binder with the infrared absorbing colorant, (2) introduction of a high-Tg polymer, which enhances heat resistance of a light-heat conversion layer, (3) introduction of a heat-resistant pigment, which leads to color hue stabilization, (4) addition of a low-molecular component, such as a wax or an inorganic pigment, which controls adhesion and cohesion forces, and (5) addition of a matting agent to a light-heat conversion layer, which ensures intimate contact to an image receiving sheet without causing image quality deterioration.

On the other hand, technical key points that allow this system to be developed lie in (1) an air ejection system adopted to a laser recording apparatus, with which a plurality of image receiving sheets having received an image can be stacked, (2) the manner of inserting a sheet of printing paper into the heat transfer apparatus so as to prevent the printing paper from curling after heat transfer, and (3) connection to a general-purpose output drive which allows broadening of system configuration freedom.

The system according to the present invention adopts a newly developed thin film thermal transfer system to accomplish high resolution and high image quality. The system is capable of producing a transfer image at a high resolution of 2400 dpi or more, preferably 2600 dpi or more. The thin film thermal transfer system is such that an image forming layer as thin as 0.01 to 0.9 μm is transferred to an image receiving sheet in the state not melted or hardly melted. In other words, the irradiated area of the image forming layer is transferred while keeping its shape as thin film so that an extremely high resolution is achieved.

In order to carry out thin film heat transfer effectively, it is preferred that the light-heat conversion layer is thermally deformed into a dome shape on being irradiated. The dome-shaped light-heat conversion layer pushes the image forming layer outward, whereby the image forming layer is brought into more intimate contact with the image receiving layer and transferred thereto easily. Great deformation generates a great force pushing the image forming layer toward the image receiving layer and results in easy transfer. Small deformation produces only a small pushing force and fails to accomplish perfect transfer. In the invention, the degree of deformation is represented by a deformation percentage obtained by dividing the cross-sectional area (b) of the light-heat conversion layer before irradiated by the sum of the cross-sectional area (a) of the layer after irradiation and the cross-sectional area (b) and multiplying the quotient by 100. That is, deformation percentage (%)={(a+b)/(b)}×100. The cross-sectional areas (a) and (b) are measured with a color laser 3D profile microscope VK8500 supplied by Keyence Corp. A deformation percentage preferred for thin film heat transfer as contemplated in the invention is 110% or higher, preferably 125% or higher, still preferably 150% or higher. While the deformation percentage could exceed 250% as long as the heat-light conversion layer has an increased elongation at break, a preferred upper limit is usually about 250%.

The technical key points of image forming materials which can be applied to the thin film thermal transfer recording system are as follows.

1. Balance Between High-temperature Response and Storage Properties

The image forming layer must have a small thickness on the order of submicrons in order to attain high image quality on transfer. However, the layer should contain a pigment dispersed at a high concentration enough to give a desired image density, which conflicts with fast thermal response. Besides, thermal response properties also conflict with storage properties (maintenance of a high absorbance). These conflicting problems are settled by developing an appropriate combination a binder polymer with a colorant in the light-heat conversion layer.

2. Ensuring High Vacuum Contact

In the thin film heat transfer technique in pursuit of high resolution, the transfer interface is desirably as smooth as possible. However, such surface smoothness interferes with sufficient vacuum contact. In the present invention, departing from the common knowledge relating to vacuum contact, a relatively large amount of a matting agent having a relatively small particle size is incorporated into a layer below the image forming layer thereby to maintain a moderate uniform gap between the heat transfer sheet and the image receiving sheet. As a result, vacuum contact capabilities are achieved without allowing the matting agent to cause dot missing and without ruining the advantages of the thin film heat transfer technology.

3. Use of Heat-Resistant Organic Materials

On irradiation, the light-heat conversion layer which converts laser light energy to heat energy reaches about 700° C., and the image forming layer containing a pigment reaches about 500° C. The inventors have developed a polyimide with a high heat-resistance capable of being applied by solvent coating techniques as a material of the light-heat conversion layer. They have also developed a pigment as a colorant which is more heat-resistant than pigments for printing, safe, and fit for color matching.

4. Ensuring Surface Cleanness

Debris or dust present between the transfer sheet and the receiving sheet leads to serious image defects in thin film heat transfer. To keep the image forming materials clean, material management alone is insufficient because dust outside the equipment can enter or dust can occur during sheet cutting operation. It has therefore been necessary to fit the equipment with a dust removing mechanism. The inventors have found a material with moderate tackiness with which the surface of the image forming elements can be cleaned. They have thus succeeded in dust removal without accompanying productivity reduction by using sheet feed rollers made of this material.

The whole system according to the invention will hereinafter be described.

It is preferred in the present invention that a heat transfer image with sharp halftone dots can be realized and recording can be made on a print paper sheet in B2 size (515 mm×728 mm) or larger. A system enabling printing on a paper sheet of 543 mm×765 mm (B2 size) or larger is still preferred.

One of the performance features of the system developed by the present invention is capability of forming sharp dots. The resolution achievable with this system is 2000 dpi or higher, preferably 2400 dpi or higher, and a transfer image having a resolution according to a desired number of lines per inch (1 pi) can be obtained by the system. The individual dots have very sharp edges substantially free from blur or deficiency. Full range of dots from highlights to shadows can be formed clearly. Therefore, the system is capable of outputting high quality dots at the same level of resolution as obtained with an image setter or a CTP setter to give an approximation to dots and gradation of final printed products.

A second performance feature of the system developed by the present invention is satisfactory cyclic reproducibility. Since the image forming layer can be transferred in sharp dots, dots are reproduced in good agreement with a laser beam. Additionally, because of very small environmental humidity/temperature dependency of recording characteristics, the results of repetition are stable in color hue and density in a wide range of environmental conditions.

A third performance feature of the system developed by the present invention is satisfactory color reproducibility. Since the system employs the same pigments as used in printing inks and has satisfactory cyclic reproducibility, highly accurate color management system (CMS) can be realized.

The heat transfer image obtained substantially matches the color hues of final prints, i.e., the hues of Japan-colors, SWOP colors or the like and shows the same change in what it looks like with a change of lighting (e.g., a fluorescent lamp and an incandescent lamp) as the final printed product.

A fourth performance feature of the system developed by the present invention is satisfactory text quality. Owing to the sharp dot shape, the system reproduces fine lines of letters with sharp edges.

Now, the material technology adopted to the system according to the invention will be described in greater detail. Thermal transfer techniques for DDCP include: (1) laser sublimation; (2) laser ablation; and (3) laser melt. The systems (1) and (2) result in blurred dot edges because of sublimation or scattering of a colorant. On the other hand, the system (3) also fails to create clear dot outlines because the molten colorant flows. In order to solve problems associated with the thin film thermal transfer system and to further improve the transfer image quality, the present inventors have adopted the thin film thermal transfer system as a base and further employed the following material techniques.

A first material feature of the system is a sharper dot edge. In thermal transfer recording, laser light is converted to heat in the light-heat conversion layer, the heat is transmitted to the adjoining image forming layer, and the image forming layer adheres to the image receiving layer to conduct recording. In order to make sharp dots, it is required that the heat generated by laser light be transmitted right to the transfer interface without being diffused in the planar direction so that the image forming layer may be cut sharply along the borders between heated areas and non-heated areas. For this purpose, the light-heat conversion layer of the heat transfer sheet should be reduced in thickness, and the dynamic characteristics of the image forming layer should be so controlled.

Accordingly, a first technique for accomplishing dot sharpening is thickness reduction of the light-heat conversion layer. As simulated, a light-heat conversion layer is assumed to instantaneously reach about 700° C. so that a thin light-heat conversion layer is liable to undergo deformation or destruction. A deformed or destroyed thin light-heat conversion layer would be transferred to an image receiving sheet together with an image receiving layer or result in an uneven transfer image. Beside this problem, a light-heat conversion layer must have a light-heat converting substance in a high concentration so as to reach a prescribed temperature, which can cause additional problems such as colorant's precipitation or migration to an adjacent layer. To address these problems, the heat transfer sheet of the invention employs an infrared absorbing colorant as a light-heat converting substance which is effective at a reduced amount compared-with carbon that has been often used as a light-heat converting substance. With respect to a binder, a polyamide-imide resin which retains sufficient mechanical strength even at high temperatures and has satisfactory ability to hold an infrared absorbing colorant is selected.

In this way, it is preferred to reduce the light-heat conversion layer thickness to about 0.5 μm or smaller by selecting an infrared absorbing colorant exhibiting excellent light-heat conversion characteristics and a heat-resistant binder such as a polyamide-imide resin.

The combined use of the infrared absorbing colorant and the polyamide-imide resin in the light-heat conversion layer produces the following effects. The storage stability of a liquid coating composition for light-heat conversion layer is improved thereby to prevent reduction in absorbance of the light-heat conversion layer that might occur due to storage of the liquid coating composition. Moreover, the absorbance of the light-heat conversion layer is increased, which leads to improved sensitivity. Change in color hue between before and after irradiation is reduced to improve light resistance.

A second technique for dot sharpening is for improving the characteristics of the image forming layer. In the case where the light-heat conversion layer is deformed or the image forming layer itself undergoes deformation due to high heat, the image forming layer transferred to the image receiving layer suffers from thickness unevenness in response to the slow scanning pattern of a laser beam. It follows that the transfer image becomes non-uniform with reduced apparent transfer densities. This tendency becomes conspicuous with a decrease in image forming layer thickness. On the other hand, a thick image forming layer has poor dot sharpness and reduced sensitivity.

In order to achieve these performances conflicting with each other, it is preferred to reduce transfer unevenness by adding a low-melting substance, such as a wax, to the image forming layer. Furthermore, fine inorganic particles can be added in place of part of binders to increase the layer thickness to a proper degree so that the image forming layer may be sharply cut along the heated area/non-heated area interface. As a result, uniform recording can be accomplished without impairing dot sharpness and sensitivity.

In general, low-melting substances such as waxes tend to bleed on the surface of the image forming layer or to crystallize, which can result in impairment of image quality or deterioration of stability of the heat transfer sheet with time.

To address this drawback, it is preferred to select a low-melting substance with a small difference in Sp (solubility parameter) value from the polymer of the image forming layer. Such a substance exhibits improved compatibility with the polymer and is prevented from releasing from the image forming layer. It is also preferred for averting crystallization that a plurality of low-melting substances having different structures are mixed into an eutectic mixture. By these manipulations an image of sharp dots free from unevenness can be obtained.

A second material feature of the system owes to the finding that thermal transfer recording sensitivity is dependent on temperature and humidity. In general, the heat transfer sheet changes its mechanical and thermal characteristics on moisture absorption, which means environmental humidity dependence of recording.

In order to reduce the temperature and humidity dependence, it is preferred to employ an organic solvent system as the colorant/binder system of the light-heat conversion layer and the binder system of the image forming layer. It is also preferred to choose polyvinyl butyral as a binder of the image receiving layer and to introduce a polymer hydrophobilization technique for reducing the water absorption of polyvinyl butyral. Available polymer hydrophobilization techniques include causing a hydroxyl group of a polymer to react with a hydrophobic group as taught in JP-A-8-238858 and crosslinking two or more hydroxyl groups of a polymer with a hardening agent.

A third material feature of the system lies in improvement on color hue approximation to the final output. The system of the invention has introduced the knowledge about color matching management and stable dispersing technique amassed through the development of a thermal head type color proffer (e.g., First Proof supplied by Fuji Photo Film Co., Ltd.) and also settled the following problem that has arisen in the laser thermal transfer system. A first technique for achieving improved color hue approximation to the final output consists in use of a highly heat-resistant pigment. An image forming layer generally reaches about 500° C. in thermal transfer recording by laser light exposure. Some of traditionally employed pigments decompose at such high temperatures. This problem is averted by using highly heat-resistant pigments in the image forming layer.

A second technique realizing improved color hue approximation to the final output resides in prevention of the infrared absorbing colorant from diffusing. If the infrared absorbing colorant used in the light-heat conversion layer migrates to the image forming layer due to the high recording heat, it follows that the color hue of a resultant transfer image differs from what is expected. To prevent this, the light-heat conversion layer is preferably made of the infrared absorbing colorant combined with the above-described binder capable of securely holding the infrared absorbing colorant.

A fourth material feature of the system is achievement of high sensitivity. In high-speed recording, shortage of light energy often occurs to cause gaps, particularly gaps corresponding to the scanning pitch in the slow laser scanning direction. To address the problem, the high concentration of a colorant (pigment) in the light-heat conversion layer and the small thicknesses of the light-heat conversion layer and the image forming layer serve to increase the efficiency of heat generation and heat conduction as previously stated. Additionally, it is preferred to incorporate a low-melting substance into the image forming layer. By so doing, the image forming layer is made capable of flowing slightly to such an extent as to fill the gaps, and the adhesion of the image forming layer to the image receiving layer is improved. It is also preferred to use polyvinyl butyral, which is a preferred binder for use in the image forming layer, as a binder of the image receiving layer so as to increase the adhesion between the image receiving layer and the image forming layer and to ensure the film strength of the transfer image.

A fifth material feature of the system is improvement on vacuum holding. The image receiving sheet and the heat transfer sheet are preferably held on a recording drum by vacuum holding. The contact of the two sheets by vacuum holding is of great significance because image transfer relies on control of adhesion between the image receiving layer of the image receiving sheet and the image forming layer of the transfer sheet, and the transfer behavior is very sensitive to the clearance therebetween. An increased gap between the two sheets due to dust or debris results in image defects or transfer unevenness.

To prevent such image defects and transfer unevenness, it is preferred to give uniform surface roughness to the heat transfer sheet thereby allowing entrapped air to escape to make a uniform clearance between the two sheets.

A first technique for improving vacuum holding is to give surface roughness to the heat transfer sheet. Surface roughness is given to the heat transfer sheet side so that the effect of vacuum contact may be fully enjoyed when two or more color images are overprinted. The heat transfer sheet can be textured by post-treatments such as embossing or addition of a matting agent. Addition of a matting agent is preferred for the sake of process simplification and in view of material stability with time. A matting agent to be added should have a particle size larger than the thickness of a layer to which it is added. Addition of a matting agent directly to the image forming layer would result in missing of dots from the part where the matting agent particles stick out. This is the reason why a matting agent of optimum particle size is preferably added to the light-heat conversion layer. As a result, the image forming layer provided thereon has an almost uniform thickness and is capable of transferring a defect-free image to the image receiving sheet.

A sixth material feature of the system relates mainly to the second embodiment of the present invention, that is, improvement in the image forming layer of the heat transfer sheet. As discussed above, it is preferred to construct the heat transfer sheets so that the difference in the visible light range between the reflection spectrum of the image forming layer of each heat transfer sheet before the irradiation with laser light and recording of an image and the reflection spectrum of the image forming layer transferred to the image receiving layer of the image receiving sheet due to the irradiation with laser light is 10% or less, or so that the color difference between the color hue of the image forming layer of each heat transfer sheet immediately after the transfer to the image forming layer of the image forming sheet due to the irradiation with laser light and before exposure and the color hue thereof after exposure does not exceed 2. In such a case, the objects of the invention can be established even though no polyamide-imide is employed as the binder in the light-heat conversion layer. Heat transfer sheets having these characteristics can be constructed by an arbitrary method without particular restriction. As specific examples thereof, citation may be made of selecting a binder and a light-heat converting substance in the light-heat conversion layer of a heat transfer sheet from among those which will be described hereinafter to thereby control, using a colorless colorant and a colorless colorant decomposition product, bleaching a colorant and a colorant decomposition product, and so on.

The systematization of the technique according to the present invention will then be described. A first feature of the systematization is configuration of the recording apparatus. In order to duly reproduce sharp dots, not only the image forming materials but also the recording apparatus should be designed precisely. The recording apparatus which can be used has the same basic configuration as conventional thermal transfer recorders. This configuration is a so-called heat mode outer drum recording system in which a heat transfer sheet and an image receiving sheet held on a drum are irradiated with a recording head having a plurality of high power lasers. The following embodiments are preferred among others.

Firstly, the recording apparatus is designed to avoid contamination with dust. The image receiving sheet and the heat transfer sheet are supplied by a full-automatic roll supply system-so as to avoid contamination with dust or debris that might enter if the recording apparatus is manually loaded with a stack of cut sheets.

A loading unit containing rolls of the heat transfer sheets of four different colors, one roll for one color, rotates to bring each roll to the position where the unrolled continuous sheet is cut at a prescribed length with a cutter, and the cut sheet is held onto a recording drum. Secondly, the recording apparatus is designed to bring the image receiving sheet and the heat transfer sheet into intimate contact on the recording drum. The image receiving sheet and the heat transfer sheet are held to the drum by suction (vacuum holding). Mechanical holding fails to bring the two sheets into such intimate contact as obtained by vacuum holding. A large number of suction holes are formed on the recording drum, and the inside of the drum is evacuated with a blower or a vacuum pump thereby to hold the sheets onto the drum. The image receiving sheet is the first to be held by suction, and the heat transfer sheet is superposed thereon. Therefore, the heat transfer sheet is made larger than the image receiving sheet so as to have extensions over every side of the image receiving sheet. Air between the heat transfer sheet and the image receiving sheet, which greatly influences the image transfer, is sucked from the extension area of the heat transfer sheet extending from the underlying image receiving sheet.

Thirdly, the recording apparatus is designed to allow a plurality of output sheets to be stacked stably on an output tray. In the present invention, the recording apparatus is contemplated to provide output sheets of B2 or larger sizes being stacked on the output tray. When a sheet B is outputted and superposed on another film A that has already been discharged, the two sheets can stick to each other because of the heat stickiness of the image receiving layer. If this happens, the next sheet is not discharged in good order to cause jamming. To prevent this from happening, it is the best to prevent the output films A and B from coming into contact with each other. Known means for preventing the contact include (a) a level difference made on the output tray, by which the film is placed non-flat, and a gap is created between adjacent films, (b) a slot for output exit positioned higher than the output tray so that an output film discharged through the slot drops on the output tray, and (c) air ejected between adjacent films to float the film discharged later. Since the sheet size is as large as B2, application of the means (a) or (b) will make the apparatus considerably larger. Therefore, the means (c), i.e., an air ejection method is employed in this system. That is, air is ejected between films to float the sheet discharged later.

Figure 2:
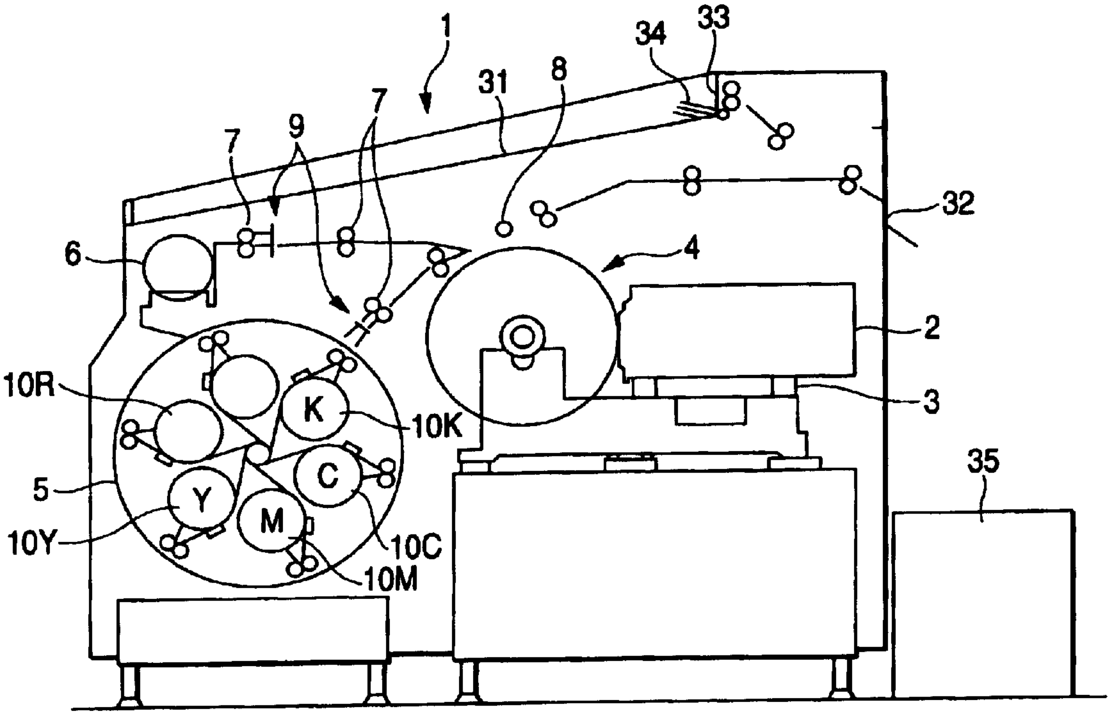
FIG. 2 shows a configuration of a laser thermal transfer recording apparatus.

FIG. 2 shows an example of the configuration of a recording apparatus 1 which can be used in the invention.

Now, steps for full color image formation by use of the image forming material according to the invention and the above-described recording apparatus will be illustrated below in sequence (i.e., the image formation sequence of the system).

1) A recording head 2 which slides on rails 3 in the slow scan (sub-scan) direction, a recording drum 4 which rotates in the fast scan (main scan) direction, and a heat transfer sheet loading unit 5 return to their starting positions.
2) An image receiving sheet is unrolled from an image receiving sheet roll 6 with feed rollers 7, and the leading end of the image receiving sheet is fixed by suction onto the recording drum 4 through suction holes of the recording drum.
3) A squeeze roller 8 comes down and presses the leading end of the image receiving sheet onto the recording drum 4. In this state, the drum 4 rotates to further unroll the image receiving sheet. When a given length is unrolled, the drum stop rotating, and a cutter 9 cuts the unrolled sheet.
4) The recording drum 4 further turns to makes one revolution to complete image receiving sheet loading.
5) A heat transfer sheet of the first color, e.g., black (K), is unrolled from a heat transfer sheet roll 10K, and cut into a sheet of prescribed length.
6) The recording drum 4 starts to rotate at high speed, and the recording head 2 starts to move on the rails 3. When the recording head 2 arrives at a record starting position, it emits writing laser beams on the recording drum 4 according to recording signals. The irradiation is stopped at a recording terminal position, and the operations of the slow-scan rails 3 and the drum 4 stop. The recording head 2 on the slow-scan rails 3 returns to its starting position.
7) Only the heat transfer sheet K is peeled off with the image receiving sheet left on the recording drum. The leading end of the heat transfer sheet K is caught in claws, pulled apart from the image receiving sheet, and discarded through a discard slot 32 into a waste box 35.
8) The steps (5) to (7) are repeated for each of the other heat transfer sheets. Recording is performed in the order of, for example, black, cyan, magenta and yellow. That is, for example, a heat transfer sheet C of the second color (cyan), a heat transfer sheet M of the third color (magenta), and a heat transfer sheet Y of the fourth color (yellow) are successively fed from rolls 10C, 10M and 10Y, respectively. The order of color superimposition in the recording apparatus is the reverse of the general printing order because the resulting color image is reversed on re-transfer to paper to give a color proof.
9) After completion of the printing in the four colors, the recorded image receiving sheet is discharged on an output tray 31. The image receiving sheet is separated from the recording drum in the same manner as for the heat transfer sheets (as described in step (7)) but is not discarded. When it comes near the discard slot 32, it changes its direction by a switch back mechanism and is forwarded to the output tray. When the image receiving sheet exits through the discharge slot 33, air 34 is blown from under the slot 33 to allow a plurality of sheets to be stacked without sticking to each other.

It is preferred to use an adhesive roller having a pressure-sensitive adhesive material on the surface as one of paired feed rollers 7 disposed on any site of the image receiving sheet roll and the heat transfer sheet roll.

By providing the adhesive roller, the surface of the heat transfer sheet and the image receiving sheet can be cleaned.

Examples of the pressure-sensitive adhesive provided on the surface of the adhesive roller includes an ethylene-vinyl acetate copolymer, an ethylene-ethyl acrylate copolymer, a polyolefin resin, a polybutadiene resin, a styrene-butadiene copolymer (SBR), a styrene-ethylene-butene-styrene copolymer (SEBS), an acrylonitrile-butadiene copolymer (NBR), a polyisoprene resin (IR), a styrene-isoprene copolymer (SIS), an acrylic ester copolymer, a polyester resin, a polyurethane resin, an acrylic resin, butyl rubber, and polynorbornene.

The surface of the heat transfer sheet and the image receiving sheet can be cleaned on contact with the adhesive roller. The contact pressure is not particular limited.

It is preferred that the pressure-sensitive adhesive used in the adhesive roller has a Vickers hardness Hv of 50 $kg/mm^2$ (≈490 MPa) or less for thoroughly removing dust and thereby preventing image defects caused by dust.

"Vickers hardness" is a hardness measured by applying a static load to a quadrilateral diamond indenter having an angle of 136° between the opposite faces. Vickers hardness Hv is obtained from equation:

$$Hv=1.854\ P/d^2(\mathrm{kg/mm^2})\approx 18.1692P/d^2(\mathrm{MPa})$$

where P is a load (kg) applied, and d is the length (mm) of a diagonal of a square indentation.

In the present invention, it is also preferred for the pressure-sensitive adhesive to have an elastic modulus of 200 $kg/cm^2$ (≈19.6 MPa) or less at 20° C. for the same purpose as described above, i.e., for thoroughly removing dust and thereby preventing image defects caused by dust.

A second feature of the systematization is configuration of a heat transfer apparatus.

A heat transfer apparatus is used to carry out the step of re-transferring the transfer image on the image receiving sheet to a sheet of the same paper as used in final printing (hereinafter simply referred to as a paper sheet). This step is entirely identical to that carried out in First Proof (a trade mark of a thermal transfer apparatus available from Fuji Photo Film Co., Ltd.). A paper sheet is superposed on the image receiving sheet, and heat and pressure are applied thereto to adhere the two sheets together. Then, the image receiving film is stripped off from the paper sheet, whereby only the support and a cushioning layer of the image receiving sheet are removed to leave the image and the adhesive layer on the paper sheet. This practically means that the image is transferred from the image receiving sheet to the printing paper sheet.

In First Proof™, image re-transfer is performed by superposing a paper sheet and the image-receiving sheet on an aluminum guide plate and passing them through a pair of heat rollers. The aluminum guide plate serves to prevent the paper from deformation. In the case of applying this design as such to the system for B2 size output, the aluminum guide plate should be larger than a B2 size, which results in the problem that a large installation space is required. Accordingly, the system of the present invention does not use such an aluminum guide plate. Instead, the carrier path turns 180° so that the sheets are discharged toward the loading side. As a result, the installation space can be largely saved (see FIG. 3). However, there arises another problem that the paper sheet is curled in the absence of an aluminum guide plate. The facing couple of the paper sheet and the image-receiving sheet curls with the image-receiving sheet inward and rolls on the output tray. It is very difficult to separate the image receiving sheet from the curled paper.

In the present invention, this curling phenomenon is averted by taking advantage of bimetallic effect due to the difference in shrinkage between printing paper and the image receiving sheet and the ironing effect of the heat roller. Where an image receiving sheet is superposed on a paper sheet as in a conventional way, the two sheets curl with the image receiving sheet inward by bimetallic effect upon heating because the image receiving sheet shows larger thermal shrinkage in the direction of insertion than printing paper. The direction of curling by the bimetallic effect is the same as the direction of curling by the ironing effect of the heat roller around which the two sheets are wound. As a result, the curling becomes serious by synergism. In contrast, when the paper sheet is superposed on an image receiving sheet, downward curling by the bimetallic effect occurs whereas upward curling is caused by ironing effect so that the curls of opposite directions are offset by each other.

Figure 3:
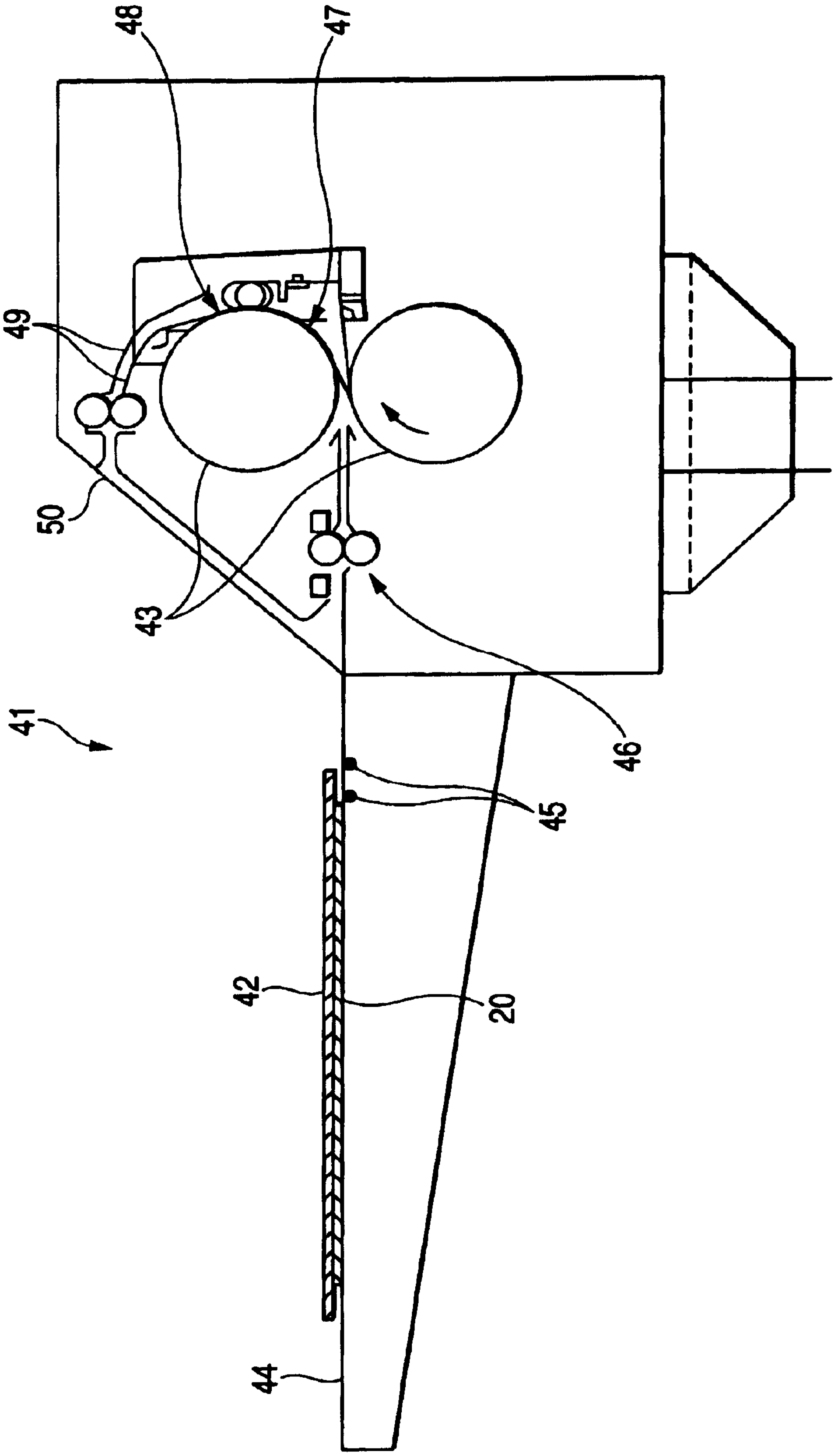
FIG. 3 shows a configuration of a thermal transfer apparatus.

Re-transfer to printing paper is carried out according to the following sequence (hereinafter called the paper transfer method to be used in this system). A thermal transfer apparatus 41 which can be used for re-transfer is shown in FIG. 3. Unlike the laser recording apparatus, the thermal transfer apparatus 41 is manually operated.

1) To begin with, dials (not shown) are turned to set the temperature of heat rollers 43 (variable between 100° and 110° C.) and the transfer speed according to the kind of printing paper 42.
2) An image receiving sheet 20 is put on an insertion table 44 with the image side up, and the dust on the image is removed by an antistatic brush (not shown). A paper sheet 42 from which dust has been removed is superposed thereon. Because the upper paper sheet 42 is larger than the lower image receiving sheet 20, it is difficult to position the paper sheet 42 on the image receiving sheet 20 hidden from the eye. For improving the ease of the positioning work, marks 45 indicating the positions of placement for an image receiving sheet and a paper sheet are made on the insertion table 44. The reason the paper sheet is larger than the image-receiving sheet 20 is to prevent image receiving sheet 20 from coming out under the paper sheet 42 and staining heat roller 43.
3) The image receiving sheet and the paper sheet are inserted into an insert port, and a pair of insert rollers 46 rotates to feed them to heat rollers 43.
4) When the leading end of the paper sheet 42 reaches the heat rollers 43, the heat rollers nip the two sheets to start heat transfer. The heat rollers are heat resisting silicone rubber rollers. Pressure and heat are applied simultaneously to the image receiving sheet and the paper sheet to adhere them. A heat-resistant guide sheet 47 is provided downstream of the heat roller. The image receiving sheet and the paper sheet are carried upward through between the upper heat roller and the guide sheet 47 while being heated, separated from the upper heat roller by separation claw 48, and guided to an output slot 50 along a pair of guide plates 49.
5) The image receiving sheet and the paper sheet coming out of the output slot 50 is discharged on the insertion table while being adhered. Thereafter, the image receiving sheet 20 is separated from the paper sheet 42 manually.

The second feature of the systematization technique resides in the system configuration.

The above-illustrated apparatus are connected to a plate-making system to perform the function as a color proofer. A color proofing system is required to output a color proof as an approximation to final prints outputted based on certain page data. Therefore, software for approximating dots and colors to the final prints is necessary. A specific example of connection is shown below.

When a proof is to be prepared for the final printing product outputted from a plate-making system Celebra™ (from Fuji Photo Film Co., Ltd.), a CTP system is connected to Celebra. A printing plate outputted from this connection is mounted on a press to carry out actual printing. To Celebra is connected the above-illustrated thermal transfer recording apparatus as a color proofer, e.g., Luxel FINALPROOF 5600 from Fuji Photo Film Co., Ltd. (hereinafter simply referred to as FINALPROOF), and proof drive software PD SYSTEM™ available from Fuji Photo Film is installed between Celebra and FINALPROOF for approximating dots and colors to the final output.

Figure 4:
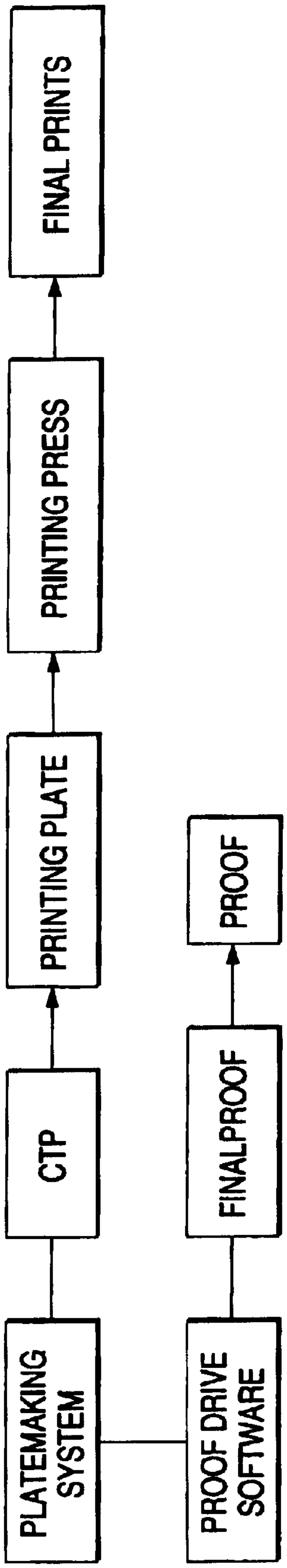
FIG. 4 shows a system flow chart including a laser thermal transfer recording apparatus FINALPROOF.

Contone data (continuous tone data) converted to raster data by Celebra are converted to binary data for dots, outputted to the CTP system, and finally printed. On the other hand, the same contone data are also sent to PD SYSTEM. PD SYSTEM converts the received data according to a four-dimensional (black, cyan, magenta and yellow) table for each color so that the colors may agree with the final output. Finally the data are converted to binary data for dots so as to agree with the dots of the final output, which are sent to FINALPROOF (FIG. 4).

The four-dimensional table for each color as described above is experimentally prepared in advance and stored in the system. The experiment for the preparation of the four-dimensional table is as follows. Data of an important color are outputted via the CTP system to prepare a printed image. The same data are also outputted from FINALPROOF via PD SYSTEM to prepare a proof image. The measured chromaticities of these images are compared, and a table is prepared so as to minimize the difference.

Thus, the system configuration is set up so that the performance of the high-resolution image forming elements of the invention may be exhibited to the full.

Now, the heat transfer sheet suitably used in the system according to the invention will be described.

It is preferred that the absolute value of the difference in surface roughness Rz between the exterior and the interior sides of the image forming layer of the heat transfer sheet is 3.0 μm or smaller and that the absolute value of the difference in surface roughness Rz between the exterior and the interior sides of the image-receiving layer of the image receiving sheet is 3.0 μm or smaller. Such a layer design combined with the above-described cleaning means prevents image defects and jamming in the sheet path and improves the stability in dot gain.

The surface roughness Rz is a 10 point height parameter corresponding to the Rz (maximum height) specified in JIS. The surface roughness Rz is obtained by computing the average height difference between the five highest peaks and the five lowest valleys with respect to the mean plane within an evaluation area. A stylus type 3D roughness meter (Surfcom 570A-3DF, available from Tokyo Seimitsu Co., Ltd.) is used for measurement. The measurement is performed in the longitudinal direction, the cut-off length is 0.08 mm, the evaluation area is 0.6 mm by 0.4 mm, the sampling pitch is 0.005 mm, and the speed of measurement is 0.12 mm/sec.

For enhancing the above-described effects, it is still preferred that the absolute difference in Rz between the exterior and the interior surfaces of the image forming layer is 1.0 μm or smaller and that the absolute difference in Rz between the exterior and the interior sides of the image receiving layer is 1.0 μm or smaller.

In another embodiment, it is preferred that the surface roughness Rz of both the exterior and the interior sides of the image forming layer of the heat transfer sheet and/or both the exterior and the interior sides of the image receiving layer of the image receiving sheet are in a range of from 2 to 30 μm. Such a layer design combined with the above-described cleaning means prevents image defects and jamming in the sheet path and improves the stability in dot gain.

It is preferred for the image forming layer of each heat transfer sheet to have a gloss of 80 to 99.

The gloss of the image forming layer largely depends on the smoothness of the layer and relates to the thickness uniformity of the layer. An image forming layer with a higher gloss has higher thickness uniformity and is more suited for high precision image formation. However, higher smoothness leads to higher resistance in sheet transportation i.e., being in a trade-off. Where the surface gloss ranges 80 to 99, a balance between smoothness and transportation resistance will be achieved.

Figure 1B:
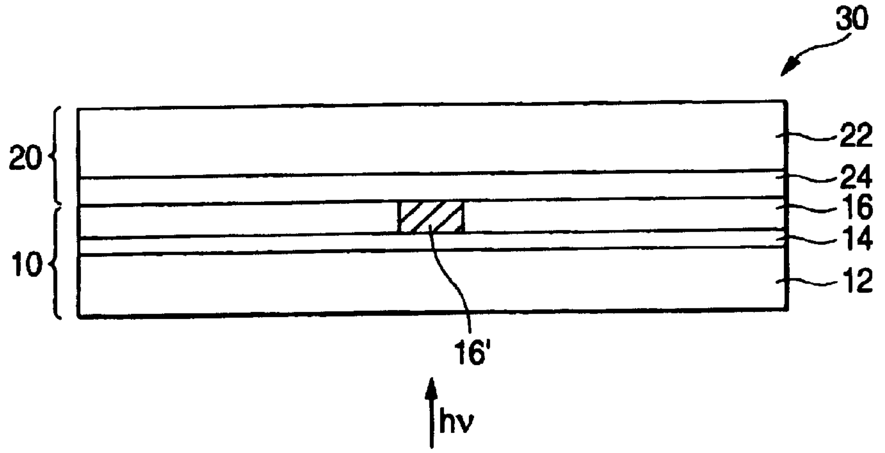
Figure 1C:
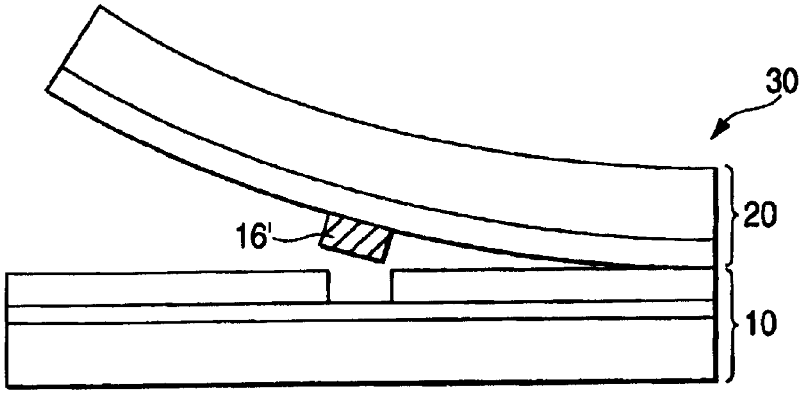

The scheme of multicolor image formation by thin film thermal transfer using a laser is described by referring to FIG. 1.

An image forming laminate 30 composed of an image receiving sheet 20 laminated on an image forming layer 16 containing a pigment (black (K), cyan (C), magenta (M), yellow (Y), etc.) of a heat transfer sheet 10 is prepared. The heat transfer sheet 10 comprises a support 12, a light-heat conversion layer 14 provided on the support 12, and the image forming layer 16 provided on the light-heat conversion layer 14. The image receiving sheet 20 has a support 22 and an image receiving layer 24 provided thereon. The two sheets 10 and 20 are superposed with the image receiving layer 24 facing the image forming layer 16 (FIG. 1(*a*)). On imagewise irradiating the laminate 30 with a laser beam from the side of the support 12 of the heat transfer sheet 10 in a time series, the irradiated area of the light-heat conversion layer 14 of the heat transfer sheet 10 generates heat to reduce its adhesion to the image forming layer 16 (see FIG. 1(*b*)). The heat transfer sheet 10 is stripped off the image receiving sheet 20 while leaving the irradiated area 16' of the image forming layer 16 on the image receiving layer 24 of the image receiving sheet 20. That is, the image is transferred (see FIG. 1(*c*)).

In multicolor image formation, the laser light for imagewise irradiation preferably comprises multibeams, particularly multibeams of two-dimensional array. Multibeams of two-dimensional array are a plurality of laser beams arranged in a two-dimensional array such that the spots of these laser beams form a plurality of lines in the fast scan direction and a plurality of rows in the slow scan direction.

Use of multibeams in a two-dimensional array reduces the time required for laser recording.

Laser beam of any kind can be used in recording with no limitation, including direct laser beams such as gas laser beams, e.g., an argon ion laser beam, a helium neon laser beam, and a helium cadmium laser beam, solid state laser beams, e.g., a YAG laser beam, a semiconductor laser beam, a dye laser beam, and an excimer laser beam. Light rays obtained by converting these laser beams to half the wavelength through a second harmonic generation device can also be used. Semiconductor laser beams are preferably used taking the output power and ease of modulation into consideration. A laser beam is preferably emitted to give a spot diameter of 5 to 50 μm, particularly 6 to 30 μm, on the light-heat conversion layer. The scanning speed is preferably 1 m/sec or higher, still preferably 3 m/sec or higher, still preferably 5 m/sec or higher and particularly preferably 8 m/sec or higher. It is also preferable that the light source wavelength of the laser light is from 750 to 850 nm. Furthermore, it is preferable that the energy supplied to the light-heat conversion layer in image recording by laser irradiation is 300 $mJ/m^2$ or less, particularly preferably from 200 to 250 $mJ/m^2$.

In multicolor image formation, the thickness of the black image forming layer in the black heat transfer sheet is preferably larger than that of the other image forming layers of the other heat transfer sheets (e.g., yellow, magenta, cyan, etc.) and preferably ranges from 0.5 to 0.7 μm. This layer design is effective to prevent density reduction due to non-uniform transfer of the black image forming layer.

With the thickness being 0.5 μm or greater, the black image forming layer can be uniformly transferred when recorded with high energy thereby attaining a satisfactory image density necessary as a color proof for printing. Since the tendency to transfer unevenness becomes conspicuous under high humidity conditions, the thickness as defined above is particularly effective to reduce environment-induced variations in density. On the other hand, the black image forming layer thickness of 0.7 μm or smaller is effective in maintaining the transfer sensitivity in laser recording and improving reproducibility of small dots and fine lines. These effects are more conspicuous under lower humidity conditions. Resolution can also be improved with the above layer thickness. The layer thickness of the black image forming layer of the black heat transfer sheet is still preferably from 0.55 to 0.65 μm, particularly preferably 0.60 μm.

In addition to the black image forming layer thickness ranging 0.5 to 0.7 μm, it is preferred that the thickness of the other color image forming layers of the other heat transfer sheets (e.g., yellow, magenta, cyan, etc.) is from 0.2 to less than 0.5 μm.

The 0.2 μm or greater thickness of these image forming layers (e.g., yellow, magenta, cyan, etc.) is effective to prevent transfer unevenness thereby to maintain the image density in laser recording. With the thickness of these color image forming layers being less than 0.5 μm, the transfer sensitivity and resolution are improved. A still preferred thickness is from 0.3 to 0.45 μm.

It is preferred for the black image forming layer of the black heat transfer sheet to contain carbon black. The carbon black to be incorporated preferably comprises at least two kinds different in tinting strength from the viewpoint of ease of controlling reflection density while maintaining a P/B (pigment/binder) ratio within a specific range.

The tinting strength of carbon black can be represented in various terms. PVC blackness disclosed in JP-A-10-140033 is among them. PVC blackness of carbon black is determined as follows. Carbon black to be evaluated is dispersed in a polyvinyl chloride (PVC) resin by a two-roll mill and molded into a sheet. The blacknesses of Carbon Black #40 and #45, both available from Mitsubishi Chemicals Co., Ltd. being taken as 1 point and 10 points, respectively, the PVC blackness of the sample sheet is rated by visual observation on a 10 point scale. Two or more carbon blacks having different PVC blacknesses can be used in an appropriate combination according to the purpose.

Next, a method of preparing a sample will be specifically illustrated.

Method of Preparing Sample>

In a 250 cc Banbury mixer, a low-density polyethylene (LDPE) resin is mixed with 40% by mass of a carbon black sample and kneaded at 115° C. for 4 minutes.

Blending Conditions:

| | |
|---|---|
| LDPE resin | 101.89 g |
| Calcium stearate | 1.39 g |
| Irganox 1010 | 0.87 g |
| Carbon black | 69.43 g |

Next, the obtained blend is diluted in a two-roll mill at 120° C. to give a carbon black content of 1% by mass.

Compound Formulation:

LDPE 58.3 g

Calcium stearate 0.2 g

Resin containing 40% by mass of carbon black 1.5 g

The resulting compound is extruded through a slit width of 0.3 mm, and the extruded sheet is cut into chips. The chips are molded into a film having a thickness of 65±3 μm on a hot plate set at 240° C.

The method of forming a multicolor image includes the above-described method comprising successively transferring a plurality of image layers (image forming layers having image formed thereon) on the same image receiving sheet by using the heat transfer sheets to form a multicolor image on the image receiving sheet, and another method comprising separately transferring images to image forming layers of a plurality of image receiving sheets then and re-transferring the transfer images onto printing paper, etc. to form a multicolor image on the paper.

More specifically, the latter method is carried out, for example, as follows. Heat transfer sheets having image forming layers containing coloring matters with different colors are prepared. Then an image forming laminate with combination of an image receiving sheet and a heat transfer sheet is prepared for each of four colors (cyan, magenta, yellow and black). Each laminate is irradiated with laser light in accordance with the respective digital signals (e.g., through a color separation filter), and the heat transfer sheet is stripped off from the image receiving sheet to obtain a color separated image for each color on the image receiving sheet. Thereafter, the color separated images are successively re-transferred to an actual support, such as printing paper or an equivalent, to form a multicolor image.

In each case, the resolution of the image transferred from the image forming layer of the heat transfer sheet to the image receiving layer of the image receiving sheet can be controlled to 2000 dpi or hither, preferably 2400 dpi or higher.

A heat transfer sheet using laser irradiation is preferably usable in the thin film heat transfer system wherein laser beams are converted into heat and, using the heat energy, an image forming layer containing a pigment is transferred to an image receiving sheet to form an image. However, the technology employed in developing these image forming materials comprising the heat transfer sheets and the image receiving sheet is also applicable to other thermal transfer systems, such as melt transfer recording, ablation transfer recording, and sublimation transfer recording. Therefore, the system of the invention includes in its scope the image forming materials useful in these other thermal transfer recording systems.

Next, the heat transfer sheets and the image receiving sheet will be described in detail.

[Heat Transfer Sheet]

The heat transfer sheets each comprises a support, a light-heat conversion layer, and an image forming layer and an optional layer(s).

(Support)

The support of the heat transfer sheet can be of any material of choice. It is desirable for the support to have stiffness, dimensional stability, and heat resistance withstanding the heat of laser recording. Preferred support materials include synthetic resins, such as polyethylene terephthalate, polyethylene-2,6-naphthalate, polycarbonate, polymethyl methacrylate, polyethylene, polypropylene, polyvinyl chloride, polyvinylidene chloride, polystyrene, styrene-acrylonitrile copolymers, polyamide (aromatic or aliphatic), polyimide, polyamide-imide, and polysulfone. A biaxially stretched polyethylene terephthalate film is preferred of them from the standpoint of mechanical strength and dimensional stability against heat. In the preparation of color proofs by laser recording, the support of the heat transfer sheet is preferably made of transparent synthetic resins which transmit laser beams. The thickness of the support is preferably from 25 to 130 μm, still preferably from 50 to 120 μm. The support preferably has a center-line average surface roughness Ra of less than 0.1 μm on its image forming layer side (measured in accordance with JIS B0601 with, for example, a profilometer (e.g., Surfcom available from Tokyo Seiki Co., Ltd.). The support preferably has a Young's modulus of from 200 to 1200 $kg/mm^2$ (≈2 to 12 GPa) in the machine direction and of from 250 to 1600 $kg/mm^2$ (≈2.5 to 16 GPa) in the transverse direction. The F-5 value of the support in the machine direction is preferably from 5 to 50 $kg/mm^2$ (≈49 to 490 MPa), and that in the transverse direction is preferably from 3 to 30 $kg/mm^2$ (≈29.4 to 294 MPa). The F-5 value in the machine direction is generally higher than that in the transverse direction, but this is not the case when the support is required to be stronger in the transverse direction than in the machine direction. The thermal shrinkage of the support when treated at 100° C. for 30 minutes is preferably 3% or less, still preferably 1.5% or less, in both transverse direction and machine direction. The thermal shrinkage at 80° C. for 30 minutes is preferably 1% or less, still preferably 0.5% or less, in both machine direction and transverse direction. The support preferably has a breaking strength of 5 to 100 $kg/mm^2$ (≈49 to 980 MPa) in both directions and an elastic modulus at 20° C. of 100 to 2,000 $kg/mm^2$ (≈0.98 to 19.6 GPa).

In order to improve adhesion between the support and the light-heat conversion layer provided thereon, the support may be subjected to a surface activation treatment and/or be provided with one or more undercoating layers. The surface activation treatment includes glow discharge treatment and corona discharge treatment. The material of the undercoating layer is preferably selected from those having high adhesion to both the support and the light-heat conversion layer, low heat conductivity, and high heat resistance. Such materials include styrene, a styrene-butadiene copolymer, and gelatin. The total thickness of the undercoating layers is generally from 0.01 to 2 μm. If desired, the opposite side of the support may also be surface-treated or provided with a functional layer, such as an antireflection layer or an antistatic-layer. It is particularly advisable to provide a backcoating layer containing an antistatic agent on the back of the support.

(Backcoating Layer)

It is preferable to provide a backcoating layer on the opposite side of the support to the light-heat conversion layer of the heat transfer sheet according to the invention. The backcoating layer preferably comprises a first backcoating layer contiguous to the support and a second backcoating layer provided on the first backcoating layer. In the present invention, it is preferred that the weight ratio of the antistatic agent B contained in the second backcoating layer to the antistatic agent A contained in the first backing layer, B/A, is less than 0.3. A B/A ratio of 0.3 or more tends to result in reduction of sliding properties and cause powder fall-off from the backcoating layer.

The thickness C of the first backcoating layer is preferably from 0.01 to 1 μm, still preferably from 0.01 to 0.2 μm. The thickness D of the second backcoating layer is preferably from 0.01 to 1 μm, still preferably from 0.01 to 0.2 μm. The thickness ratio C:D is preferably from 1:2 to 5:1.

The antistatic agents which can be used in the first and second backcoating layers include nonionic surface active agents, e.g., polyoxyethylene alkylamines and glycerol fatty acid esters; cationic surface active agents, e.g., quaternary ammonium salts; anionic surface active agents, e.g., alkylphosphates; amphoteric surface active agents; and electrically conductive resins.

Fine electrically conductive particles can also be used as an antistatic agent. Examples of such fine electrically conductive particles include oxides, e.g., ZnO, $TiO_2$, $SnO_3$, $Al_2O_3$, $In_2O_3$, MgO, BaO, CoO, CuO, $Cu_2O$, CaO, SrO, $BaO_2$, PbO, $PbO_2$, $MnO_2$, $MoO_3$, $SiO_2$, $ZrO_2$, $Ag_2O$, $Y_2O_3$, $Bi_2O_3$, $Ti_2O_3$, $Sb_2O_3$, $Sb_2O_5$, $K_2Ti_6O_{13}$, $NaCaP_2O_{18}$, and $MgB_2O_5$; sulfides, e.g., CuS and ZnS; carbides, e.g., SiC, TiC, ZrC, VC, NbC, MoC, and WC; nitrides, e.g., $Si_3N_4$, TiN, ZrN, VN, NbN, and $Cr_2N$; borides, e.g., $TiB_2$, $ZrB_2$, $NbB_2$, $TaB_2$, CrB, MoB, WB, and LaBs; suicides, e.g., $TiSi_2$, $ZrSi_2$, $NbSi_2$, $TaSi_2$, $CrSi_2$, $MoSi_2$, and $WSi_2$; metal salts, e.g., $BaCO_3$, $CaCO_3$, $SrCO_3$, $BaSO_4$, and $CaSO_4$; and composites, e.g., $SiN_4$—SiC and $9Al_2O_3$-$2B_2O_3$. These electrically conductive substances may be used either alone or in a combination of two or more thereof. Among them, $SnO_2$, ZnO, $Al_2O_3$, $TiO_2$, $In_2O_3$, MgO, BaO, and $MoO_3$ are preferable, $SnO_2$, ZnO, $In_2O_3$, and $TiO_2$ are still preferable, and $SnO_2$ is particularly preferred.

In the case of using the heat transfer material according to the invention in the laser thermal transfer recording system, the antistatic agents used in the backcoating layer are preferably substantially transparent so as to transmit laser beams.

In using an electrically conductive metal oxide as the antistatic agent, the particle size is preferably as small as possible to minimize light scattering, but the particle size should be determined based on the ratio of the refractive index of the particles to that of the binder as a parameter, which can be obtained according to Mie theory. The average particle size is generally from 0.001 to 0.5 μm, preferably from 0.003 to 0.2 μm. The term "average particle size" as used herein is intended to cover not only primary particles but agglomerates.

The first and second backcoating layers may further contain a binder and various other additives, such as surface active agents, slip agents, and matting agents as well as binders. The amount of the antistatic agent in the first backcoating layer is preferably from 10 to 1,000 parts by mass, still preferably from 200 to 800 parts by mass, per 100 parts by mass of the binder. The amount of the antistatic agent in the second backcoating layer is preferably from 0 to 300 parts by mass, still preferably from 0 to 100 parts by mass, per 100 parts by mass of the binder.

The binders which can be used in the first and second backcoating layers include homopolymers and copolymers of acrylicmonomers, e.g., acrylic acid, methacrylic acid, acrylic esters and methacrylic esters; cellulosic polymers, e.g., nitrocellulose, methyl cellulose, ethyl cellulose, and cellulose acetate; polymers of vinyl compounds, e.g., polyethylene, polypropylene, polystyrene, vinyl chloride copolymers, vinyl chloride-vinyl acetate copolymers, polyvinyl pyrrolidone, polyvinyl butyral, and polyvinyl alcohol; condensed polymers, e.g., polyester, polyurethane, and polyamide; elastic thermoplastic polymers, e.g., butadiene-styrene copolymers; polymers obtained by polymerization or crosslinking of photopolymerizable or heat polymerizable compounds, e.g., epoxy compounds; and melamine compounds.

(Light-heat Conversion Layer)

The light-heat conversion layer comprises a light-heat converting substance and a binder. If necessary, it can contain a matting agent. It may further contain other additives, if desired.

In the first embodiment of the present invention, a polyamide-imide is used as the binder. Although the polyamide-imide is not restricted in type so long as it can serve as a binder, it is preferable to employ a polyamide-imide having strength enough to form a layer on the support and a high heat conductivity, still preferably a polyamide-imide having such heat resistance so as not to decompose by the heat generated by the light-heat converting substance, since the surface smoothness of the light-heat conversion layer can be maintained after irradiation with high energy light.

Specifically, the polyamide-imide as the binder preferably has a heat decomposition temperature of 400° C. or higher, particularly 500° C. or higher, as measured by TGA (thermogravimetric analysis) at a temperature rise rate of 10° C./min.

The polyamide-imide preferably has a glass transition temperature of from 200 to 400° C., particularly from 260 to 400° C. and still preferably from 250 to 350° C. In the case where the glass transition temperature is lower than 200° C., the resultant image sometimes suffers from fogging. In the case where the glass transition temperature is higher than 400° C., the solubility of the resin is lowered, which can result in reduction of productivity.

It is preferred for the binder of the light-heat conversion layer to have higher heat resistance (e.g., heat deformation temperature and heat decomposition temperature) than the materials used in other layers provided on the light-heat conversion layer.

As the polyamide-imide, use can be preferably made of polyamide-imides represented by the following general formula (I).

(I)

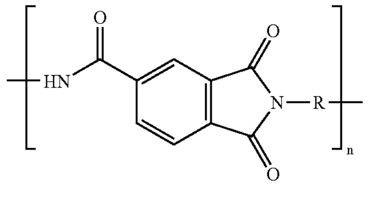

In the above general formula (I), R represents a divalent linking group. Preferable examples of the divalent linking group are specified as follows.

(1)

$-(CH_2)_n-$ (n = 1~10)

(2)

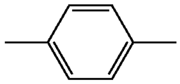

(3)

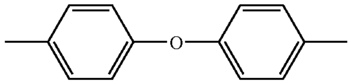

(4)

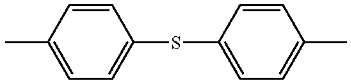

(5)

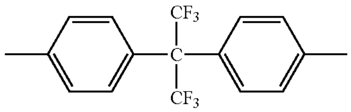

(6)

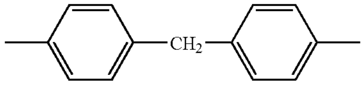

(7)

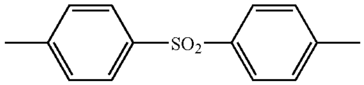

(8)

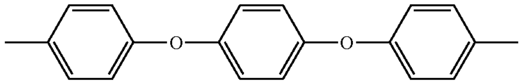

(9)

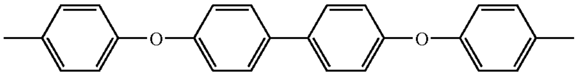

(10)

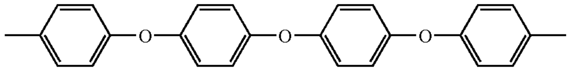

(11)

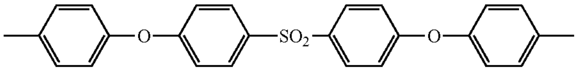

(12)

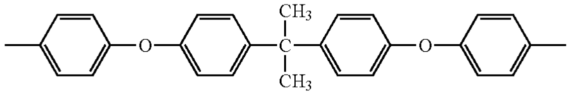

(13)

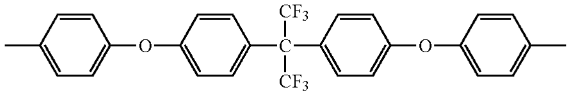

(14)

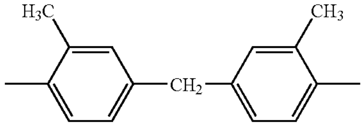

-continued (15)

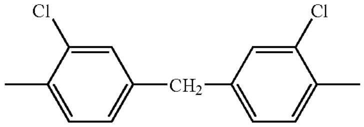

(16)

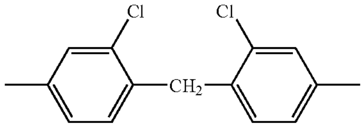

(17)

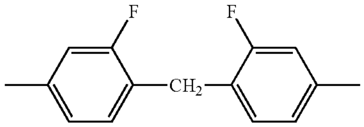

(18)

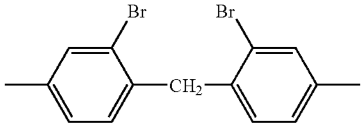

(19)

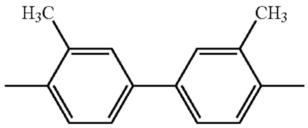

(20)

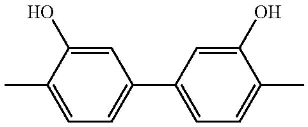

(21)

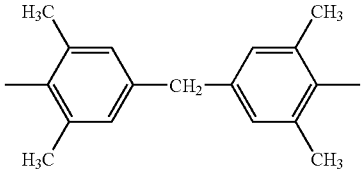

(22)

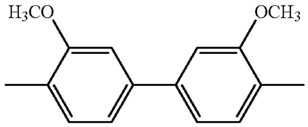

(23)

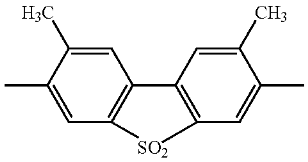

Among all, the linking groups (6), (7), (11) and (14) are preferred.

Either one of these divalent linking groups or a plurality thereof bonded together may be used.

The number-average molecular weight (determined by gel permeation chromatography and expressed in terms of polystyrene) of the polyamide-imide represented by the general formula (I) preferably ranges from 3000 to 50000, still preferably from 10000 to 25000.

Together with the polyamide-imide represented by the general formula (I), use can be made of the above-described preferred binders. Examples of the binders usable include acrylic resins, e.g., polymethylmethacrylate; polycarbonate; vinyl resins, e.g., polystyrene, vinyl chloride-vinyl acetate copolymers, and polyvinyl alcohol; polyvinyl butyral, polyester, polyvinyl chloride, polyamide, polyimide, polyether imide, polysulfone, polyether sulfone, aramid, polyurethane, epoxy resins, and urea-melamine resins. Polyimide resins are especially preferred of them.

In particular, polyimide resins represented by the following general formulae (II) to (VIII), which are soluble in organic solvents, are preferably used to improve the productivity of the heat transfer sheets. These polyimide resins are also preferred for obtaining improvements on viscosity stability, long-term preservability and moisture resistance of a liquid coating composition for heat-light conversion layer.

(II)

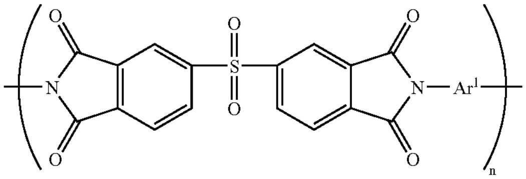

(III)

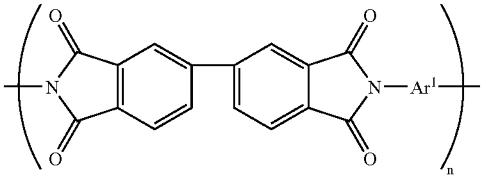

In formulae (II) and (III), $Ar^1$ represents an aromatic group represented by structural formulae (1) to (3); and n represents an integer of 10 to 100.

(1)

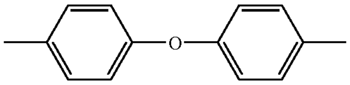

(2)

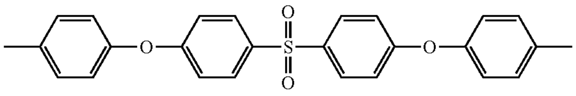

(3)

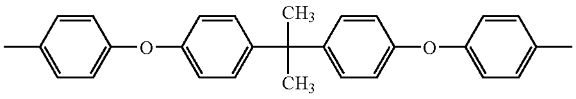

(IV)

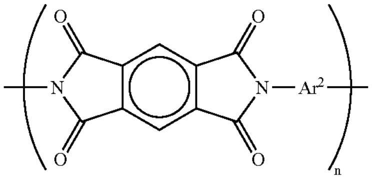

(V)

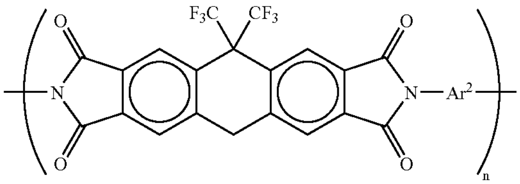

In the above general formulae (IV) and (V), $Ar^2$ represents an aromatic group represented by structural formulae (4) to (7); and n represents an integer of 10 to 100.

(4)

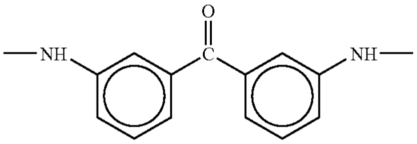

(5)

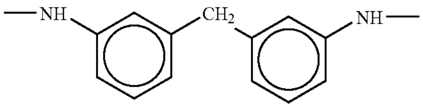

(6)

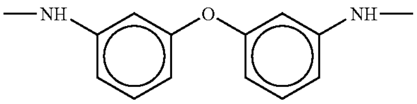

(7)

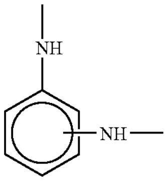

-continued (VI)

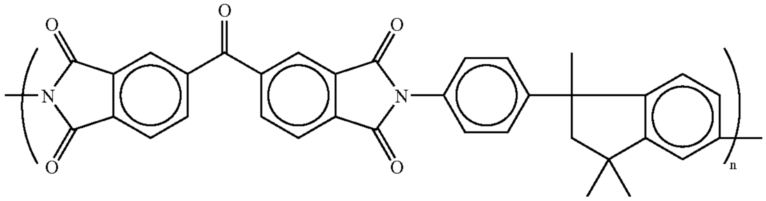

(VII)

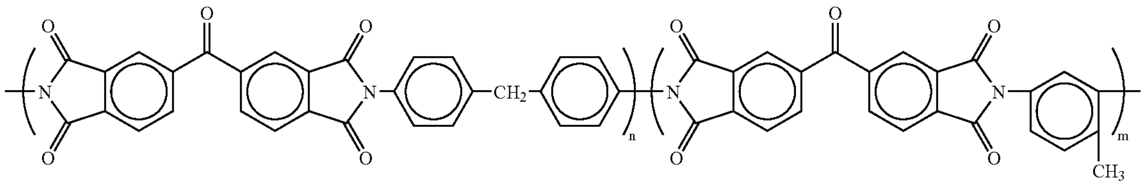

(VIII)

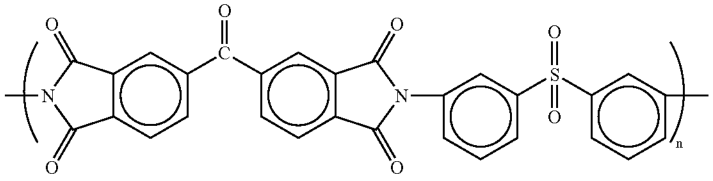

In the above formulae (VI) to (VIII), n and m each represent an integer of 10 to 100. In formula (VII), the ratio n:m is from 6:4 to 9:1.

In the present invention, it is preferable that the content of the polyamide-imide represented in the general formula (I) amounts to 50 to 100% by mass, still preferably 75 to 100% by mass, based on the whole light-heat conversion layer.

When at least 10 parts by mass of a resin dissolves in 100 parts by mass of N-methylpyrrolidone at 25° C., the resin can be seen as soluble in organic solvents. Resins having a solubility of 10 parts by mass or more in 100 parts by mass of N-methylpyrrolidone are preferably used as a binder of the light-heat conversion layer. Resins having a solubility of 100 parts by mass or more in 100. parts by mass of N-methylpyrrolidone are particularly preferred. In the second embodiment of the present invention, it is preferable to use, as the binder contained in the light-heat conversion layer, a resin having strength enough to form a layer on the support and a high heat conductivity, still preferably a resin having such heat resistance so as not to decompose by the heat generated by the light-heat converting substance, since the surface smoothness of the light-heat conversion layer can be maintained after irradiation with high energy light. Specifically, the binder resin preferably has a heat decomposition temperature of 400° C. or higher, particularly 500° C. or higher, as measured by TGA (thermogravimetric analysis). The heat decomposition temperature as used herein means the temperature at which a sample reduces its weight by 5% when heated in an air stream at a temperature rise rate of 10° C./min. The binder resin preferably has a glass transition temperature of from 200 to 400° C., particularly 250 to 350° C. In the case of using a resin having a glass transition temperature lower than 200° C., the resultant image sometimes suffers from fogging. In the case of using a resin having a glass transition temperature higher than 400° C., the solubility of the resin is lowered, which can result in reduction of productivity in some cases.

It is preferred for the binder of the light-heat conversion layer to have higher heat resistance (e.g., heat deformation temperature and heat decomposition temperature) than the materials used in other layers provided on the light-heat conversion layer.

Preferable examples of the above-described binder resins include acrylic resins, e.g., polymethyl methacrylate; polycarbonate; vinyl resins, e.g., polystyrene, vinyl chloride-vinyl acetate copolymers, and polyvinyl alcohol; polyvinyl butyral, polyester, polyvinyl chloride, polyamide, polyimide, polyether imide, polysulfone, polyether sulfone, aramid, polyurethane, epoxy resins, and urea-melamine resins. Among all, resins having imide bond such as polyimide resins are especially preferred.

The light-heat converting substance as described above is a substance capable of converting light energy to heat energy when irradiated with light. This substance is generally a colorant (inclusive of a pigment, the same applies hereinafter) capable of absorbing laser light. In infrared laser recording, infrared absorbing colorants are preferably used. Useful infrared absorbing colorants include black pigments, e.g., carbon black; macrocyclic compound pigments showing absorption in the visible to near-infrared region, such as phthalocyanine pigments and naphthalocyanine pigments; organic dyes used in high-density laser recording media (e.g., optical disks), such as cyanine dyes (e.g., indolenine dyes), anthraquinone dyes, azulene dyes, and phthalocyanine dyes; and organometallic colorants, such as dithiol nickel complexes. Inter alia, cyanine dyes have a high absorptivity coefficient in the infrared region. Use of the cyanine dyes as a light-heat converting substance makes it feasible to reduce the thickness of the light-heat conversion layer, which leads to improved recording sensitivity of the heat transfer sheet.

Useful light-heat converting substances include not only the colorants but inorganic materials such as particulate metallic materials, e.g., blackened silver.

As the light-heat converting substance, compounds represented by the following general formula (I') are highly preferred, because of having a high heat resistance, showing no colorant migration toward the image forming layer during laser recording, being capable of forming a light-heat conversion layer providing an image with a favorable color hue, the liquid coating composition for the light-heat conversion layer not being decomposed with time and being free from lowering in the absorbance.

General formula (I')

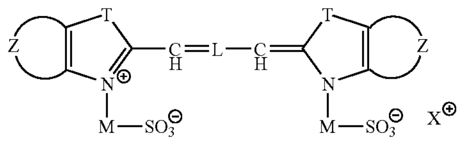

In the above general formula (I'), examples of the ring formed by Z include a benzene ring, a naphthalene ring, a pyridine ring, a quinoline ring, a pyrazine ring, a quinoxaline ring and so on. An additional substituent $R^6$ may be further bonded to Z. Examples of the substituent $R^6$ include various substituents such as alkyl groups, aryl groups, heterocyclic residues, halogen atoms, alkoxy groups, aryloxy groups, alkylthio groups, arylthio groups, alkylcarbonyl groups, arylcarbonyl groups, alkyloxycarbonyl groups, aryloxycarbonyl groups, alkylcarbonyloxy groups, arylcarbonyloxy groups, alkylamido groups, arylamido groups, alkylcarbamoyl groups, arylcarbamoyl groups, alkylamino groups, arylamino groups, carboxylate groups, alkylsulfonyl groups, arylsulfonyl groups, alkylsulfonamido groups, arylsulfonamido groups, alkylsulfamoyl groups, arylsulfamoyl groups, a cyano group and a nitro group. It is generally preferable that the number (p) of the above substituents bonded to Z is 0 or about 1 to 4. In the case where p is 2 or larger, $R^6$s may be either the same or different.

Among the substituents represented by $R^6$, preferable examples include halogen atoms (e.g., F, Cl), a cyano group, substituted or unsubstituted alkoxy groups having from 1 to 20 carbon atoms (e.g., methoxy, ethoxy, dodecyloxy and methoxyethoxy groups), substituted or unsubstituted phenoxy groups having from 6 to 20 carbon atoms (e.g., phenoxy, 3,5-dichlorophenoxy and 2,4-di-t-pentylphenoxy groups), substituted or unsubstituted alkyl groups having from 1 to 20 carbon atoms (e.g., methyl, ethyl, isobutyl, t-pentyl, octadecyl and cyclohexyl groups), substituted or unsubstituted phenyl groups having from 6 to 20 carbon atoms (e.g., phenyl, 4-methylphenyl, 4-trifluoromethylphenyl and 3,5-dichlorophenyl groups) and so on.

In the above general formula (I'), T represents —O—, —S—, —Se, —N($R^1$)—, —C($R^2$)($R^3$)— or —C($R^4$)=C($R^5$)—, wherein $R^1$, $R^2$, $R^3$, $R^4$ and $R^5$ preferably represent each a substituted or unsubstituted alkyl, aryl or alkenyl group, an alkyl group being still preferred. It is preferable that the groups represented by $R^1$ to $R^5$ have each from 1 to 30 carbon atoms, still preferably from 1 to 20 carbon atoms.

In the case where the groups represented by $R^1$ to $R^5$ are further substituted, preferable examples of the substituents include sulfonate groups, alkylcarbonyloxy groups, alkylamido groups, alkylsulfonamido groups, alkoxycarbonyl groups, alkylamino groups, alkylcarbamoyl groups, alkylsulfamoyl groups, alkoxy groups, aryloxy groups, alkylthio groups, arylthio groups, alkyl groups, aryl groups, a carboxyl group, halogen atoms, a cyano group and so on.

Among these substituents, preferable examples include halogen atoms (e.g., F, Cl), a cyano group, substituted or unsubstituted alkoxy groups having from 1 to 20 carbon atoms (e.g., methoxy, ethoxy, dodecyloxy and methoxyethoxy groups), substituted or unsubstituted phenoxy groups having from 6 to 20 carbon atoms (e.g., phenoxy, 3,5-dichlorophenoxy and 2,4-di-t-pentylphenoxy groups), substituted or unsubstituted alkyl groups having from 1 to 20 carbon atoms (e.g., methyl, ethyl, isobutyl, t-pentyl, octadecyl and cyclohexyl groups) and substituted or unsubstituted phenyl groups having from 6 to 20 carbon atoms (e.g., phenyl, 4-methylphenyl, 4-trifluoromethylphenyl and 3,5-dichlorophenyl groups). As $R^1$ to $R^5$, unsubstituted alkyl groups having from 1 to 8 carbon atoms are most desirable. As T, —$CH_2$—, —S—, —$C(CH_3)_2$— are preferable and —$C(CH_3)_2$— is still preferable.

In the general formula (I'), L represents a trivalent linking group formed by five or seven methine groups bonded to each other via conjugated double bonds which is optionally substituted. That is, L represents a pentamethine group, a heptamethine group or the like in which methine groups are bonded via conjugated double bonds. More specifically, the groups represented by the following (L-1) to (L-6) are preferable.

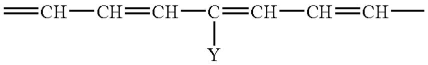

(L-1)

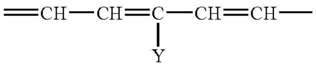

(L-2)

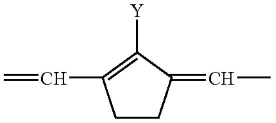

(L-3)

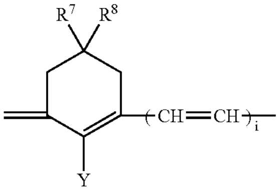

(L-4)

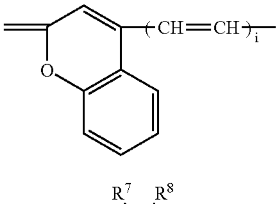

(L-5)

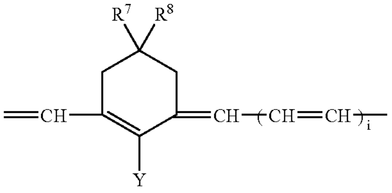

(L-6)

Among the above specific examples, linking groups exemplified by (L-2), (L-3), (L-4), (L-5) and (L-6) each forming a tricarbocyanine group are particularly preferred. In the above formulae (L-1) to (L-6), Y represents a hydrogen atom or a monovalent group. Preferable examples of the monovalent group represented by Y include lower alkyl groups (e.g., a methyl group), lower alkoxy groups (e.g., a methoxy group), substituted amino groups (e.g., dimethylamino, diphenylamino, methylphenylamino, morpholino, imidazolidine and ethoxycarbonylpiperazine groups), alkylcarbonyloxy groups (e.g., an acetoxy group), alkylthio groups (e.g., a methylthio group), a cyano group, a nitro group and halogen atoms (e.g., Br, Cl and F).

Among the groups represented by Y, a hydrogen atom is particularly preferred. As $R_7$ and $R_8$, a hydrogen atom and a lower alkyl group (e.g., a methyl group) are respectively preferable. In the above (L-4) to (L-6), i is 1 or 2, and j is 0 or 1.

In the general formula (I'), M represents a divalent linking group, preferably a substituted or unsubstituted alkylene group having form 1 to20 carbon atoms such as an ethylene group, a propylene group or a butylene group.

Examples of the cation represented by $X^+$ in the general formula (I') include metal ions ($Na^+$, $K^+$), ammonium ions (e.g., ions represented by $N^+H_4$, $HN^+(C_2H_5)_3$ and $N^+(C_2H_5)_4$) and a pyridinium ion.

As specific examples of the compounds represented by the general formula (I'), the following compounds can be cited, though the present invention is not restricted thereto.

(I'-1)

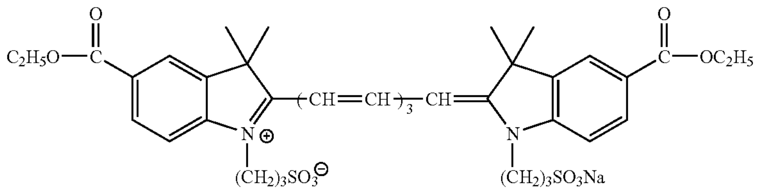

(I'-2)

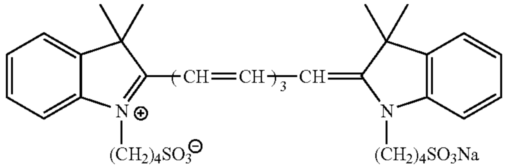

(I'-3)

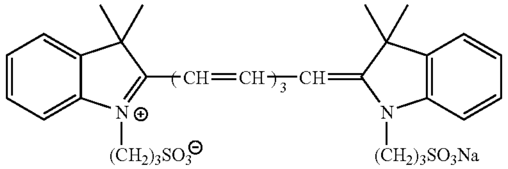

(I'-4)

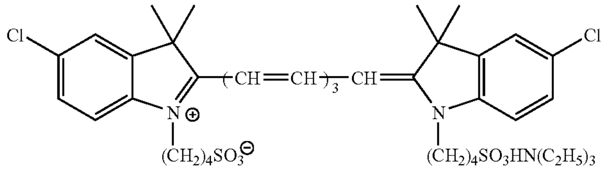

(I'-5)

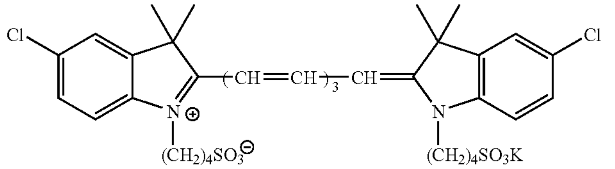

(I'-6)

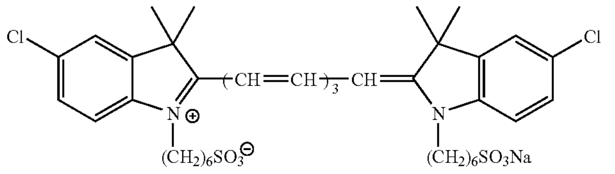

-continued
(I'-7)
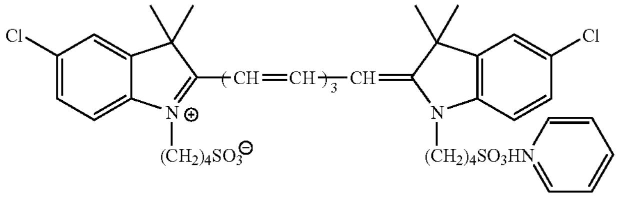
(I'-8)
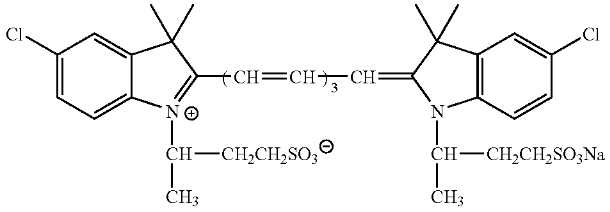
(I'-9)
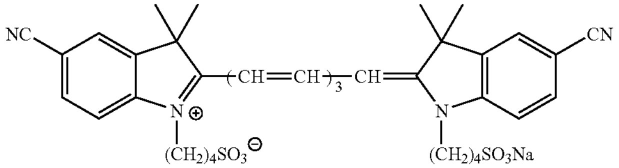
(I'-10)
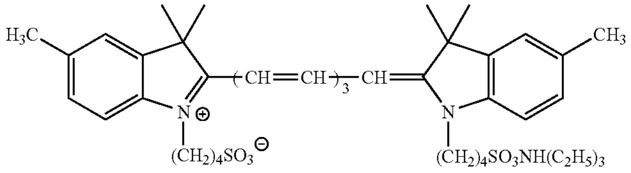
(I'-11)
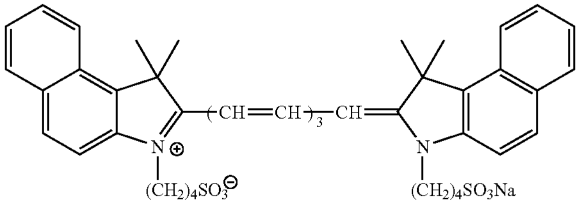
(I'-12)
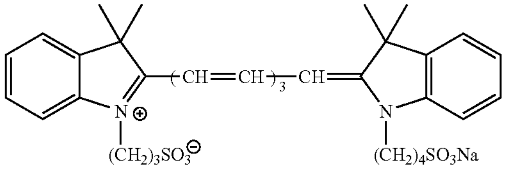
(I'-13)
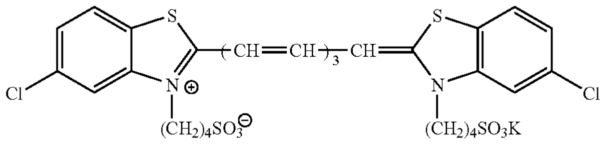
(I'-14)
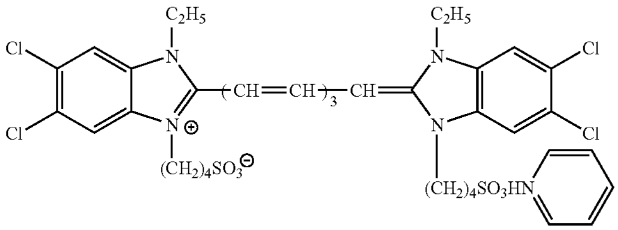

-continued (I'-15)

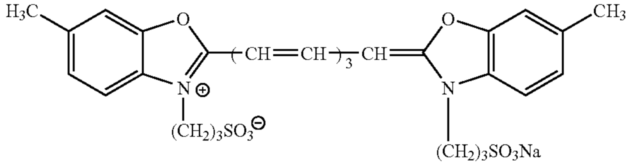

(I'-16)

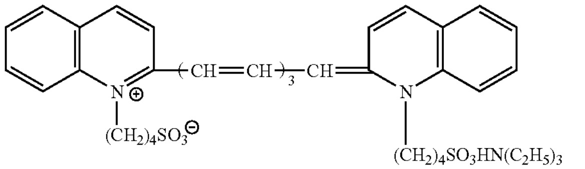

(I'-17)

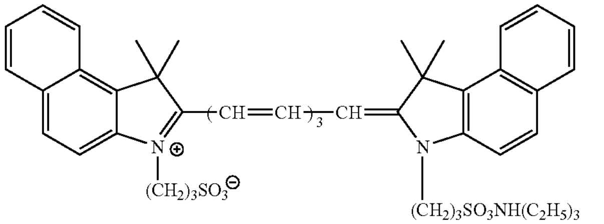

(I'-18)

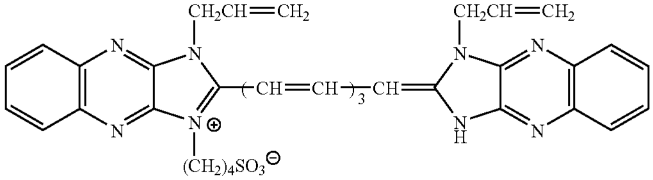

(I'-19)

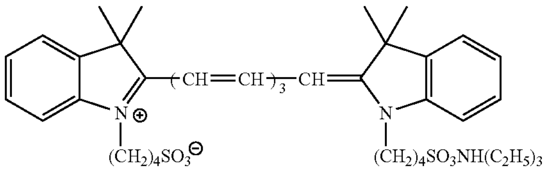

(I'-20)

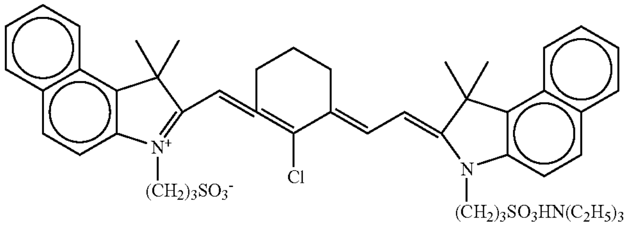

Such a compound represented by the above general formula (I') can be easily synthesized in the same manner as usually employed in synthesizing a carbocyanine colorant. Namely, it can be easily synthesized by reacting a heterocyclic enamine with an acetal such as $CH_3O—CH═CH—CH═CH—CH\ (OCH_3)_2$ or a compound represented by pHN—CH—(CH—CH)—NHPh, wherein Ph represents a phenyl group. Also, these compounds can be synthesized by specifically reference to JP-5-11645, etc.

In the case where a light-heat converting substance has a high decomposition temperature (i.e., being hardly decomposed), fogging troubles due to the coloration caused by the decomposition product can be prevented. From this point of view, it is preferable that the light-heat converting substance has a decomposition temperature of 200° C. or higher, still preferably 250° C. or higher. In the case where the decomposition temperature is lower than 200° C., the light-heat converting substance is decomposed and the decomposition product thus formed sometimes causes coloration and, in its turn, fogging, thereby worsening the image qualities.

In the present invention, it is preferable that the compound represented by the above general formula (I') is contained as the main component of the light-heat converting substance. Moreover, use can be further made of a publicly known light-converting substance so long as the effects achieved by using the compound represented by the general formula (I') are not deteriorated thereby. Such a light-heat converting substance known in public is generally a colorant (a pigment, etc.) capable of absorbing laser light. Examples of such colorants (pigments, etc.) include black pigments, e.g., carbon black; macrocyclic compound pigments showing absorption in the visible to near-infrared region, such as phthalocyanine pigments and naphthalocyanine pigments; organic dyes used in high-density laser recording media (e.g., optical disks), such as cyanine dyes other than the indolenine dyes according to the invention such as anthraquinone dyes, azulene dyes, and phthalocyanine dyes; and organometallic colorants, such as dithiol nickel complexes.

The matting agents which can be added to the light-heat conversion layer include fine inorganic or organic particles. The fine inorganic particles include metal salts, e.g., silica, titanium oxide, aluminum oxide, zinc oxide, magnesium oxide, barium sulfate, magnesium sulfate, aluminum hydroxide, magnesium hydroxide, and boron nitride, kaolin, clay, talc, zinc flower, lead white, zeeklite, quartz, diatomaceous earth, pearlite, bentonite, mica, and synthetic mica. The fine organic particles include particles of fluorine resins, guanamine resins, acrylic resins, styrene-acryl copolymer resins, silicone resins, melamine resins, and epoxy resins.

The matting agent usually has a particle size of from 0.3 to 30 μm, preferably from 0.5 to 20 μm. It is preferably added in an amount of 0.1 to 100 $mg/m^2$.

If desired, the light-heat conversion layer can contain surface active agents, thickeners, antistatic agents, and the like.

The light-heat conversion layer is formed by applying a liquid coating composition to a support and drying the coating. The liquid coating composition is prepared by dissolving the light-heat converting substance and a binder in an organic solvent and adding thereto a matting agent and other necessary additives. Organic solvents which can be used to dissolve the binder include n-hexane, cyclohexane, diglyme, xylene, toluene, ethyl acetate, tetrahydrofuran, methyl ethyl ketone, acetone, cyclohexanone, 1,4-dioxane, 1,3-dioxane, dimethyl acetate, N-methyl-2-pyrrolidone, dimethyl sulfoxide, dimethylformamide, dimethylacetamide, γ-butyrolactone, ethanol, and methanol. Application and drying of the liquid coating composition can be carried out in a conventional manner. Drying is usually effected at temperatures of 300° C. or lower, preferably 200° C. or lower. In the case where a polyethylene terephthalate support is used, drying is preferably performed at 80 to 150° C.

In the case where the amount of the binder in the light-heat conversion layer is too small, the light-heat conversion layer has reduced cohesive force and tends to accompany the image forming layer being transferred to the image receiving sheet, which causes image color mixing. Use of too much the binder necessitates an increase in layer thickness for achieving a given absorbance, which frequently causes sensitivity reduction. A preferred solid basis weight ratio of the light-heat converting substance to the binder in the light-heat conversion layer is 1:20 to 2:1, particularly 1:10 to 2:1.

It is preferable that the light-heat conversion layer is made thinner, since the sensitivity increases as stated previously. The thickness of the light-heat conversion layer is preferably from 0.03 to 1.0 μm, still preferably from 0.05 to 0.5 μm. From the standpoint of transfer sensitivity, the optical density of the light-heat conversion layer is preferably from 0.80 to 1.26, still preferably from 0.92 to 1.15, at a wavelength of 808 nm. If the optical density at a laser peak wavelength is less than 0.80, light to heat conversion tends to be insufficient, resulting in reduced transfer sensitivity. An optical density exceeding 1.26 will adversely affect the recording function of the light-heat conversion layer, which can result in fogging. In the present invention, the optical density of the light-heat conversion layer of the heat transfer sheet means the absorbance of the light-heat conversion layer at the peak wavelength of the laser light to be used in recording the image forming material according to the present invention. It can be measured by using a publicly known spectrophotometer. In the present invention, use was made of a UV spectrophotometer UV-240 supplied by Shimadzu Corp. The optical density as described above means a value calculated by subtracting the value of the support alone from the value determined including the support.

From the viewpoint of improving the sensitivity, it is preferred that the ratio of the optical density (OD) and layer thickness (μm) of the light-heat conversion layer (OD/layer thickness) is 0.57 or more, still preferably 1.50 or more.

As discussed above, the degree of deformation represented by a deformation percentage in the laser-irradiated area of the light-heat conversion layer determined by observing the cross-sectional areas of the light-heat conversion layer under a laser microscope (VK8500 supplied by Keyence Corp.), which is expressed in the value calculated in accordance with the following numerical formula (1), is 150% or more, preferably 200% or more and still preferably 300% or more in the present invention.

$$\text{deformation percentage } (\%)=\{(a+b)/(b)\}\times 100 \quad \text{Numerical Formula (1):}$$

wherein a stands for the cross-sectional area of the light-heat conversion layer having been enlarged after irradiation; and (b) stands for the cross-sectional area of the light-heat conversion layer before irradiation.

The above cross-sectional areas indicate each the area of the cross-section located outermost in the direction perpendicular to the laser light path on the heat transfer sheet face.

The deformation percentage in the present invention means a value measured upon irradiation with laser light under the following conditions.

Environmental Conditions: 10 to 35° C., 10 to 80% RH

Laser Exposure Conditions:

Beam size: 5 to 50 μm

Main scan speed: 1 to 20 m/sec

Light intensity on exposed face: 1000 $W/mm^2$ or more

In the present invention, the deformation percentage can be regulated within a desired range by appropriately designing controlling factors. With respect to the environmental conditions, temperature preferably ranges from 18 to 26° C. while RH preferably ranges from 30 to 60%. With respect to the laser exposure conditions, the laser beam size preferably ranges from 6 to 30 μm, the scan speed preferably ranges from 3 to 15 m/sec, and the light intensity on the exposed face is preferably 5000 $W/mm^2$ or more.

The enlargement in the cross-sectional area (a) as described above is caused by the deformation of the light-heat conversion layer. Although the deformation of the light-heat conversion layer is not restricted in mode (e.g., dilation, cohesive failure, etc.), it is preferred that the light-heat conversion layer undergoes cohesive failure and thus the cross-sectional shape in the perpendicular direction to the laser light path becomes semicircular or semielliptic. The thus deformed layer has a dome shape having a space inside corresponding to the laser light recording unit. The enlarged cross-sectional area (a) also involves this space. By laser irradiation, the inside of the light-heat conversion layer is deformed into, for example, a dome shape. The dome-shaped light-heat conversion layer pushes the image forming layer outward, whereby the image forming layer is brought into more intimate contact with the image receiving layer and transferred thereto easily. Thus, thin film heat transfer can be performed more efficiently.

While the deformation percentage could exceed 250% as long as the heat-light conversion layer has an increased elongation at break, a preferred upper limit is usually about 250%.

Examples of methods of controlling the deformation percentage to 150% or higher include selecting appropriate binders, plasticizers, residual solvent and so on in the light-heat conversion layer and appropriately adjusting the contents of these components and moisture, though the present invention is not restricted thereto.

Plasticizers and liquid components such as residual solvents and moisture are important factors in controlling the deformation percentage of the light-heat conversion layer. The liquid content can be controlled by appropriately selecting drying conditions and so on in forming the light-heat conversion layer. Effects of the liquid components also relate to humidity. The contents of liquid components usually range from 0 to 50% by mass, preferably form 5 to 30% by mass in the light-heat conversion layer.

From the viewpoints of light resistance and compatibility with colorants, the SP value serving as an indication of the cohesive energy density of the binder in the light-heat conversion layer is preferably 25 or higher, still preferably 27 or higher and still preferably 29 or higher.

The Sp value is calculated in accordance with Okitsu's method which is described in detail in Nippon Secchaku Gakkai-shi, Vol.29, No.5 (1993).

(Image Forming Layer)

The image forming layer comprises a pigment which is transferred to the image receiving sheet to form an image, a binder for forming the layer, and, if desired, other components.

The pigment that can be used in the image forming layer are roughly divided into organic ones and inorganic ones. Organic pigments are particularly excellent in film transparency, and inorganic ones are generally excellent in hiding powder. Proper pigments are selected according to the purpose with these characteristics taken into consideration. In making heat transfer sheets for color proofing, it is preferred to use organic pigments whose color tones match or approximate the colors of printing inks, such as yellow, magenta, cyan and black. Metallic powders, fluorescent pigments, and the like a real so used in some cases. Suitable organic pigments include azo pigments, phthalocyanine pigments, anthraquinone pigments, dioxazine pigments, quinacridone pigments, isoindolinone pigments, and nitro pigments. The pigments useful in the image-forming layer are listed below for illustrative purposes only but not for limitation.

1) Yellow Pigment

Pigment Yellow 12 (C.I. No. 21090):
- Example: Permanent Yellow DHG (from Clariant (Japan) KK), Lionol Yellow 1212B (from Toyo Ink Mfg. Co., Ltd.), Irgalite Yellow LCT (from Ciba Specialty Chemicals), Symuler Fast Yellow GTF219 (from Dainippon Ink & Chemicals, Inc.)

Pigment Yellow 13 (C.I. No. 21100):
- Example: Permanent Yellow GR (from Clariant (Japan) KK), Lionol Yellow 1313 (from Toyo Ink Mfg. Co., Ltd.)

Pigment Yellow 14 (C.I. No. 21095):
- Example: Permanent Yellow G (from Clariant (Japan) KK), Lionol Yellow 1401-G (from Toyo Ink Mfg. Co., Ltd.), Seika Fast Yellow 2270 (from Dainichiseika Colour & Chemicals Mgf. Co., Ltd.), Symuler Fast Yellow 4400 (from Dainippon Ink & Chemicals, Inc.)

Pigment Yellow 17 (C.I. No. 21105):
- Example: Permanent Yellow GG02 (from Clariant (Japan) KK), Symuler Fast Yellow 8GF (from Dainippon Ink & Chemicals, Inc.)

Pigment Yellow 155:
- Example: Graphtol Yellow 3GP (from Clariant (Japan) KK)

Pigment Yellow 180 (C.I. No. 21290):
- Example: Novoperm Yellow P-HG (from Clariant (Japan) KK.), PV Fast Yellow HG (from Clariant (Japan) KK.)

Pigment Yellow 139 (C.I. No. 56298):
- Example: Novoperm Yellow M2R 70 (from Clariant (Japan) KK.)

2) Magenta Pigment

Pigment Red 57:1 (C.I. No. 15850:1):
- Example: Graphtol Rubine L6B (from Clariant (Japan) KK), Lionol Red 6B-4290G (from Toyo Ink Mfg. Co., Ltd.), Irgalite Rubine 4BL (from Ciba Specialty Chemicals), Symuler Brilliant Carmine 6B-229 (from Dainippon Ink & Chemicals, Inc.)

Pigment Red 122 (C.I. No. 73915):
- Example: Hosterperm Pink E (from Clariant (Japan) KK.), Lionogen Magenta 5790 (from Toyo Ink Mfg. Co., Ltd.), Fastogen Super Magenta RH (from Dainippon Ink & Chemicals, Inc.)

Pigment Red 53:1 (C.I. No. 15585:1):
- Example: Permanent Lake Red LCY (from Clariant (Japan) KK), Symuler Lake Red C conc (from Dainippon Ink & Chemicals, Inc.)

Pigment Red 48:1 (C.I. No. 15865:1):
- Example: Lionol Red2B3300 (from Toyo Ink Mfg. Co., Ltd.), Symuler Red NRY (from Dainippon Ink & Chemicals, Inc.)

Pigment Red 48:2 (C.I. No. 15865:2):
- Example: Permanent Red W2T (from Clariant (Japan) KK), Lionol Red LX235 (from Toyo Ink Mfg. Co., Ltd.), Symuler Red 3012 (from Dainippon Ink & Chemicals, Inc.)

Pigment Red 48:3 (C.I. No. 15865:3):
- Example: Permanent Red 3RL (from Clariant (Japan) KK), Symuler Red 2BS (from Dainippon Ink & Chemicals, Inc.)

Pigment Red 177 (C.I. No. 65300):
- Example: Cromophtal Red A2B (from Ciba Specialty Chemicals)

3) Cyan Pigment

Pigment Blue 15 (C.I. No. 74160):
- Example: Lionol Blue 7027 (from Toyo Ink Mfg. Co., Ltd.), Fastogen Blue BB (from Dainippon Ink & Chemicals, Inc.)

Pigment Blue 15:1 (C.I. No. 74160):
- Example: Hosterperm Blue A2R (from Clariant (Japan) KK), Fastogen Blue 5050 (from Dainippon Ink & Chemicals, Inc.)

Pigment Blue 15:2 (C.I. No. 74160):
- Example: Hosterperm Blue AFL (from Clariant (Japan) KK)), Irgalite Blue BSP (from Ciba Specialty Chemicals), Fastogen Blue GP (from Dainippon Ink & Chemicals, Inc.)

Pigment Blue 15:3 (C.I. No. 74160):
- Example: Hosterperm Blue B2G (from Clariant (Japan) KK.), Lionol Blue FG7330 (from Toyo Ink Mfg. Co., Ltd.), Cromophtal Blue 4GNP (from Ciba Specialty Chemicals), Fastogen Blue FGF (from Dainippon Ink & Chemicals, Inc.)

Pigment Blue 15:4 (C.I. No. 74160):

Example: Hosterperm Blue BFL (from Clariant (Japan) KK), Cyanine Blue 700-10FG (from Toyo Ink Mfg. Co., Ltd.), Irgalite Blue GLNF (from Ciba Specialty Chemicals), Fastogen Blue FGS (from Dainippon Ink & Chemicals, Inc.)

Pigment Blue 15:6 (C.I. No. 74160):

Example: Linol Blue ES (from Toyo Ink Mfg. Co., Ltd.),

Pigment Blue 60 (C.I. No. 69800):

Example: Hosterperm Blue 6501 (from Clariant (Japan) KK), Linogen Blue 6501 (from Toyo Ink Mfg. Co., Ltd.), 4) Black Pigment Pigment Black 7 (carbon black C.I. No. 77266):

Example: Mitsubishi Carbon Black MA100 (from Mitsubishi Chemicals Co., Ltd.), Mitsubishi Carbon Black #5 (from Mitsubishi Chemicals Co., Ltd.), Black Pearls 430 (from Cabot Co.)

The pigments to be used in the invention can be chosen from commercially available products by referring to Nippon Ganryo Gijutsu Kyokai (ed.), Ganryo Binran, Seibundo Shinko-Sha (1989), and *COLOUR INDEX, THE SOCIETY OF DYES & COLOURIST,* 3rd Ed. (1987).

The above-described pigments preferably have an average particle size of 0.03 to 1 μm, particularly 0.05 to 0.5 μm. Where the average particle size is smaller than 0.03 μm, pigment dispersing cost tends to increase, and dispersions tend to gel. As far as the average particle size is 1 μm or smaller, there is no coarse particles, which assures good adhesion between the image forming layer and the image receiving layer and improves the transparency of the image forming layer.

The binder to be used in the image forming layer preferably includes amorphous organic polymers having a softening point of 40 to 150° C. Such polymers include butyral resins, polyamide resins, polyethylene-imine resins, sulfonamide resins, polyester polyol resins, petroleum resins; homo- and copolymers of styrene or derivatives thereof, e.g., styrene, vinyltoluene, α-methylstyrene, 2-methylstyrene, chlorostyrene, vinylbenzoic acid, sodium vinylbenzenesulfonate, and aminostyrene; and homo- and copolymers of vinyl compounds, such as methacrylic acid and esters thereof, e.g., methyl methacrylate, ethyl methacrylate, butyl methacrylate, and hydroxyethyl methacrylate, acrylic acid and esters thereof, e.g., methyl acrylate, ethyl acrylate, butyl acrylate, and α-ethylhexyl acrylate, dienes, e.g., butadiene and isoprene, acrylonitrile, vinyl ethers, maleic acid, maleic esters, maleic anhydride, cinnamic acid, vinyl chloride, and vinyl acetate. These resins may be used either individually or as a mixture thereof.

The image forming layer preferably contains 30 to 70% by mass, particularly 30 to 50% by mass, of the pigment and 30 to 70% by mass, particularly 40 to 70% by mass, of the resin.

The image forming layer can further contain the following components 1) to 3).

1) Waxes

Useful waxes include mineral waxes, natural waxes and synthetic waxes. Examples of the mineral waxes are petroleum waxes, such as paraffin wax, microcrystalline wax, and ester wax, oxide waxes, montan wax, ozokerite and ceresin. Paraffin wax is preferred above all. The paraffin wax is separated from petroleum, and various products having different melting points are commercially available.

The natural waxes include vegetable waxes, e.g., carnauba wax, Japan wax, auriculae wax, and esparto wax, and animal waxes, e.g., beeswax, insect wax, shellac wax, and spermaceti.

The synthetic waxes are commonly used as a lubricant and generally comprise higher fatty acid compounds. Included are:

1) Fatty Acid Waxes

Straight-chain saturated fatty acids represented by formula:

$$CH_3(CH_2)_nCOOH$$

wherein n is an integer of 6 to 28, such as stearic acid, behenic acid, palmitic acid, 12-hydroxystearic acid, and azelaic acid; and their metal (e.g., K, Ca, Zn or Mg) salts.

2) Fatty Acid Ester Waxes

Fatty acid esters, such as ethyl stearate, lauryl stearate, ethyl behenate, hexyl behenate, and behenyl myristate.

3) Fatty Acid Amide Waxes

Fatty acid amides, such as stearamide and lauramide.

4) Aliphatic Alcohol Waxes

Straight-chain saturated aliphatic alcohols represented by formula:

$$CH_3(CH_2)_nOH$$

wherein n is an integer of 6 to 28, such as stearyl alcohol.

Of the synthetic waxes 1) to 4), higher fatty acid amides such as stearamide and lauramide are suitable. These wax compounds can be used either alone or in a combination thereof.

2) Plasticizers

Suitable plasticizers include ester compounds. Examples thereof include compounds publicly known as plasticizers such as phthalic acid esters, e.g., dibutyl phthalate, di-n-octyl phthalate, di(2-ethylhexyl)phthalate, dinonyl phthalate, dilauryl phthalate, butyllauryl phthalate, and butylbenzyl phthalate; aliphatic dibasic acid esters, e.g., di(2-ethylhexyl)adipate, and di(2-ethylhexyl)sebacate; phosphoric triesters, e.g., tricresyl phosphate and tri(2-ethylhexyl)phosphate; polyol polyesters, e.g., polyethylene glycol esters; and epoxy compounds, e.g., epoxy fatty acid esters. Among them, vinyl monomer esters, particularly acrylic esters and methacrylic esters are preferred in view of their effects in improving transfer sensitivity, preventing transfer unevenness, and controlling elongation at break.

Examples of such acrylic and methacrylic esters are polyethylene glycol dimethacrylate, 1,2,4-butanetriol trimethacrylate, trimethylolethane triacrylate, pentaerythritol acrylate, pentaerythritol tetraacrylate, and dipentaerythritol polyacrylate.

Polymeric plasticizers are also useful. In particular, polyesters are preferred polymeric plasticizers because of their high effect of addition and non-diffusibility during storage. Polyester plasticizers include sebacic acid polyesters and adipic acid polyesters.

The plasticizers which can be added to the image forming layer are not limited to those described. The plasticizers recited above can be used either individually or as a combination of two or more thereof.

Too much additives added to the image forming layer, there would result impaired resolution of a transferred image, reduced strength of the image forming layer, or reduced adhesion between the image forming layer and the light-heat conversion layer. Poor adhesion can result in undesired transfer of a non-exposed area of the image forming layer to an image receiving sheet. From this viewpoint, a recommended wax content in the image forming layer is from 0.1 to 30% by mass, preferably from 1 to 20% by mass, based on the total solids content of the image forming layer. Likewise, a recommended plasticizer content is from 0.1 to 20% by mass, preferably from 0.1 to 10% by mass, based on the total solids content of the image forming layer.

(3) Other Additives

The image forming layer may further contain other additives, such as surface active agents, organic or inorganic fine particles (e.g., metallic powder and silica gel), oils (e.g., linseed oil and mineral oil), thickeners, and antistatic agents. A substance having an absorption at a writing laser wavelength can be added to the image forming layer except for the case where a black image is to be formed, which is beneficial for transfer energy saving. While such a substance maybe either a pigment or a dye, it is desirable for color reproduction to use a recording light source emitting infrared light (e.g., semiconductor laser) and to add a dye having a small absorption in the visible region and a large absorption at the wavelength of the light source. Useful near infrared absorbing dyes are described in JP-A-3-103476.

The image forming layer can be formed by dissolving or dispersing the pigment and the binder as described above in a solvent to prepare a liquid coating composition, applying the liquid coating composition on the light-heat conversion layer (or a heat-sensitive release layer if provided on the light-heat conversion layer as described later), and drying the coating. The solvent for use in the preparation of the liquid coating composition includes n-propyl alcohol, methyl ethyl ketone, propylene glycol monomethyl ether (MFG), methanol and water. Coating and drying can be performed according to ordinary coating and drying methods.

The heat transfer sheets may each have a heat-sensitive release layer between the light-heat conversion layer and the image forming layer. The heat-sensitive release layer contains a heat-sensitive material which generates gas or releases adsorbed water by the action of the heat generated in the light-heat conversion layer and thereby reduces the adhesive strength between the light-heat conversion layer and the image forming layer. Such a heat-sensitive material includes those compounds, inclusive of polymers and low-molecular compounds, which decompose or denature by heat to generate gas and those compounds, inclusive of polymers and low-molecular compounds, which have absorbed or adsorbed a considerable amount of a volatile compound, such as water. These types of compounds may be used in combination.

Polymers which generate gas on thermal decomposition or denaturation include self-oxidizing polymers, e.g., nitrocellulose; halogen-containing polymers, e.g., chlorinated polyolefin, chlorinated rubber, polychlorinated rubber, polyvinyl chloride, and polyvinylidene chloride; acrylic polymers (e.g., polyisobutyl methacrylate) having adsorbed a volatile compound such as water; cellulose esters (e.g., ethyl cellulose) having adsorbed a volatile compound such as water; and natural high molecular compounds (e.g., gelatin) having adsorbed a volatile compound such as water. Low-molecular compounds which generate gas on heat decomposition or denaturation include diazo compounds and azide compounds which thermally decompose to generate gas.

It is desirable that decomposition or denaturation of the heat-sensitive material should occur at 280° C. or lower, particularly 230° C. or lower.

When a low-molecular heat-sensitive material is used in the heat-sensitive release layer, it is preferably used in combination with a binder. The binder to be used may be either of the type that decomposes or denatures to generate gas or of the type that does not. The mass ratio of the low-molecular heat-sensitive compound to the binder if used is preferably 0.02:1 to 3:1, still preferably 0.05:1 to 2:1. It is preferred that the heat-sensitive release layer is provided on substantially the entire surface of the light-heat conversion layer. The thickness of the heat-sensitive release layer is usually from 0.03 to 1 μm, preferably from 0.05 to 0.5 μm.

According to the layer structure having a light-heat conversion layer, a heat-sensitive release layer, and an image forming layer on the support in that order, the heat-sensitive release layer decomposes or denatures by heat conducted from the light-heat conversion layer to generate gas. As a result of this decomposition or gas generation, part of the heat-sensitive release layer disappears, or cohesive failure occurs in the heat-sensitive release layer. It follows that the adhesive strength between the light-heat conversion layer and the image forming layer is reduced. Here, depending on the behavior of the heat-sensitive release layer, cases are sometimes met with in which part of the heat-sensitive release layer accompanies the image forming layer transferred to the image receiving sheet, which can cause color mixing in the transfer image. Therefore, it is desirable that the heat-sensitive release layer is substantially colorless so that no perceptible color mixing may occur even if such undesired transfer of the heat-sensitive release layer should happen. In other words, the heat-sensitive release layer should desirably have high transparency to visible rays. Specifically, the absorbance of the heat-sensitive release layer in the visible region is 50% or less, preferably 10% or less.

Instead of providing an independent heat-sensitive release layer, the above-mentioned light-sensitive material may be incorporated into the light-heat conversion layer so that the light-heat conversion layer may perform the function as a light-heat conversion layer combined with the function as a heat-sensitive release layer.

It is preferred for the heat transfer sheet to have a coefficient of static friction of 0.35 or smaller, particularly 0.20 or smaller, on its surface of the image forming layer side. By controlling the coefficient of static friction of the outermost layer to 0.35 or smaller, the feed rollers for carrying the heat transfer sheets are prevented from being contaminated, and the quality of the transfer image can be improved. The coefficient of static friction is measured in accordance with the method taught in Japanese Patent Application No. 2000-85759, para. [0011].

The surface of the image forming layer preferably has a smooster value of 0.5 to 50 mmHg (≈0.0665 to 6.65 kPa) at 23° C. and 55% RH and a center-line average surface roughness Ra of 0.05 to 0.4 μm. With these surface roughness parameters falling within the recited ranges, the microscopic spaces formed between the image receiving layer and the image forming layer are reduced in size and number, which favors to image transfer and image quality. The Ra is measured with a profilometer, e.g., Surfcom (available from Tokyo Seimitsu Co., Ltd.) in accordance with JIS B0601. The surface hardness of the image forming layer is preferably 10 g or more measured with a sapphire stylus. The static dissipation capability of the image forming layer is preferably such that, when the layer is electrically charged according to Federal Test Standard Method 4046 and then grounded, the electrification potential 1 second after grounding is −100 to 100 V. It is preferred that the surface resistivity of the image forming layer at 23° C. and 55% RH be $10^9$ Ω or less.

In the present invention, it is preferable that the ratio of optical density (OD) to layer thickness (μm) (OD/layer thickness) of the image forming layer is 1.50 or more, still preferably 1.8 or more and still preferably 2.5 or more. By satisfying the above requirement in the ratio of optical density (OD) to layer thickness, color reproducibility and transfer to printing paper can be improved.

The multicolor image recording area of the heat transfer sheet is preferably 515 mm×728 mm or larger, still preferably 594×841 mm or larger, thereby providing large-sized DDCPs. The multicolor image recording area of the heat transfer sheet corresponds to the area of the image forming layer.

[Image Receiving Sheet]

Next, the image receiving sheet which can be used in combination with the above-described heat transfer sheets will be illustrated.

(Layer Configuration)

The image receiving sheet generally comprises a support and at least one image receiving layer provided thereon. The image receiving sheet may additionally have one or more layers selected from a cushioning layer, a release layer, and an intermediate layer provided between the support and the image receiving layer. To secure smooth pass of the image receiving sheet in the recording apparatus, it is preferred to provide a backcoating layer on the back side of the support.

(Support)

The support of the image receiving sheet includes sheet materials commonly employed such as a plastic sheet, a metal sheet, a glass sheet, resin-coated paper, paper, and various composite laminates. Examples of the plastic sheet include polyethylene terephthalate sheets, polycarbonate sheets, polyethylene sheets, polyvinyl chloride sheets, polyvinylidene chloride sheets, polystyrene sheets, styrene-acrylonitrile copolymer sheets, and polyester sheets. Paper as a support includes actual printing paper and coated paper.

It is preferred for the support to have micro voids to improve quality of a transfer image. Supports with micro voids can be obtained by, for example, extruding one or more molten mixtures of a thermoplastic resin and a filler, such as an inorganic pigment or a polymer incompatible with the thermoplastic resin matrix, into a single-layer or multilayer film and stretching the extruded film uniaxially or biaxially. The void of the resulting stretched film depends on the kinds of the resin and the filler, the mixing ratio, and the stretching conditions.

As the thermoplastic resin matrix as described above, a polyolefin resin, such as polypropylene, or polyethylene terephthalate is preferably used in view of their good crystallinity and stretchability necessary to form voids. A combination of a polyolefin resin or polyethylene terephthalate and a minor proportion of other thermoplastic resin is preferred. The pigment used as a filler preferably has an average particle size of from 1 to 20 μm. Useful pigments are calcium carbonate, clay, diatomaceous earth, titanium oxide, aluminum hydroxide, and silica. In using polypropylene as a thermoplastic resin matrix, polyethylene terephthalate is a preferred filler incompatible with the matrix. For the details of preparation of a support with micro voids, reference can be made in JP-A-2001-105752. The content of the filler, such as an inorganic pigment, in the support is usually about 2 to 30% by volume.

The thickness of the support of the image receiving sheet is usually from 10 to 400 μm, preferably from 25 to 200 μm. The support may be subjected to surface treatment, e.g., corona discharge treatment or glow discharge treatment to have improved adhesion to the image receiving layer (or a cushioning layer) or to improve the adhesion between the image receiving layer and the image forming layer of the heat transfer sheet.

(Image Receiving Layer)

The image receiving sheet has at least one image receiving layer for receiving and holding the image forming layer being transferred from the heat transfer sheet. The image receiving layer is preferably formed of a resin binder matrix. The resin binder is preferably a thermoplastic resin. Examples of suitable thermoplastic resin binders include homopolymers and copolymers of acrylicmonomers, e.g., acrylic acid, methacrylic acid, acrylic esters, and methacrylic esters; cellulosic resins, e.g., methyl cellulose, ethyl cellulose, and cellulose acetate; homopolymers and copolymers of vinyl monomers, e.g., polystyrene, polyvinylpyrrolidone, polyvinyl butyral, polyvinyl alcohol, and polyvinyl chloride; condensed polymers, e.g., polyester and polyamide; and rubbery polymers, e.g., butadiene-styrene copolymers. The binder of the image receiving layer preferably has a glass transition temperature (Tg) of 90° C. or lower so as to exhibit moderate adhesion to the image forming layer. A plasticizer may be added to the image forming layer for the purpose of lowering the Tg. The binder resin preferably has a Tg of 30° C. or higher for preventing film blocking. It is particularly preferred that the binder resin of the image receiving layer and that of the image forming layer are the same or at least analogous to each other so that these layers may be in intimate contact during laser writing thereby to improve transfer sensitivity and image strength.

The image receiving layer surface preferably has a smooster value of 0.5 to 50 mmHg (≈0.0665 to 6.65 kPa) measured at 23° C. and 55% RH and an Ra of 0.05 to 0.4 μm. The surface roughness parameters of the image receiving layer falling within these ranges, the microscopic spaces formed between the image receiving layer and the image forming layer are reduced in size and number, which favors to image transfer and image quality. The above Ra is measured with a profilometer (Surfcom available from Tokyo Seimitsu Co., Ltd.) in accordance with JIS B0601. The static dissipation capability of the image receiving layer is preferably such that, when the layer is electrically charged according to Federal Test Standard Method 4046 and then grounded, the electrification potential 1 second after grounding is −100 to 100 V. It is preferred that the surface resistivity of the image receiving layer at 23° C. and 55% RH be $10^9$ Ω or less. The image receiving layer preferably has a coefficient of static friction of 0.2 or smaller and a surface energy of 23 to 35 $mg/m^2$.

Where the transfer image on the image receiving layer is re-transferred to printing paper, etc., it is preferred that at least one image receiving layer be made of a photocuring material. A photocuring material includes a combination comprising (a) at least one photopolymerizable monomer selected from polyfunctional vinyl and/or vinylidene compounds capable of addition polymerization, (b) an organic polymer, and (c) a photopolymerization initiator, and optionally additives such as a thermal polymerization inhibitor. The polyfunctional vinyl monomers as described above include unsaturated esters of polyols, particularly acrylic or methacrylic esters (e.g., ethylene glycol diacrylate and pentaerythritol tetraacrylate).

The organic polymer as described above includes those recited above for use to form the image receiving layer. The photopolymerization initiator includes ordinary photo-radical polymerization initiators, e.g., benzophenone and Michler's ketone. The initiator is usually used in an amount of 0.1 to 20% by mass based on the weight of the layer.

The thickness of the image receiving layer is generally from 0.3 to 7 μm, preferably from 0.7 to 4 μm. A thickness of 0.3 μm or larger secures sufficient film strength in re-transferring to printing paper. With a thickness of 7 μm or smaller, glossiness of the image after re-transfer to printing paper is suppressed to improve approximation to final prints.

(Other Layers)

A cushioning layer may be provided between the support and the image receiving layer. A cushioning layer will improve adhesion between the image receiving layer and the image forming layer during laser writing, which leads to image quality improvement. Even when dust enters between the heat transfer sheet and the image receiving sheet during recording, the cushioning layer will be deformed in conformity with the contour of the dust to minimize the non-contact area of the two sheets. As a result, possible image defects, such as white spots, can be minimized in size. Furthermore, when the transfer image on the image receiving sheet is re-transferred to printing paper, etc., the image receiving layer is deformable in conformity with the surface roughness of the paper thereby to improve the transfer capabilities. The cushioning layer is also effective in controlling the glossiness of the re-transfer image and improving approximation to the final prints.

The cushioning layer, which easily deforms due to a stress applied to the image receiving layer, producing these effects is preferably formed of materials having a low elastic modulus, materials having rubbery elasticity or thermoplastic resins ready to soften on heating.

The cushioning layer preferably has an elastic modulus of 0.5 MPa to 1.0 GPa, particularly 1 MPa to 0.5 GPa, especially 10 to 100 MPa, at room temperature.

In order for the cushioning layer to have dust or debris sinking, the cushioning layer preferably has a penetration of 10 or more as measured according to JIS K2530 (25° C., 100 g, 5 seconds). The cushioning layer preferably has a glass transition temperature of 80° C. or lower, particularly 25° C. or lower, and a softening point of 50 to 200° C.

To control these physical properties, such as the Tg, a plasticizer may be added to the polymer binder forming the cushioning layer.

Binders making up the cushioning layer include rubbers, such as urethane rubber, butadiene rubber, nitrile rubber, acrylic rubber, and natural rubber, polyethylene, polypropylene, polyester, styrene-butadiene copolymers, ethylene-vinyl acetate copolymer, ethylene-acrylic copolymers, vinyl chloride-vinyl acetate copolymers, vinylidene chloride resins, vinyl chloride resins containing a plasticizer, polyamide resins, and phenol resins.

The thickness of the cushioning layer is usually from 3 to 100 μm, preferably from 10 to 52 μm, while varying depending on the kind of the resin and other conditions.

Although the image receiving layer and the cushioning layer must adhere to each other until completion of laser writing, the image receiving layer is preferably releasable when re-transferring the transfer image onto printing paper. To facilitate the release from the cushioning layer, a release layer having a thickness of about 0.1 to 2 μm can be provided between the cushioning layer and the image receiving layer. The thickness of the release layer, which can be adjusted by proper choice of the release layer, should be small so as not to impair the effects of the cushioning layer.

Binders used to form the release layer, if provided, include thermoplastic resins having a Tg of 65° C. or higher, such as polyolefins, polyester, polyvinyl acetal, polyvinyl formal, polyparabanic acid, polymethyl methacrylate, polycarbonate, ethyl cellulose, nitrocellulose, methyl cellulose, carboxymethyl cellulose, hydroxypropyl cellulose, polyvinyl alcohol, polyvinyl chloride, urethane resins, fluorine resins, polystyrene, acrylonitrile-styrene copolymers, crosslinking products of these resins, polyamide, polyimide, polyether-imide, polysulfone, polyether sulfone, and aramid; and hardened products thereof. Commonly employed hardening agents, such as isocyanate and melamine, can be used for hardening.

The physical properties described above taken into consideration, binders preferred for making the release layer are polycarbonate, acetal resins, and ethyl cellulose for their good storage stability. These binders are particularly suitable for releasing the image receiving layer comprising an acrylic resin binder.

A layer that extremely reduces in adhesion to the image receiving layer on cooling can serve as a release layer. Such a layer comprises hot-melt compounds, such as waxes, and thermoplastic resins (binders) as a main ingredient.

Useful hot-melt compounds are described in JP-A-63-193886. Preferred hot-melt compounds include microcrystalline wax, paraffin wax, and carnauba wax. Useful thermoplastic resins include ethylene copolymers, such as ethylene-vinyl acetate copolymers, and cellulosic resins.

If desired, the above-described release layer can contain such additives as higher fatty acids, higher alcohols, higher fatty acid esters, higher fatty acid amides, and higher aliphatic amines.

A layer that melts or softens on heating and undergoes cohesive failure also serves as a release layer. A super cooling material is preferably incorporated into a release layer of this kind.

Useful supercooling materials include poly-ϵ-caprolactone, polyoxyethylene, benzotriazole, tribenzylamine, and vanillin.

A layer containing a compound which reduces the adhesion to the image receiving layer is also useful as a release layer. Such compounds include silicone resins, e.g., silicone oil; fluorine resins, e.g., Teflon and fluorine-containing acrylic resins; polysiloxane resins; acetal resins, e.g., polyvinyl butyral, polyvinyl acetal, and polyvinyl formal; solid waxes, e.g., polyethylene wax and amide wax; and fluorine type or phosphoric ester type surface active agents.

The release layer is formed by applying a solution or an emulsion (latex) of the above-mentioned material in a solvent to the cushioning layer by various techniques, such as blade coating, roll coating, bar coating, curtain coating, gravure coating, hot-melt extrusion lamination, and the like. Alternatively, the solution or latex may be applied to a carrier film by the above-described application techniques to form a coating film, which is transferred to the cushioning layer.

In an embodiment of the image receiving sheet structure, the image receiving layer may also serve as a cushioning layer. In this embodiment, the image receiving sheet may have a layer structure of support/cushioning image receiving layer or a layer structure of support/undercoating layer/cushioning image receiving layer. In this embodiment, too, it is preferred for the cushioning image receiving layer be provided such that it is ready to be released and transferred to printing paper. In this case, the re-transfer image will have excellent gloss.

The cushioning image receiving layer usually has a thickness of from 5 to 100 μm, preferably from 10 to 40 μm.

It is advisable to provide a backcoating layer on the reverse side (opposite to the image receiving layer side) of the support to improve transport properties of the image receiving sheet. The improvement on film transport properties in a recording apparatus is ensured by adding to the backcoating layer an antistatic agent and/or a matting agent (e.g., silicon oxide or polymethyl methacrylate (PMMA) particles).

According to necessity, these additives may be added to not only the backcoating layer but other layers including the image receiving layer. The kind of the additive to be added depends on the purpose. Where, for example, a matting agent is needed, a matting agent having an average particle size of from 0.5 to 10 μm is added in an amount of about 0.5 to 80% based on the layer to which it is added. Where an antistatic agent is needed, an appropriate compound selected from various surface active agents and electrically conductive agents is added to reduce the surface resistivity of the layer to $10^{12}$ Ω or lower, preferably $10^{9}$ Ω or less, at 23° C. and 50% RH.

General-purpose polymers can be used as a binder of the backcoating layer, including gelatin, polyvinyl alcohol, methyl cellulose, nitrocellulose, cellulose acetate, aromatic polyamide resins, silicone resins, epoxy resins, alkyd resins, phenol resins, melamine resins, fluorine resins, polyimide resins, urethane resins, acrylic resins, urethane-modified silicone resins, polyethylene resins, polypropylene resins, polyester resins, Teflon resins, polyvinyl butyral resins, vinyl chloride resins, polyvinyl acetate, polycarbonate, organoboron compounds, aromatic esters, polyurethane fluoride, and polyether sulfone.

Among them crosslinkable water-soluble resins can be crosslinked to become a binder effective in preventing fall-off of matting agent particles, improving scratch resistance of the backcoating layer, and preventing blocking of image receiving sheets during storage.

The crosslinking of the crosslinkable water-soluble resins can be induced by at least one of heat, active light rays, and pressure. In some cases, an arbitrary adhesive layer may be provided between the support and the backcoating layer.

Organic or inorganic fine particles can be used as a matting agent added to the backcoating layer. Organic matting agents include particles of polymers obtained by radical polymerization, such as polymethyl methacrylate (PMMA), polystyrene, polyethylene, and polypropylene; and condensed polymers, such as polyester and polycarbonate.

The backcoating layer preferably has a coating weight of about 0.5 to 5 g/m$^2$. A coating film thinner than 0.5 g/m$^2$ is difficult to form stably and tends to allow matting agent particles to fall off. If the coating thickness largely exceeds 5 g/m$^2$, the matting agent present therein must have a considerably large particle size to exhibit its effect. Such large particles in the backcoating layer will imprint themselves on an adjacent image receiving layer in a roll form. It would follow that the transfer image on the image receiving layer may suffer from image deficiency or unevenness on account of the imprinted surface unevenness particularly where the image forming layer is very thin.

It is preferred for the matting agent used in the backcoating layer to have a number-average particle size greater than the thickness of the particle-free area of the backcoating layer by 2.5 to 20 μm. It is necessary that matting agent particles of 8 μm or greater is present in the backcoating layer in an amount of 5 mg/m$^2$ or more, particularly 6 to 600 mg/m$^2$, thereby to reduce troubles due to foreign matter. In order to prevent image defects attributed to extraordinary large particles and to obtain desired performance with a reduced amount of a matting agent, it is preferred to use a matting agent whose sizes are narrowly distributed with a coefficient of variation σ/rn (obtained by dividing a standard deviation of a distribution by a mean) of 0.3 or smaller, preferably 0.15 or smaller.

The backcoating layer preferably contains an antistatic agent to prevent foreign matter attraction due to triboelectricity. A wide range of known antistatic agents can be used, such as cationic, anionic or nonionic surface active agents, polymeric antistatics, electrically conductive particles, and those described in 11290 *no Kagaku Syohin*, Kagaku Kogyo Nipposha, 875–876.

Of these antistatic agents suitable for use in the backcoating layer are electrically conductive materials, such as carbon black, metal oxides, e.g., zinc oxide, titanium oxide, and tin oxide, and organic semiconductors. Electrically conductive fine particles are particularly preferred, for they do not separate from the backcoating layer to exert stable and environment-independent antistatic effects.

The backcoating layer can further contain various activators or release agents, such as silicone oil and fluorine resins, for improving coating capabilities or releasability.

It is especially advisable to provide the above-described backcoating layer where the cushioning layer and the image receiving layer have a softening point of 70° C. or lower measured by thermochemical analysis (hereinafter referred to as a TMA softening point).

The TMA softening point is obtained by observing the phase of a sample being heated at a given rate of temperature rise with a given load applied thereto. In the present invention, the temperature at which the phase of the sample begins to change is defined as a TMA softening point. Measurement of a TMA softening point can be made with, for example, Thermoflex supplied by Rigaku Denki-Sha.

In carrying out thermal transfer recording, each of the heat transfer sheets and the image receiving sheet are superposed on each other to prepare a laminate with the image forming layer of the former and the image receiving layer of the latter in contact.

From the viewpoint of achieving a high sensitivity, it is preferred for the image forming layer of each heat transfer sheet and the image receiving layer of the image receiving sheet to have a water contact angle of 7.0 to 120.0°, particularly 60° to 120°.

From the viewpoint of achieving a high sensitivity and a high resolution, it is preferable that the ratio of the optical density (OD) to the layer thickness (OD/layer thickness) of the image forming layer of each heat transfer sheet is 1.80 or higher and the water contact angle thereof is 86° C. or larger.

A laminate of the heat transfer sheet and the image receiving sheet can be prepared through various methods. For example, the two sheets superposed on each other in the above-described manner are passed through a pair of pressure and heat rollers. The heating temperature of the rollers is 160° C. or lower, preferably 130° C. or lower.

Another method of preparing the laminate is vacuum holding, which has previously been described. That is, the image receiving sheet is the first to be held by suction around a recording drum having a number of suction holes. The heat transfer sheet, which is designed to be slightly larger in size than the image receiving sheet, is then held on the image receiving sheet while the entrapped air is pressed out with a squeeze roller. Still another method of preparing the laminate comprises pulling the image receiving sheet to a recording drum, mechanically fixing the sheet onto the drum, and then fixing the heat transfer sheet thereon in the same manner as for the image receiving sheet. The vacuum holding method is especially advantageous in that temperature control (as required for heat rollers) is unnecessary, and uniform contact of the two sheets is accomplished quickly.

EXAMPLES

The present invention will now be illustrated in greater detail with reference to Examples, but it should be understood that the invention is not deemed to be limited thereto. Unless otherwise noted, all the parts and percents are by mass.

Examples 1 to 3, 11, 12, 21 and 22 relate to the first embodiment of the present invention, while Examples 31 and 32 relate to the second embodiment of the present invention.

Examples 1-1 to 1-3, Comparative Example 1-1

Formation of Heat Transfer Sheet K (Black)

[Formation of Backcoating Layer]

| [Preparation of liquid coating composition for 1st backcoating layer] | |
|---|---|
| Aqueous dispersion of acrylic resin (Jurymer ET410, available from Nihon Junyaku Co., Ltd.; solid content: 20%) | 2 parts |
| Antistatic agent (aqueous dispersion of tin oxide-antimony oxide; average particle size: 0.1 μm; solid content: 17%) | 7.0 parts |
| Polyoxyethylene phenyl ether | 0.1 part |
| Melamine compound (Sumitex Resin M-3, from Sumitomo Chemical Co., Ltd.) | 0.3 part |
| Distilled water | to make 100 parts |

[Formation of 1st Backcoating Layer]

A biaxially stretched polyethylene terephthalate film having a thickness of 75 μm and an Ra of 0.01 μm on both sides was subjected to corona discharge treatment on one side. The liquid coating composition for 1st back coating layer was applied to the corona discharge treated side of the support to a dry thickness of 0.03 μm and dried at 180° C. for 30 seconds to form a first backcoating layer. The support used had a Young's modulus of 450 $kg/mm^2$ (≈4.4 GPa) in the machine direction and of 500 $kg/mm^2$ (≈4.9 GPa) in the transverse direction; an F-5 value of 10 $kg/mm^2$ (≈98 MPa) in the machine direction and of 13 $kg/mm^2$ (≈127.4 MPa) in the transverse direction; a thermal shrinkage percentage of 0.3% in the machine direction and of 0.1% in the transverse direction both after heating at 100° C. for 30 minutes; a breaking strength of 20 $kg/mm^2$ (≈196 MPa) in the machine direction and of 25 $kg/mm^2$ (≈245 MPa) in the transverse direction; and an elastic modulus at 20° C. of 400 $kg/mm^2$ (≈3.9 GPa).

| [Preparation of liquid coating composition for 2nd backcoating layer] | |
|---|---|
| Polyolefin (Chemipearl S-120, available from Mitsui Chemicals, Inc.; solid content: 27%) | 3.0 parts |
| Antistatic agent (aqueous dispersion of tin oxide-antimony oxide; average particle size: 0.1 μm; solid content: 17%) | 2.0 parts |
| Colloidal silica (Snowtex C, available from Nissan Chemical Industries, Ltd.; solid content: 20%) | 2.0 parts |
| Epoxy compound (Denacol EX-614B, from Nagase Chemical Co., Ltd.) | 0.3 part |
| Distilled water | To make 100 parts |

[Formation of 2nd Backcoating Layer]

The liquid coating composition for 2nd backcoating layer was applied to the first backcoating layer to a dry thickness of 0.03 μm and dried at 170° C. for 30 seconds to form a second backcoating layer.

[Formation of Light-heat Conversion Layer]

[Preparation of Liquid Coating Composition for Light-heat Conversion Layer]

The components shown below were mixed while agitating with a stirrer to prepare a liquid coating composition for light-heat conversion layer.

| [Formulation of liquid coating composition for light-heat conversion layer] | |
|---|---|
| Infrared absorbing dye listed in Table 1 | 7.6 parts |
| Polyamide-imide listed in Table 1 | 29.3 parts |
| Exxon Naphtha | 5.8 parts |
| N-Methylpyrrolidone (NMP) | 1500 parts |
| Methyl ethyl ketone (MEK) | 360 parts |
| Fluorine type surface active agent (Magafac F-176PF, from Dainippon Ink & Chemicals, Inc.) | 0.5 part |
| Matting agent dispersion | 14.1 parts |

Preparation of Matting Agent Dispersion

A mixture of 10 parts of true spherical silica powder having an average particle size of 1.5 μm (Seahostar KE-P150, from Nippon Shokubai Co., Ltd.), 2 parts of an acrylic ester-styrene copolymer as a dispersant (Joncryl 611, from Johnson Polymer Co., Ltd.), 16 parts of MEK, and 64 parts of N-methylpyrrolidone was put in a 200 ml polyethylene container together with 30 parts of glass beads having a diameter of 2 mm. The mixture in the container was dispersed in a paint shaker supplied by Toyo Seiki Co., Ltd. for 2 hours to prepare a matting agent dispersion. [Formation of Light-heat Conversion Layer on Support Surface]

The resulting liquid coating composition was applied to the other side of the polyethylene terephthalate film (support) having the first and second backcoating layers with a wire bar and dried in an oven at 120° C. for 2 minutes to form a light-heat conversion layer. The light-heat conversion layer had an optical density (OD) of 1.03 at 808 nm as measured with a UV spectrophotometer UV-240supplied by Shimadzu Corp. A cut area of the light-heat conversion layer was observed under a scanning electron microscope (SEM) to find that the average layer thickness was 0.3 μm.

[Formation of Image Forming Layer]

[Preparation of Liquid Coating Composition for Black Image Forming Layer]

The components of each of formulations 1 and 2 shown below were put in a kneader and preliminarily dispersed with shear while adding a small amount of the solvent shown. The rest of the solvent was added to the dispersion, followed by further dispersing in a sand mill for 2 hours to prepare black pigment dispersions 1 and 2, respectively.

| [Formulation of black pigment dispersion] | |
|---|---|
| Formulation 1: | |
| Polyvinyl butyral (S-LEC B BL-SH, available from Sekisui Chemical Co., Ltd.) | 12.6 parts |
| Pigment Black 7 (Carbon Black C.I. No. 77266) (Mitsubishi Carbon Black #5, available from Mitsubishi Chemical Corp.; PVC blackness: 1) | 4.5 parts |
| Dispersant (Solsperse S-20000, from ICI) | 0.8 part |
| n-Propyl alcohol | 79.4 parts |
| Formulation 2: | |
| Polyvinyl butyral (S-LEC B BL-SH, available from Sekisui Chemical Co., Ltd.) | 12.6 parts |
| Pigment Black 7 (Carbon Black C.I. No. 77266) (Mitsubishi Carbon Black MA100; PVC blackness: 10) | 10.5 parts |
| Dispersant (Solsperse S-20000, from ICI) | 0.8 part |
| n-Propyl alcohol | 79.4 parts |

The components shown below were mixed while agitating with a stirrer to prepare a liquid coating composition for black image forming layer.

| [Formulation of liquid coating composition for black image forming layer] | |
|---|---|
| Black pigment dispersion black pigment dispersion 1:black pigment dispersion 2 = 70:30 by part | 185.7 parts |
| Polyvinyl butyral (S-LEC B BL-SH, available from Sekisui Chemical Co., Ltd.) | 11.9 parts |
| Waxes: | |
| Stearamide (Newtron-2, from Nippon Fine Chemical Co., Ltd.) | 1.7 parts |

-continued

| [Formulation of liquid coating composition for black image forming layer] | |
|---|---|
| Behenic acid amide (Diamide BM, from Nippon Kasei Chemical Co., Ltd.) | 1.7 parts |
| Lauramide (Diamide Y, from Nippon Kasei Chemical Co., Ltd.) | 1.7 parts |
| Palmitamide (Diamide KP, from Nippon Kasei Chemical Co., Ltd.) | 1.7 parts |
| Erucamide (Diamide L-200, from Nippon Kasei Chemical Co., Ltd.) | 1.7 parts |
| Oleamide (Diamide O-200, from Nippon Kasei Chemical Co., Ltd.) | 1.7 parts |
| Rosin (KE-311, from Arakawa Chemical Industries, Ltd.; resin acid content: 80 to 97% (composed of abietic acid 30 to 40%, neoabietic acid 10 to 20%, dihydroabietic acid 14%, and tetrahydroabietic acid 14%)) | 11.4 parts |
| Surface active agent (Megafac F-176PF, from Dainippon Ink & Chemicals Inc.; solid content: 20%) | 2.1 parts |
| Inorganic pigment (MEK-K, 30% MEK solution available from Nissan Chemical Industries, Ltd.) | 7.1 parts |
| n-Propyl alcohol | 1050 parts |
| Methyl ethyl ketone | 295 parts |

The particle size distribution of the resulting coating composition for black image forming layer was measured with a laser scattering particle size distribution analyzer. As a result, the average particle size was 0.25 μm, and the proportion of particles of 1 μm or greater was 0.5%.

[Formation of Black Image Forming Layer on Light-heat Conversion Layer Surface]

The above-described liquid coating solution for black image forming layer was applied on the surface of the above-described light-heat conversion layer with a wire bar for 1 minute and then dried in an oven at 100° C. for 2 minutes. Thus, a black image forming layer was formed on the light-heat conversion layer. By the above-described procedure, a heat transfer sheet having a light-heat conversion layer and a black image forming layer formed on a support in this order (hereinafter referred to as the heat transfer sheet K; hereinafter those having a yellow image forming layer, a magenta image forming layer and a cyan image forming layer will be referred as respectively to the heat transfer sheet Y, the heat transfer sheet M and the heat transfer sheet C) was constructed.

The optical density (OD) of the heat transfer sheet K measured with Macbeth Densitomether Model TD-904 (W-filter) was 0.91. The layer thickness of the black image forming layer was 0.60 μm on average.

The physical properties of the image forming layer thus obtained were as follows.

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 9.3 mmHg (≈1.24 kPa) in practice.

The coefficient of static friction of the image receiving layer, which is preferably of 0.2 or smaller, was 0.08 in practice.

The surface energy was 29 mJ/m$^2$. The water contact angle was 94.8°. The reflective optical density was 1.82 while the layer thickness was 0.60 μm. The OD/layer thickness was 3.03.

When recorded with laser light of light intensity on the exposed face of 1000 W/mm$^2$ or higher and at a line speed of 1 m/sec or higher, the deformation percentage of the light-heat conversion layer was 168%.

Preparation of Heat Transfer Sheet Y

A heat transfer sheet Y was prepared in the same manner as for the heat transfer sheet K as described above, except for replacing the liquid coating composition for black image forming layer by a liquid coating composition for yellow image forming layer prepared according to the following formulation. The thickness of the yellow image forming layer of the heat transfer sheet Y was 0.42 μm.

| | |
|---|---|
| [Formulation of yellow pigment dispersion matrix] | |
| Formulation of yellow pigment dispersion 1: | |
| Polyvinyl butyral (S-LEC B BL-SH, from Sekisui Chemical Co., Ltd.) | 7.1 parts |
| Pigment Yellow 180 (C.I. No. 21290) (Novoperm Yellow P-HG, from Clariant (Japan) KK) | 12.9 parts |
| Pigment dispersant (Solsperse S-20000, from ICI) | 0.6 part |
| n-Propyl alcohol | 79.4 parts |
| [Formulation of yellow pigment dispersion matrix] | |
| Formulation of yellow pigment dispersion 2: | |
| Polyvinyl butyral (S-LEC B BL-SH, from Sekisui Chemical Co., Ltd.) | 7.1 parts |
| Pigment Yellow 139 (C.I. No. 56298) (Novoperm Yellow M2R 70, from Clariant (Japan) KK) | 12.9 parts |
| Pigment dispersant (Solsperse S-20000, from ICI) | 0.6 parts |
| n-Propyl alcohol | 79.4 parts |
| [Liquid coating composition for yellow image forming layer] | |
| Yellow pigment dispersion matrix described above Yellow pigment dispersion 1:yellow pigment dispersion 2 = 95:5 (by part) | 126 parts |
| Polyvinyl butyral (S-LEC B BL-SH, available from Sekisui Chemical Co., Ltd.) | 4.6 parts |
| Waxes: | |
| (Stearamide (Newtron-2), from Nippon Fine Chemical Co., Ltd.) | 0.7 part |
| (Behenic acid amide (Diamide BM), from Nippon Kasei Chemical Co., Ltd.) | 0.7 part |
| (Lauramide (Diamide Y), from Nippon Kasei Chemical Co., Ltd.) | 0.7 part |
| (Palmitamide (Daimide KP), from Nippon Kasei Chemical Co., Ltd.) | 0.7 part |
| (Erucamide (Diamide L-200), from Nippon Kasei Chemical Co., Ltd.) | 0.7 part |

-continued

| | |
|---|---|
| (Oleamide (Diamide O-200), from Nippon Kasei Chemical Co., Ltd.) | 0.7 part |
| Nonionic surface active agent (Chemistat 1100, from Sanyo Chemical Industries, Ltd.) | 0.4 part |
| Rosin (KE-311, from Arakawa Chemical Industries, Ltd.) | 2.4 parts |
| Surface active agent (Magafac F-176PF, from Dainippon Ink & Chemicals, Inc.; solid content: 20%) | 0.8 part |
| n-Propyl alcohol | 793 parts |
| Methyl ethyl ketone | 198 parts |

The physical properties of the image forming layer thus obtained were as follows.

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 2.3 mmHg (≈0.31 kPa) in practice.

The coefficient of static friction of the image receiving layer, which is preferably of 0.2 or smaller, was 0.1 in practice.

The surface energy was 24 mJ/m$^2$. The water contact angle was 108.1°. The reflective optical density was 1.01 while the layer thickness was 0.42 μm. The OD/layer thickness was 2.40.

When recorded with laser light of light intensity on the exposed face of 1000 W/mm$^2$ or higher and at a line speed of 1 m/sec or higher, the deformation percentage of the light-heat conversion layer was 150%.

Preparation of Heat Transfer Sheet M

A heat transfer sheet M was prepared in the same manner as for the heat transfer sheet K as described above, except for replacing the liquid coating composition for black image forming layer by a liquid coating composition for magenta image forming layer prepared according to the following formulation. The thickness of the magenta image forming layer of the heat transfer sheet M was 0.38 μm.

| | |
|---|---|
| [Formulation of magenta pigment dispersion matrix] | |
| Formulation of magenta pigment dispersion 1: | |
| Polyvinyl butyral (Denka Butyral #2000-L, available from Denki Kagaku Kogyo KK; Vicat softening point: 57° C.) | 12.6 parts |
| Pigment Red 57:1 (C.I. No. 15850:1) (Symuler Brilliant Carmine 6B-229, from Dainippon Ink & Chemicals Inc.) | 15.0 parts |
| Pigment dispersant (Solsperse S-20000, from ICI) | 0.6 part |
| n-Propyl alcohol | 80.4 parts |
| [Formulation of magenta pigment dispersion matrix] | |
| Formulation of magenta pigment dispersion 2: | |
| Polyvinyl butyral (Denka Butyral #2000-L, available from Denki Kagaku Kogyo KK; Vicat softening point: 57° C.) | 12.6 parts |

-continued

| | |
|---|---|
| Pigment Red 57:1 (C.I. No. 15850:1) (Lionol Red 6B-4290G, from Toyo Ink Mgf. Co., Ltd.) | 15.0 parts |
| Pigment dispersant (Solsperse S-20000, from ICI) | 0.6 part |
| n-Propyl alcohol | 79.4 parts |
| [Formulation of Liquid coating composition for magenta image forming layer] | |
| Magenta pigment dispersion described above magenta pigment dispersion 1:magenta pigment dispersion 2 = 95:5 by part | 163 parts |
| Polyvinyl butyral (Denka Butyral #2000-L, available from Denki Kagaku Kogyo KK; Vicat softening point: 57° C.) | 4.0 parts |
| Waxes: | |
| (Stearamide (Newtron-2), from Nippon Fine Chemical Co., Ltd.) | 1.0 part |
| (Behenic acid amide (Diamide) BM, from Nippon Kasei Chemical Co., Ltd.) | 2.0 parts |
| (Palmitamide (Daimide) KP, from Nippon Kasei Chemical Co., Ltd.) | 1.0 part |
| (Erucamide (Diamide L-200), from Nippon Kasei Chemical Co., Ltd.) | 1.0 part |
| (Oleamide (Damide O-200), from Nippon Kasei Chemical Co., Ltd.) | 1.0 part |
| Nonionic surface active agent (Chemistat 1100, from Sanyo Chemical Industries, Ltd.) | 0.7 part |
| Rosin (KE-311, from Arakawa Chemical Industries, Ltd) | 4.6 parts |
| Pentaerythritol tetraacrylate (NK Ester A-TMMT, from Shin-Nakamura Chemical Co., Ltd.) | 2.5 parts |
| Surface active agent (Megafac F-176PF, from Dainippon Ink & Chemicals Inc.; solid content: 20%) | 1.3 part |
| n-Propyl alcohol | 848 parts |
| Methyl ethyl ketone | 246 parts |

The physical properties of the image forming layer thus obtained were as follows.

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 3.5 mmHg (≈0.47 kPa) in practice.

The coefficient of static friction of the image receiving layer, which is preferably of 0.2 or smaller, was 0.08 in practice.

The surface energy was 25 mJ/m$^2$. The water contact angle was 98.8°. The reflective optical density was 1.51 while the layer thickness was 0.38 μm. The OD/layer thickness was 3.97.

When recorded with laser light of light intensity on the exposed face of 1000 W/mm$^2$ or higher and at a line speed of 1 m/sec or higher, the deformation percentage of the light-heat conversion layer was 160%.

Preparation of Heat Transfer Sheet C

A heat transfer sheet C was prepared in the same manner as for the heat transfer sheet K as described above, except for replacing the liquid coating composition for black image forming layer by a liquid coating composition for cyan image forming layer prepared according to the following formulation. The thickness of the cyan image forming layer of the heat transfer sheet M was 0.45 μm.

| | |
|---|---|
| [Formulation of cyan pigment dispersion matrix] Formulation of cyan pigment dispersion 1: | |
| Polyvinyl butyral (S-LEC B BL-SH, available from Sekisui Chemical Co., Ltd.) | 12.6 parts |
| Pigment Blue 15:4 (C.I. No. 74160) (Cyanine Blue 700-10FG, from Toyo Ink Mfg. Co., Ltd.) | 15.0 parts |
| Pigment dispersant (PW-36, from Kusumoto Chemicals Ltd.) | 0.8 part |
| n-Propyl alcohol | 110 parts |
| [Formulation of cyan pigment dispersion matrix] Formulation of cyan pigment dispersion 2: | |
| Polyvinyl butyral (S-LEC B BL-SH, available from Sekisui Chemical Co., Ltd.) | 12.6 parts |
| Pigment Blue 15 (C.I. No. 74160) (Lionol Blue 7027, from Toyo Ink Mgf. Co., Ltd.) | 15.0 parts |
| Pigment dispersant (PW-36, from Kusumoto Chemicals Ltd.) | 0.8 part |
| n-Propyl alcohol | 110 parts |
| [Formulation of liquid coating composition for cyan image forming layer] | |
| Cyan pigment dispersion described above cyan pigment dispersion 1:cyan pigment dispersion 2 = 90:10 by part | 118 parts |
| Polyvinyl butyral (S-LEC B BL-SH, available from Sekisui Chemical Co., Ltd.) | 5.2 parts |
| Inorganic pigment MEK-ST | 1.3 part |
| Waxes: | |
| (Stearamide (Newtron-2), from Nippon Fine Chemical Co., Ltd.) | 1.0 part |
| (Behenic acid amide (Diamide BM), from Nippon Kasei Chemical Co., Ltd.) | 1.0 part |
| (Lauramide (Diamide Y), from Nippon Kasei Chemical Co., Ltd.) | 1.0 part |
| (Palmitamide (Daimide KP), from Nippon Kasei Chemical Co., Ltd.) | 1.0 part |
| (Erucamide (Diamide L-200), from Nippon Kasei Chemical Co., Ltd.) | 1.0 part |
| (Oleamide (Damide O-200), from Nippon Kasei Chemical Co., Ltd.) | 1.0 part |
| Rosin (KE-311, from Arakawa Chemical Industries, Ltd.) | 2.8 parts |
| Pentaerythritol tetraacrylate (NK Ester A-TMMT, from Shin-Nakamura Chemical Co., Ltd.) | 1.7 parts |
| Surface active agent (Megafac F-176PF, from Dainippon Ink & Chemicals Inc.; solid content: 20%) | 1.7 parts |

-continued

| | |
|---|---|
| n-Propyl alcohol | 890 parts |
| Methyl ethyl ketone | 247 parts |

The physical properties of the image forming layer thus obtained were as follows.

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 7.0 mmHg (≈0 .93 kPa) in practice.

The coefficient of static friction of the image receiving layer, which is preferably of 0.2 or smaller, was 0.08 in practice.

The surface energy was 25 $mJ/m^2$. The water contact angle was 98.8°. The reflective optical density was 1.59 while the layer thickness was 0.45 μm. The OD/layer thickness was 3.03.

When recorded with laser light of light intensity on the exposed face of 1000 $W/mm^2$ or higher and at a line speed of 1 m/sec or higher, the deformation percentage of the light-heat conversion layer was 165%.

Preparation of Image Receiving Sheet

A liquid coating composition for cushioning layer and a liquid coating composition for image receiving layer were prepared according to the following formulations.

| [Formulation of liquid coating composition for cushioning layer] | |
|---|---|
| Vinyl chloride-vinyl acetate copolymer (main binder) (MPR-TSL, available from Nisshin Chemical Industry Co., Ltd.) | 20 parts |
| Plasticizer (Paraplex G-40, available from The C.P. Hall Co.) | 10 parts |
| Fluorine-type surface active agent (coating aid) (Megafac F-177, available from Dainippon Ink & Chemicals, Inc.) | 0.5 part |
| Antistatic agent (SAT-5 Supper (IC), quaternary ammonium salt available from Nihon Jynyaku Co., Ltd.) | 0.3 part |
| Methyl ethyl ketone | 60 parts |
| Toluene | 10 parts |
| N,N-Dimethylformamide | 3 parts |
| **[Formulation of liquid coating composition for image receiving layer]** | |
| Polyvinyl butyral (S-LEC B BL-SH, available from Sekisui Chemical Co., Ltd.) | 8 parts |
| Antistatic agent (Sanstat 2012A, available from Sanyo Chemical Industries, Ltd.) | 0.7 part |
| Surface active agent (Megafac F-177, from Dainippon Ink & Chemicals Inc.) | 0.1 part |
| n-Propyl alcohol | 20 parts |
| Methanol | 20 parts |
| 1-Methoxy-2-propanol | 50 parts |

The liquid coating composition for cushioning layer as described above was applied to a white PETP (polyethylene terephthalate) support having a thickness of 130 μm (Lumirror #130E58, available from Toray Industries, Inc.) with a small-width applicator and dried. Next, the liquid coating composition for image receiving layer was applied and dried to give an image receiving sheet. The coating amounts were controlled so as to give the cushion layer had a dry thickness of about 20 μm and the image receiving layer had a thickness of about 2 μm. The white PETP support used as a support is a void-containing PETP layer (thickness: 116 μm; void: 20%) laminated on both sides thereof with a titanium oxide-containing PETP layer (thickness: 7 μm; titanium oxide content: 2%) (total thickness: 130 μm; specific gravity: 0.8). Each of the thus prepared materials was wound into a roll and stored at room temperature for one week before using in image formation with laser light.

The physical properties of the obtained image receiving layer were as follows.

The surface roughness, which is preferably of from 0.4 to 0.01 μm, was 0.02 μm in practice.

The winding of the image receiving layer surface, which is preferably 2 μm or less, was 1.2 μm in practice.

The smooster value of the image forming layer, which is preferably 0.5 to 50 mmHg (≈0.0665 to 6.65 kPa) at 23° C. and 55% RH, was 0.8 mmHg (≈0.11 kPa) in practice.

The coefficient of static friction of the image receiving layer, which is preferably of 0.8 or smaller, was 0.37 in practice.

The surface energy was 29 $mJ/m^2$. The water contact angle was 87.0°.

Formation of Transfer Image

Using Luxel FINALPROOF 5600 supplied by Fuji Photo Film Co., Ltd. shown in FIG. 4 as an image formation system, a transfer image onto printing paper was obtained in accordance with the image formation sequence of the above system and the printing paper transfer method of the system.

The image receiving sheet (56 cm×79 cm) formed above was wound by suction around a recording drum having a diameter of 38 cm through suction holes of 1 mm in diameter of the drum (one hole per 3 cm by 8 cm area). Next, the above-described heat transfer sheet K (black) cut into a size of 61 cm×84 cm was superposed on the image receiving sheet with its four edges extending evenly from the edges of the image receiving sheet while being squeezed with a squeeze roller so that the two sheets were brought into intimate contact while allowing entrapped air to escape and be sucked. The degree of vacuum of the drum, measured with the suction holes closed, was (atmospheric pressure minus 150) mmHg (≈81.13 kPa). The above-described drum was rotated, and the laminate was scanned with semiconductor laser light having a wavelength of 808 nm and a spot diameter of 7 μm on the surface of the light-heat conversion layer, the laser being moving in a direction (sub scan direction) perpendicular to the drum rotating direction (main scan direction) to carry out recording of a laser image (scanning). The laser irradiation was carried out under the following conditions. The laser beams employed were multi beams arranged in a two-dimensional parallelogram consisting of five lines of laser beams arrayed in the main scan direction and three rows of laser beams arrayed in the sub scan direction.

Laser power: 110 mW

Drum rotation: 500 rpm

Sub scanning pitch: 6.35 μm

Environment: 3 conditions including: (1) 18° C., 30% RH;

(2) 23° C., 50% RH; (3) 26° C., 65% RH

The exposure drum preferably has a diameter of 360 mm or longer and a drum of 380 mm in diameter was employed in practice.

The recorded image size was 515 mm×728 mm, and the resolution was 2600 dpi.

After completion of laser recording, the laminate was removed from the drum, and the heat transfer sheet K was stripped by hand off the image receiving sheet. As a result, it was confirmed that the irradiated areas of the image forming layer of the heat transfer sheet K had been exclusively transferred from the heat transfer sheet K to the image receiving sheet.

In the same manner as described above, images were transferred from the above-described heat transfer sheet Y, heat transfer sheet M and heat transfer sheet C to the image receiving sheets. The four-color images thus transferred were re-transferred onto printing paper to form a multicolor image. Thus, multicolor images, which showed excellent image qualities and stable transfer densities, could be obtained by high-energy recording with laser light comprising two-dimensionally arranged multibeams under different temperature/humidity conditions.

Transfer to printing paper was performed by using a heat transfer apparatus provided with an insertion table made of a material having a dynamic frictional coefficient against a polyethylene terephthalate of from 0.1 to 0.7. The transporting speed was 15 to 50 mm/sec. The heat rolls were made of a material having a Vickers hardness of 70 (a preferred Vickers hardness of the material is 10 to 100).

The obtained images were retained in favorable state at the three environmental temperatures/humidities.

Heat transfer sheets with the above system configuration were evaluated as follows.

Stability With Time of Liquid Coating Composition for the Light-heat Conversion Layer:

Each liquid coating composition was allowed to stand for 7 days and absorbances before and after storage were compared (expressed in %). (The liquid coating composition was diluted 100-fold and the absorbance was measured at 808 nm.)

Sensitivity of Heat Transfer Sheet:

Under an optical microscope, the recorded line width d in a transfer image having a line pattern in the laser-irradiated area was measured. Then the sensitivity was determined in accordance with the following formula.

$$\text{Sensitivity (mJ/cm}^2\text{)}=\text{(laser power)/(line width d}\times\text{rotation speed of drum)}$$

Light Resistance (Change in Color Hue) of Heat Transfer Sheet:

Using the heat transfer sheet C, an image was formed by irradiating with laser beams at 23° C. and 50% RH. After re-transferring the image from the image receiving sheet to a printing paper, the sample image was exposed to a fluorescent lamp at 1000 Lux for 48 hours. The color hue was measured before and after the exposure and the color difference was calculated. The color hue was determined by measuring L*a*b* values with the use of X-rite 938 available form X-rite.

Cohesive Energy of Light-heat Conversion Layer

The cohesive energy was expressed in the SP value of the binder. The SP value was calculated in accordance with Okitsu's method.

Table 1 summarizes the results.

TABLE 1

| | Infrared absorbing colorant | Binder resin | Stability with time | Sensitivity | Light-resistance | Cohesive energy density (SP) |
|---|---|---|---|---|---|---|
| Ex. 1-1 | NK-2014 | (6) | 97% | 405 mJ/cm$^2$ | 3.10 | 30.5 |
| Ex. 1-2 | I-17 | (6) | 99% | 323 mJ/cm$^2$ | 1.05 | 30.5 |
| Ex. 1-3 | I-17 | (11) | 98% | 375 mJ/cm$^2$ | 1.75 | 30.1 |
| C. Ex. 1-1 | NK-2014 | Vylon 296 (TOYOBO) | 93% | 545 mJ/cm$^2$ | 9.40 | 21.7 |

In Table 1, the numbers of binder resins correspond respectively to the numbers of linking group R in the general formula (I) as cited above. The polyamide-imide resin employed in Examples 1-1 and 1-2 are Vylomax HR-11NN (available from TOYOBO) having a mass-average molecular weight of 15,000. NK2014 (available from Nippon Kanko Shikiso)

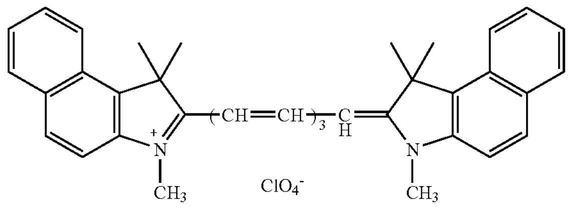

The results given in Table 1 clearly indicate that the liquid coating compositions for light-heat conversion layer with the use of polyamide-imides in light heat conversion layer are excellent in stability with time and the heat transfer sheets formed from these liquid coating compositions are excellent in sensitivity and light resistance.

Examples 2-1 to 2-2 and Comparative Example 2-1

Preparation of Heat Transfer Sheet K (Black)

[Formation of Backcoating Layer]

| [Preparation of liquid coating solution for first backcoating layer] | |
|---|---|
| Aqueous dispersion of acrylic resin (Jurymer ET410, available from Nihon Junyaku Co., Ltd.; solid content: 20%) | 2 parts |

-continued

| [Preparation of liquid coating solution for first backcoating layer] | |
|---|---|
| Antistatic agent (aqueous dispersion of tin oxide-antimony oxide; average particle size: 0.1 μm; solid content: 17% by mass) | 7.0 parts |
| Polyoxyethylene phenyl ether | 0.1 part |
| Melamine compound (Sumitex Resin M-3, from Sumitomo Chemical Co., Ltd.) | 0.3 part |
| Distilled water | to make 100 parts |

[Formation of First Backcoating Layer]

A biaxially stretched polyethylene terephthalate (PETP) support (Ra of 0.01 μm on both sides) having a thickness of 75 μm was subjected to corona discharge treatment on one side (the back face). The liquid coating composition for first backcoating layer was applied to the corona discharge treated side of the support to a dry thickness of 0.03 μm and dried at 180° C. for 30 seconds to form a first backcoating layer. The support used had a Young's modulus of 450 $kg/mm^2$ (≈4.4 GPa) in the machine direction and of 500 $kg/mm^2$ (≈4.9 GPa) in the transverse direction, an F-5 value of 10 $kg/mm^2$ (≈98 MPa) in the machine direction and of 13 $kg/mm^2$ (≈127.4 MPa) in the transverse direction; a thermal shrinkage percentage of 0.3% in the MD and of 0.1% in the TD both after heating at 100° C. for 30 minutes; a breaking strength of 20 $kg/mm^2$ (≈196 MPa) in the machine direction and of 25 $kg/mm^2$ (≈245 MPa) in the transverse direction; and an elastic modulus at 20° C. of 400 $kg/mm^2$ (≈3.9 GPa).

| [Preparation of liquid coating solution for second backcoating layer] | |
|---|---|
| Polyolefin (Chemipearl S-120, available from Mitsui Chemicals, Inc.; solid content: 27%) | 3.0 parts |
| Antistatic agent (aqueous dispersion of tin oxide-antimony oxide; average particle size: 0.1 μm; solid content: 17%) | 2.0 parts |
| Colloidal silica (Snowtex C, available from Nissan Chemical Industries, Ltd.; solid content: 20%) | 2.0 parts |
| Epoxy compound (Denacol EX-614B, from Nagase Chemical Co., Ltd.) | 0.3 part |
| Distilled water | To make 100 parts |

[Formation of Second Backcoating Layer]

The liquid coating composition for second backcoating layer was applied to the first backcoating layer to a dry thickness of 0.03 μm and dried at 170° C. for 30 seconds to form a second backcoating layer.

[Formation of Light-heat Conversion Layer]

[Preparation of Liquid Coating Composition for Light-heat Conversion Layer]

The components shown below were mixed while agitating with a stirrer to prepare a liquid coating composition for light-heat conversion layer.

| [Formulation of liquid coating composition for light-heat conversion layer] | |
|---|---|
| Infrared absorbing colorant (light-heat conversion colorant) listed in Table 2 | 7.6 parts |
| Binder listed in Table 2 | 29.3 parts |
| Exxon Naphtha | 5.8 parts |
| N-Methylpyrrolidone (NMP) | 1500 parts |
| Methyl ethyl ketone | 360 parts |
| Fluorine type surface active agent (Magafac F-176PF, from Dainippon Ink & Chemicals, Inc.) | 0.5 part |
| Matting agent dispersion of the following composition | 14.1 parts |

[Formulation of Matting Agent Dispersion]

A mixture of 10 parts of true spherical silica powder having an average particle size of 1.5 μm (Seahostar KE-P150, from Nippon Shokubai Co., Ltd.), 2 parts of an acrylic ester-styrene copolymer as a dispersant (Joncryl 611, from Johnson Polymer Co., Ltd.), 16 parts of methyl ethyl ketone, and 64 parts of N-methylpyrrolidone was put in a 200 ml polyethylene container together with 30 parts of glass beads having a diameter of 2 mm. The mixture in the container was dispersed in a paint shaker supplied by Toyo Seiki Co., Ltd. for 2 hours to prepare a matting agent dispersion.

[Formation of Light-heat Conversion Layer on Support Surface]

The above-described liquid coating composition for light-heat conversion layer was applied to the other side of the PETP support having a thickness of 75 μm with a wire bar and dried in an oven at 120° C. for 2 minutes to form a light-heat conversion layer on the support. The light-heat conversion layer had an optical density (OD) of 1.03 at 808 nm as measured with a UV spectrophotometer UV-240 supplied by Shimadzu Corp. A cut area of the light-heat conversion layer was observed under a scanning electron microscope to find that the average layer thickness was 0.3 μm. Thus, the (OD/layer thickness) of the light-heat conversion layer was 3.43.

[Formation of Image Forming Layer]

[Preparation of Liquid Coating Composition for Black Image Forming Layer]

The following components were put in a kneader mill and preliminarily dispersed with shear while adding a small amount of the solvent shown. The rest of the solvent was added to the dispersion, followed by further dispersing in a sand mill for 2 hours to prepare a pigment dispersion matrix.

| [Preparation of black pigment dispersion matrix] | |
|---|---|
| Formulation 1 | |
| Polyvinyl butyral (S-LEC B BL-SH, available from Sekisui Chemical Co., Ltd.) | 12.6 parts |
| Pigment Black 7 (Carbon Black C.I. No. 77266) (Mitsubishi Carbon Black #5, available from Mitsubishi Chemical Corp.; PVC blackness: 1) | 4.5 parts |

-continued

| [Preparation of black pigment dispersion matrix] | |
|---|---|
| Dispersant (Solsperse S-20000, from ICI) | 0.8 part |
| n-Propyl alcohol | 79.4 parts |
| Formulation 2 | |
| Polyvinyl butyral (S-LEC B BL-SH, available from Sekisui Chemical Co., Ltd.) | 12.6 parts |
| Pigment Black 7 (Carbon Black C.I. No. 77266) (Mitsubishi Carbon Black MA100; PVC blackness: 10) | 10.5 parts |
| Dispersant (Solsperse S-20000, from ICI) | 0.8 part |
| n-Propyl alcohol | 79.4 parts |

The components shown below were mixed while agitating with a stirrer to prepare a liquid coating composition for black image forming layer.

| [Formulation of liquid coating composition for black image forming layer] | |
|---|---|
| Black pigment dispersion described above dispersion 1:dispersion 2 = 70:30 by part | 185.7 parts |
| Polyvinyl butyral (S-LEC B BL-SH, available from Sekisui Chemical Co., Ltd.) | 11.9 parts |
| Waxes: | |
| (Stearamide (Newtron-2), from Nippon Fine Chemical Co., Ltd.) | 1.7 parts |
| (Behenic acid amide (Diamide BM), from Nippon Kasei Chemical Co., Ltd.) | 1.7 parts |
| (Lauramide (Diamide Y), from Nippon Kasei Chemical Co., Ltd.) | 1.7 parts |
| (Palmitamide (Diamide KP), from Nippon Kasei Chemical Co., Ltd.) | 1.7 parts |
| (Erucamide (Diamide L-200), from Nippon Kasei Chemical Co., Ltd.) | 1.7 parts |
| Oleamide (Diamide O-200, from Nippon Kasei Chemical Co., Ltd.) | 1.7 parts |
| Rosin (KE-311, from Arakawa Chemical Industries, Ltd.; resin acid composition: abietic acid 30 to 40%, neoabietic acid 10 to 20%, dihydroabietic acid 14%, and tetrahydroabietic acid 14%)) | 11.4 parts |
| Surface active agent (Megafac F-176PF, from Dainippon Ink & Chemicals Inc.) | 2.1 parts |
| Inorganic pigment (MEK-K, 30% MEK solution available from Nissan Chemical Industries, Ltd.) | 7.1 parts |
| n-Propyl alcohol | 1050 parts |
| Methyl ethyl ketone | 295 parts |

The particle size distribution of the resulting coating composition for black image forming layer was measured with a laser scattering particle size distribution analyzer. As a result, the average particle size was 0.25 μm, and the proportion of particles of 1 μm or greater was 0.5%.

[Formation of Black Image Forming Layer on Light-heat Conversion Layer Surface]

The above-described liquid coating solution for black image forming layer was applied on the surface of the above-described light-heat conversion layer with a wire bar for 1 minute and then dried in an oven at 100° C. for 2 minutes. Thus, a black image forming layer was formed on the light-heat conversion layer. By the above-described procedure, a heat transfer sheet having a light-heat conversion layer and a black image forming layer formed on a support in this order (hereinafter referred to as the heat transfer sheet K; hereinafter those having a yellow image forming layer, a magenta image forming layer and a cyan image forming layer will be referred as respectively to the heat transfer sheet Y, the heat transfer sheet M and the heat transfer sheet C) was constructed. The optical density (OD) of the heat transfer sheet K measured with Macbeth Densitomether Model TD-904 (W-filter) was 0.91. The layer thickness of the black image forming layer was 0.60 μm on average.

The physical properties of the image forming layer thus obtained were as follows.

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 9.3 mmHg (≈1.24 kPa) in practice.

The coefficient of static friction of the image receiving layer, which is preferably of 0.2 or smaller, was 0.08 in practice.

The surface energy was 29 mJ/$m^2$. The water contact angle was 94.8°. The reflective optical density was 1.82 while the layer thickness was 0.60 μm. The OD/layer thickness was 3.03.

Preparation of Heat Transfer Sheet Y

A heat transfer sheet Y was prepared in the same manner as for the heat transfer sheet K as described above, except for replacing the liquid coating composition for black image forming layer by a liquid coating composition for yellow image forming layer prepared according to the following formulation. The thickness of the yellow image forming layer of the heat transfer sheet Y was 0.42 μm.

| [Formulation of yellow pigment dispersion matrix] Formulation of yellow pigment dispersion 1: | |
|---|---|
| Polyvinyl butyral (S-LEC B BL-SH, from Sekisui Chemical Co., Ltd.) | 7.1 parts |
| Pigment Yellow 180 (C.I. No. 21290) (Novoperm Yellow P-HG, from Clariant (Japan) KK) | 12.9 parts |
| Pigment dispersant (Solsperse S-20000, from ICI) | 0.6 part |
| n-Propyl alcohol | 79.4 parts |
| [Formulation of yellow pigment dispersion matrix] | |

-continued

| | |
|---|---|
| Formulation of yellow pigment dispersion 2: | |
| Polyvinyl butyral (S-LEC B BL-SH, from Sekisui Chemical Co., Ltd.) | 7.1 parts |
| Pigment Yellow 139 (C.I. No. 56298) (Novoperm Yellow M2R 70, from Clariant (Japan) KK) | 12.9 parts |
| Pigment dispersant (Solsperse S-20000, from ICI) | 0.6 parts |
| n-Propyl alcohol | 79.4 parts |
| [Liquid coating composition for yellow image forming layer] | |
| Yellow pigment dispersion matrix described above yellow pigment dispersion 1: yellow pigment dispersion 2 = 95:5 (by part) | 126 parts |
| Polyvinyl butyral (S-LEC B BL-SH, available from Sekisui Chemical Co., Ltd.) | 4.6 parts |
| Waxes: | |
| (Stearamide (Newtron-2), from Nippon Fine Chemical Co., Ltd.) | 0.7 part |
| (Behenic acid amide (Diamide BM), from Nippon Kasei Chemical Co., Ltd.) | 0.7 part |
| (Lauramide (Diamide Y), from Nippon Kasei Chemical Co., Ltd.) | 0.7 part |
| (Palmitamide (Daimide KP), from Nippon Kasei Chemical Co., Ltd.) | 0.7 part |
| (Erucamide (Diamide L-200), from Nippon Kasei Chemical Co., Ltd.) | 0.7 part |
| (Oleamide (Diamide O-200), from Nippon Kasei Chemical Co., Ltd.) | 0.7 part |
| Nonionic surface active agent (Chemistat 1100, from Sanyo Chemical Industries, Ltd.) | 0.4 part |
| Rosin (KE-311, from Arakawa Chemical Industries, Ltd.) | 2.4 parts |
| Surface active agent (Magafac F-176PF, from Dainippon Ink & Chemicals, Inc.; solid content: 20%) | 0.8 part |
| n-Propyl alcohol | 793 parts |
| methyl ethyl ketone | 198 parts |

The physical properties of the image forming layer thus obtained were as follows.

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 2.3 mmHg (≈0.31 kPa) in practice.

The coefficient of static friction of the image receiving layer, which is preferably of 0.2 or smaller, was 0.1 in practice.

The surface energy was 24 mJ/m$^2$. The water contact angle was 108.1°.

The reflective optical density was 1.01 while the layer thickness was 0.42 μm. The OD/layer thickness was 2.40.

Preparation of Heat Transfer Sheet M

A heat transfer sheet M was prepared in the same manner as for the heat transfer sheet K as described above, except for replacing the liquid coating composition for black image forming layer by a liquid coating composition for magenta image forming layer prepared according to the following formulation. The thickness of the magenta image forming layer of the heat transfer sheet M was 0.38 μm.

| | |
|---|---|
| [Formulation of magenta pigment dispersion matrix] Formulation of magenta pigment dispersion 1: | |
| Polyvinyl butyral (Denka Butyral #2000-L, available from Denki Kagaku Kogyo KK; Vicat softening point: 57° C.) | 12.6 parts |
| Pigment Red 57:1 (C.I. No. 15850:1) (Symuler Brilliant Carmine 6B-229, from Dainippon Ink & Chemicals Inc.) | 15.0 parts |
| Pigment dispersant (Solsperse S-20000, from ICI) | 0.6 part |
| n-Propyl alcohol | 80.4 parts |
| [Formulation of magenta pigment dispersion matrix] Formulation of magenta pigment dispersion 2: | |
| Polyvinyl butyral (Denka Butyral #2000-L, available from Denki Kagaku Kogyo KK; Vicat softening point: 57° C.) | 12.6 parts |
| Pigment Red 57:1 (C.I. No. 15850:1) (Lionol Red 6B-4290G, from Toyo Ink Mgf. Co., Ltd.) | 15.0 parts |
| Pigment dispersant (Solsperse S-20000, from ICI) | 0.6 part |
| n-Propyl alcohol | 79.4 parts |
| [Formulation of Liquid coating composition for magenta image forming layer] | |
| Magenta pigment dispersion described above magenta pigment dispersion 1;magenta pigment dispersion 2 = 95:5 by part | 163 parts |
| Polyvinyl butyral (Denka Butyral #2000-L, available from Denki Kagaku Kogyo KK; Vicat softening point: 57° C.) | 4.0 parts |
| Waxes: | |
| (Stearamide (Newtron-2), from Nippon Fine Chemical Co., Ltd.) | 1.0 part |
| (Behenic acid amide (Diamide) BM, from Nippon Kasei Chemical Co., Ltd.) | 1.0 part |
| (Palmitamide (Daimide) KP, from Nippon Kasei Chemical Co., Ltd.) | 1.0 part |
| (Erucamide (Diamide L-200), from Nippon Kasei Chemical Co., Ltd.) | 1.0 part |
| (Oleamide (Damide O-200), from Nippon Kasei Chemical Co., Ltd.) | 1.0 part |
| Nonionic surface active agent (Chemistat 1100, from Sanyo Chemical Industries, Ltd.) | 0.7 part |
| Rosin (KE-311, from Arakawa Chemical Industries, Ltd.) | 4.6 parts |
| Pentaerythritol tetraacrylate (NK Ester A-TMMT, from Shin-Nakamura Chemical Co., Ltd.) | 2.5 parts |
| Surface active agent (Megafac F-176PF, from Dainippon Ink & Chemicals Inc.; solid content: 20%) | 1.3 part |
| n-Propyl alcohol | 848 parts |
| Methyl ethyl ketone | 246 parts |

The physical properties of the image forming layer thus obtained were as follows.

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 3.5 mmHg (≈0.47 kPa) in practice.

The coefficient of static friction of the image receiving layer, which is preferably of 0.2 or smaller, was 0.08 in practice.

The surface energy was 25 mJ/$m^2$. The water contact angle was 98.8°. The reflective optical density was 1.51 while the layer thickness was 0.38 μm. The OD/layer thickness was 3.97.

Preparation of Heat Transfer Sheet C

A heat transfer sheet C was prepared in the same manner as for the heat transfer sheet K as described above, except for replacing the liquid coating composition for black image forming layer by a liquid coating composition for cyan image forming layer prepared according to the following formulation. The thickness of the cyan image forming layer of the heat transfer sheet M was 0.45 μm.

| | |
|---|---|
| [Formulation of cyan pigment dispersion matrix] Formulation of cyan pigment dispersion 1: | |
| Polyvinyl butyral (S-LEC B BL-SH, available from Sekisui Chemical Co., Ltd.) | 12.6 parts |
| Pigment Blue 15:4 (C.I. No. 74160) (Cyanine Blue 700-10FG, from Toyo Ink Mfg. Co., Ltd.) | 15.0 parts |
| Pigment dispersant (PW-36, from Kusumoto Chemicals Ltd.) | 0.8 part |
| n-Propyl alcohol | 110 parts |
| [Formulation of cyan pigment dispersion matrix] Formulation of cyan pigment dispersion 2: | |
| Polyvinyl butyral (S-LEC B BL-SH, available from Sekisui Chemical Co., Ltd.) | 12.6 parts |
| Pigment Blue 15 (C.I. No. 74160) (Lionel Blue 7027, from Toyo Ink Mgf. Co., Ltd.) | 15.0 parts |
| Pigment dispersant (PW-36, from Kusumoto Chemicals Ltd.) | 0.8 part |
| n-Propyl alcohol | 110 parts |
| [Formulation of liquid coating composition for cyan image forming layer] | |
| Cyan pigment dispersion described above cyan pigment dispersion 1: cyan pigment dispersion 2 = 90:10 by part | 118 parts |
| Polyvinyl butyral (S-LEC B BL-SH, available from Sekisui Chemical Co., Ltd.) | 5.2 parts |
| Inorganic pigment MEK-ST | 1.3 part |
| Waxes: | |
| (Stearamide (Newtron-2), from Nippon Fine Chemical Co., Ltd.) | 1.0 part |

-continued

| | |
|---|---|
| (Behenic acid amide (Diamide BM), from Nippon Kasei Chemical Co., Ltd.) | 1.0 part |
| (Lauramide (Diamide Y), from Nippon Kasei Chemical Co., Ltd.) | 1.0 part |
| (Palmitamide (Daimide KP), from Nippon Kasei Chemical Co., Ltd.) | 1.0 part |
| (Erucamide (Diamide L-200), from Nippon Kasei Chemical Co., Ltd.) | 1.0 part |
| (Oleamide (Damide O-200), from Nippon Kasei Chemical Co., Ltd.) | 1.0 part |
| Rosin (KE-311, from Arakawa Chemical Industries, Ltd.) | 2.8 parts |
| Pentaerythritol tetraacrylate (NK Ester A-TMMT, from Shin-Nakamura Chemical Co., Ltd.) | 1.7 parts |
| Surface active agent (Megafac F-176PF, from Dainippon Ink & Chemicals Inc.; solid content: 20%) | 1.7 parts |
| n-Propyl alcohol | 890 parts |
| Methyl ethyl ketone | 247 parts |

The physical properties of the image forming layer thus obtained were as follows.

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 7.0 mmHg (≈0.93 kPa) in practice.

The coefficient of static friction of the image receiving layer, which is preferably of 0.2 or smaller, was 0.08 in practice.

The surface energy was 25 mJ/$m^2$. The water contact angle was 98.8°. The reflective optical density was 1.59 while the layer thickness was 0.45 μm. The OD/layer thickness was 3.03.

Preparation of Image Receiving Sheet

A liquid coating composition for cushioning layer and a liquid coating composition for image receiving layer were prepared according to the following formulations.

| | |
|---|---|
| 1) Formulation of liquid coating composition for cushioning layer | |
| Vinyl chloride-vinyl acetate copolymer (main binder) (MPR-TSL, available from Nisshin Chemical Industry Co., Ltd.) | 20 parts |
| Plasticizer (Paraplex G-40, available from The C.P. Hall Co.) | 10 parts |
| Surface active agent (fluorine-type coating aid) (Megafac F-177, available from Dainippon Ink & Chemicals, Inc.) | 0.5 part |
| Antistatic agent (quaternary ammonium salt) (SAT-5 Supper (IC), from Nihon Jynyaku Co., Ltd.) | 0.3 part |

-continued

| | |
|---|---|
| Methyl ethyl ketone | 60 parts |
| Toluene | 10 parts |
| N,N-Dimethylformamide | 3 parts |
| 2) Formulation of liquid coating composition for image receiving layer | |
| Polyvinyl butyral (S-LEC B BL-SH, available from Sekisui Chemical Co., Ltd.) | 8 parts |
| Antistatic agent (Sanstat 2012A, available from Sanyo Chemical Industries, Ltd.) | 0.7 part |
| Surface active agent (Megafac F-177, available from Dainippon Ink & Chemicals, Inc.) | 0.1 part |
| n-Propyl alcohol | 20 parts |
| Methanol | 20 parts |
| 1-Methoxy-2-propanol | 50 parts |

(Formation of Image Receiving Layer)

The liquid coating composition for cushioning layer as described above was applied to a white PETP (polyethylene terephthalate) support having a thickness of 130 μm (Lumirror #130E58, available from Toray Industries, Inc.) with a small-width applicator and dried. Next, the liquid coating composition 1 for image receiving layer was applied and dried to give an image receiving sheet. The coating amounts were controlled so as to give the cushion layer had a dry thickness of about 20 μm and the image receiving layer had a thickness of about 2 μm. The white PETP support used as a support is a void-containing PETP layer (thickness: 116 μm; void: 20%) laminated on both sides thereof with a titanium oxide-containing PETP layer (thickness: 7 μm; titanium oxide content: 2%) (total thickness: 130 μm; specific gravity: 0.8). Each of the thus prepared materials was wound into a roll and stored at room temperature for one week before using in image formation with laser light.

The surface roughness, which is preferably of from 0.4 to 0.01 μm, was 0.02 μm in practice.

The winding of the image receiving layer surface, which is preferably 2 μm or less, was 1.2 μm in practice.

The smooster value of the image forming layer, which is preferably 0.5 to 50 mmHg (≈0.0665 to 6.65 kPa) at 23° C. and 55% RH, was 0.8 mmHg (≈0.11 kPa) in practice.

The coefficient of static friction of the image receiving layer, which is preferably of 0.8 or smaller, was 0.37 in practice.

The surface energy was 29 mJ/m$^2$. The water contact angle was 87.0°.

Formation of Transfer Image

Using Luxel FINALPROOF 5600 supplied by Fuji Photo Film Co., Ltd. as shown in FIG. 4 as an image formation system, a transfer image onto printing paper was obtained in accordance with the image formation sequence of the above system and the printing paper transfer method of the system.

The image receiving sheet (56 cm×79 cm) was wound by suction around a recording drum having a diameter of 38 cm through suction holes of 1 mm in diameter of the drum (one hole per 3 cm by 8 cm area). Next, the above-described heat transfer sheet K (black) cut into a size of 61 cm×84 cm was superposed on the image receiving sheet with its four edges extending evenly from the edges of the image receiving sheet while being squeezed with a squeeze roller so that the two sheets were brought into intimate contact while allowing entrapped air to escape and be sucked. The degree of vacuum of the drum, measured with the suction holes closed, was (atmospheric pressure minus 150) mmHg (≈81.13 kPa). The above-described drum was rotated, and the laminate was scanned with semiconductor laser light having a wavelength of 808 nm and a spot diameter of 7 μm on the surface of the light-heat conversion layer, the laser being moving in a direction (sub scan direction) perpendicular to the drum rotating direction (main scan direction) to carry out recording of a laser image (scanning). The laser irradiation was carried out under the following conditions. The laser beams employed were multibeams arranged in a two-dimensional parallelogram consisting of five lines of laser beams arrayed in the main scan direction and three rows of laser beams arrayed in the sub scan direction.

Laser power: 110 mW

Drum rotation: 500 rpm

Sub scanning pitch: 6.35 μm

Environment: 3 conditions including: (1) 18° C., 30% RH;

(2) 23° C., 50% RH; (3) 26° C., 65% RH

The exposure drum preferably has a diameter of 360 mm or longer and a drum of 380 mm in diameter was employed in practice.

The recorded image size was 515 mm×728 mm, and the resolution was 2600 dpi.

After completion of laser recording, the laminate was removed from the drum, and the heat transfer sheet K was stripped by hand off the image receiving sheet. As a result, it was confirmed that the irradiated parts of the image forming layer of the heat transfer sheet K had been exclusively transferred from the heat transfer sheet K to the image receiving sheet.

In the same manner as described above, images were transferred from the above-described heat transfer sheet Y, heat transfer sheet M and heat transfer sheet C to the image receiving sheets. The four-color images thus transferred were re-transferred onto printing paper to form a multicolor image. Thus, multicolor images, which showed excellent image qualities and stable transfer densities, could be obtained by high-energy recording with laser light comprising two-dimensionally arranged multibeams under different temperature/humidity conditions.

Transfer to printing paper was performed by using a heat transfer apparatus provided with an insertion table made of a material having a dynamic frictional coefficient against a polyethylene terephthalate of from 0.1 to 0.7. The transporting speed was 15 to 50 mm/sec. The heat rolls were made of a material having a Vickers hardness of 70 (a preferred Vickers hardness of the material is 10 to 100).

The obtained images were retained in favorable state at the three environmental temperatures/humidities.

Heat transfer sheets with the above system configuration were evaluated as follows.

Glass Transition Temperature (Tg) of Binder:

Determined by DSC.

5% Mass Reduction Temperature of Binder:

Determined by TGA under $N_2$.

Film Fogging:

Observing recorded image formed on image receiving sheet with the naked eye, stripping off of light-heat conversion layer was examined.

Resolution:

Observing recorded image with the naked eye, evaluation was made in the following 3 grades:

O: good, Δ: moderate, and X: poor.

Table 2 summarizes the results.

TABLE 2

| | Binder in light-heat conversion layer | | | Colorant in light-heat conversion layer | | |
|---|---|---|---|---|---|---|
| | Type | Tg (° C.) | 5% mass reduction temp. (° C.) | | Film fogging | Resolution |
| Ex. 2-1 | (a) | 300 | 400≦ | (I'-17) | No | ○ |
| Ex. 2-2 | (b) | 320 | 400≦ | (I'-17) | No | ○ |
| C. Ex. 2-1 | (c) | 250 | 385 | (I'-17) | Yes | X |

(a) Vylomax HR11NN (in the above general formula (I), the linking group R is the group (6) as cited above).
(b) Vylomax HR16NN (in the above general formula (I), the linking group R is the group (6) as cited above).

The results given in Table 2 clearly indicate that the multicolor image forming materials according to the present invention, in which polyamide imides represented by the general formula (I) and having Tg of 260° C. or higher are employed as the binder in the light-heat conversion layer and compounds represented by the general formula (I') are employed as the light-heat converting substance, show excellent resolution with no film fogging.

Examples 3-1 to 3-2 and Comparative Example 3-1

[Preparation of Heat Transfer Sheet K (Black)]

[Formation of Backcoating Layer]

| [Preparation of liquid coating solution for first backcoating layer] | |
|---|---|
| Aqueous dispersion of acrylic resin (Jurymer ET410, available from Nihon Junyaku Co., Ltd.; solid content: 20%) | 2 parts |
| Antistatic agent (aqueous dispersion of tin oxide-antimony oxide (average particle size: 0.1 μm; solid content: 17% by mass) | 7.0 parts |
| Polyoxyethylene phenyl ether | 0.1 part |
| Melamine compound (Sumitex Resin M-3, from Sumitomo Chemical Co., Ltd.) | 0.3 part |
| Distilled water to make | 100 parts |

[Formation of First Backcoating Layer]

A biaxially stretched polyethylene terephthalate (PETP) support (Ra of 0.01 μm on both sides) having a thickness of 75 μm was subjected to corona discharge treatment on one side (the back face). The liquid coating composition for first backcoating layer was applied to the corona discharge treated side of the support to a dry thickness of 0.03 μm and dried at 180° C. for 30 seconds to form a first backcoating layer. The support used had a Young's modulus of 450 $kg/mm^2$ (≈4.4 GPa) in the machine direction and of 500 $kg/mm^2$ (≈4.9 GPa) in the transverse direction, an F-5 value of 10 $kg/mm^2$ (≈98 MPa) in the machine direction and of 13 $kg/mm^2$ (≈127.4 MPa) in the transverse direction; a thermal shrinkage percentage of 0.3% in the MD and of 0.1% in the TD both after heating at 100° C. for 30 minutes; a breaking strength of 20 $kg/mm^2$ (≈196 MPa) in the machine direction and of 25 $kg/mm^2$ (≈245 MPa) in the transverse direction; and an elastic modulus at 20° C. of 400 $kg/mm^2$ (≈3.9 GPa).

| [Preparation of liquid coating solution for second backcoating layer] | |
|---|---|
| Polyolefin (Chemipearl S-120, available from Mitsui Chemicals, Inc.; solid content: 27%) | 3.0 parts |
| Antistatic agent (aqueous dispersion of tin oxide-antimony oxide) (average particle size: 0.1 μm; solid content: 17%) | 2.0 parts |
| Colloidal silica (Snowtex C, available from Nissan Chemical Industries, Ltd.; solid content: 20%) | 2.0 parts |
| Epoxy compound (Denacol EX-614B, from Nagase Chemical Co., Ltd.) | 0.3 part |
| Distilled water | To make 100 parts |

[Formation of Second Backcoating Layer]

The liquid coating composition for second backcoating layer was applied to the first backcoating layer to a dry thickness of 0.03 μm and dried at 170° C. for 30 seconds to form a second backcoating layer.

[Formation of Light-heat Conversion Layer]

The components shown below were mixed while agitating with a stirrer to prepare a liquid coating composition for light-heat conversion layer.

| [Formulation of liquid coating composition for light-heat conversion layer] | |
|---|---|
| Infrared absorbing colorant (light-heat conversion colorant listed in Table 3) | 7.6 parts |
| Binder (listed in Table 3) | 29.3 parts |
| Exxon Naphtha | 5.8 parts |
| N-Methylpyrrolidone (NMP) | 1500 parts |
| Methyl ethyl ketone | 360 parts |
| Surface active agent (Magafac F-176PF, from Dainippon Ink & Chemicals, Inc., F-type surface active agent) | 0.5 part |
| Matting agent dispersion (having the following formulation) | 14.1 parts |

(Preparation of Matting Agent Dispersion)

A mixture of 10 parts of true spherical silica powder having an average particle size of 1.5 μm (Seahostar KE-P150, from Nippon Shokubai Co., Ltd.), 2 parts of an acrylic ester-styrene copolymer as a dispersant (Joncryl 611, from Johnson Polymer Co., Ltd.), 16 parts of methyl ethyl ketone, and 64 parts of N-methylpyrrolidone was put in a 200 ml polyethylene container together with 30 parts of glass beads having a diameter of 2 mm. The mixture in the container was dispersed in a paint shaker supplied by Toyo Seiki Co., Ltd. for 2 hours to prepare a matting agent dispersion.

[Formation of Light-heat Conversion Layer on Support Surface]

The above-described liquid coating composition for light-heat conversion layer was applied to the other side of the PETP support having a thickness of 75 μm with a wire bar and dried in an oven at 120° C. for 2 minutes to form a light-heat conversion layer on the support. The light-heat conversion layer had an optical density (OD) of 1.03 at 808 nm as measured with a UV spectrophotometer UV-240 supplied by Shimadzu Corp. A cut area of the light-heat conversion layer was observed under a scanning electron microscope to find that the average layer thickness was 0.3 μm. Therefore, (OD/layer thickness) of the light-heat conversion layer was 3.43.

[Formation of Image Forming Layer]

[Preparation of Liquid Coating Composition for Black Image Forming Layer]

The following components were put in a kneader mill and preliminarily dispersed with shear while adding a small amount of the solvent shown. The rest of the solvent was added to the dispersion, followed by further dispersing in a sand mill for 2 hours to prepare a pigment dispersion matrix.

| [Preparation of black pigment dispersion matrix] | |
|---|---|
| Formulation 1 | |
| Polyvinyl butyral (S-LEC B BL-SH, available from Sekisui Chemical Co., Ltd.) | 12.6 parts |
| Pigment Black 7 (Carbon Black C.I. No. 77266) (Mitsubishi Carbon Black #5, available from Mitsubishi Chemical Corp.; PVC blackness: 1) | 4.5 parts |
| Dispersant (Solsperse S-20000, from ICI) | 0.8 part |
| n-Propyl alcohol | 79.4 parts |
| Formulation 2 | |
| Polyvinyl butyral (S-LEC B BL-SH, available from Sekisui Chemical Co., Ltd.) | 12.6 parts |
| Pigment Black 7 (Carbon Black C.I. No. 77266) (Mitsubishi Carbon Black MA100; PVC blackness: 10) | 10.5 parts |
| Dispersant (Solsperse S-20000, from ICI) | 0.8 part |
| n-Propyl alcohol | 79.4 parts |

The components shown below were mixed while agitating with a stirrer to prepare a liquid coating composition for black image forming layer.

| [Formulation of liquid coating composition for black image forming layer] | |
|---|---|
| Black pigment dispersion black pigment dispersion 1:black pigment dispersion 2 = 70:30 by part | 185.7 parts |
| Polyvinyl butyral (S-LEC B BL-SH, available from Sekisui Chemical Co., Ltd.) | 11.9 parts |
| Waxes: | |
| (Stearamide (Newtron-2), from Nippon Fine Chemical Co., Ltd.) | 1.7 parts |
| (Behenic acid amide (Diamide BM), from Nippon Kasei Chemical Co., Ltd.) | 1.7 parts |
| (Lauramide (Diamide Y), from Nippon Kasei Chemical Co., Ltd.) | 1.7 parts |
| (Palmitamide (Diamide KP), from Nippon Kasei Chemical Co., Ltd.) | 1.7 parts |
| (Erucamide (Diamide L-200), from Nippon Kasei Chemical Co., Ltd.) | 1.7 parts |
| Oleamide (Diamide O-200, from Nippon Kasei Chemical Co., Ltd.) | 1.7 parts |
| Rosin (KE-311, from Arakawa Chemical Industries, Ltd.; resin acid composition: abietic acid 30 to 40%, neoabietic acid 10 to 20%, dihydroabietic acid 14%, and tetrahydroabietic acid 14%)) | 11.4 parts |
| Surface active agent (Megafac F-176PF, from Dainippon Ink & Chemicals Inc.; solid content: 20%) | 2.1 parts |
| Inorganic pigment (MEK-K, 30% MEK solution available from Nissan Chemical Industries, Ltd.) | 7.1 parts |
| n-Propyl alcohol | 1050 parts |
| Methyl ethyl ketone | 295 parts |

The particle size distribution of the resulting coating composition for black image forming layer was measured with a laser scattering particle size distribution analyzer. As a result, the average particle size was 0.25 μm, and the proportion of particles of 1 μm or greater was 0.5%.

[Formation of Black Image Forming Layer on Light-heat Conversion Layer Surface]

The above-described liquid coating solution for black image forming layer was applied on the surface of the above-described light-heat conversion layer with a wire bar for 1 minute and then dried in an oven at 100° C. for 2 minutes. Thus, a black image forming layer was formed on the light-heat conversion layer. By the above-described procedure, a heat transfer sheet having a light-heat conversion layer and a black image forming layer formed on a support in this order (hereinafter referred to as the heat transfer sheet K; hereinafter those having a yellow image forming layer, a magenta image forming layer and a cyan image forming layer will be referred as respectively to the heat transfer sheet Y, the heat transfer sheet M and the heat transfer sheet C) was constructed.

The optical density (OD) of the heat transfer sheet K measured with Macbeth Densitomether Model TD-904 (W-filter) was 0.91. The layer thickness of the black image forming layer was 0.60 μm on average.

The physical properties of the image forming layer thus obtained were as follows.

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 9.3 mmHg (≈1.24 kPa) in practice.

The coefficient of static friction of the image receiving layer, which is preferably of 0.2 or smaller, was 0.08 in practice.

The surface energy was 29 $mJ/m^2$. The water contact angle was 94.8°. The reflective optical density was 1.82 while the layer thickness was 0.60 μm. The OD/layer thickness was 3.03.

Preparation of Heat Transfer Sheet Y

A heat transfer sheet Y was prepared in the same manner as for the heat transfer sheet K as described above, except for replacing the liquid coating composition for black image forming layer by a liquid coating composition for yellow image forming layer prepared according to the following formulation. The thickness of the yellow image forming layer of the heat transfer sheet Y was 0.42 μm.

| | |
|---|---|
| [Formulation of yellow pigment dispersion matrix] Formulation of yellow pigment dispersion 1: | |
| Polyvinyl butyral (S-LEC B BL-SH, from Sekisui Chemical Co., Ltd.) | 7.1 parts |
| Pigment Yellow 180 (C.I. No. 21290) (Novoperm Yellow P-HG, from Clariant (Japan) KK) | 12.9 parts |
| Pigment dispersant (Solsperse S-20000, from ICI) | 0.6 part |
| n-Propyl alcohol | 79.4 parts |
| [Formulation of yellow pigment dispersion matrix] Formulation of yellow pigment dispersion 2: | |
| Polyvinyl butyral (S-LEC B BL-SH, from Sekisui Chemical Co., Ltd.) | 7.1 parts |
| Pigment Yellow 139 (C.I. No. 56298) (Novoperm Yellow M2R 70, from Clariant (Japan) KK) | 12.9 parts |
| Pigment dispersant (Solsperse S-20000, from ICI) | 0.6 parts |
| n-Propyl alcohol | 79.4 parts |
| [Liquid coating composition for yellow image forming layer] | |
| Yellow pigment dispersion matrix described above yellow pigment dispersion 1:yellow pigment dispersion 2 = 95:5 (by part) | 126 parts |
| Polyvinyl butyral (S-LEC B BL-SH, available from Sekisui Chemical Co., Ltd.) | 4.6 parts |
| Waxes: | |
| (Stearamide (Newtron-2), from Nippon Fine Chemical Co., Ltd.) | 0.7 part |
| (Behenic acid amide (Diamide BM), from Nippon Kasei Chemical Co., Ltd.) | 0.7 part |
| (Lauramide (Diamide Y), from Nippon Kasei Chemical Co., Ltd.) | 0.7 part |
| (Palmitamide (Daimide KP), from Nippon Kasei Chemical Co., Ltd.) | 0.7 part |
| (Erucamide (Diamide L-200), from Nippon Kasei Chemical Co., Ltd.) | 0.7 part |
| (Oleamide (Diamide O-200), from Nippon Kasei Chemical Co., Ltd.) | 0.7 part |
| Nonionic surface active agent (Chemistat 1100, from Sanyo Chemical Industries, Ltd.) | 0.4 part |

-continued

| | |
|---|---|
| Rosin (KE-311, from Arakawa Chemical Industries, Ltd.) | 2.4 parts |
| Surface active agent (Magafac F-176PF, from Dainippon Ink & Chemicals, Inc.) | 0.8 part |
| n-Propyl alcohol | 793 parts |
| Methyl ethyl ketone | 198 parts |

The physical properties of the image forming layer thus obtained were as follows.

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 2.3 mmHg (≈0.31 kPa) in practice.

The coefficient of static friction of the image receiving layer, which is preferably of 0.2 or smaller, was 0.1in practice.

The surface energy was 24 $mJ/m^2$. The water contact angle was 108.1°. The reflective optical density was 1.01 while the layer thickness was 0.42 μm. The OD/layer thickness was 2.40.

Preparation of Heat Transfer Sheet M

A heat transfer sheet M was prepared in the same manner as for the heat transfer sheet K as described above, except for replacing the liquid coating composition for black image forming layer by a liquid coating composition for magenta image forming layer prepared according to the following formulation. The thickness of the magenta image forming layer of the heat transfer sheet M was 0.38 μm.

| | |
|---|---|
| [Formulation of magenta pigment dispersion matrix] Formulation of magenta pigment dispersion 1: | |
| Polyvinyl butyral (Denka Butyral #2000-L, available from Denki Kagaku Kogyo KK; Vicat softening point: 57° C.) | 12.6 parts |
| Pigment Red 57:1 (C.I. No. 15850:1) (Symuler Brilliant Carmine 6B-229, from Dainippon Ink & Chemicals Inc.) | 15.0 parts |
| Pigment dispersant (Solsperse S-20000, from ICI) | 0.6 part |
| n-Propyl alcohol | 80.4 parts |
| [Formulation of magenta pigment dispersion matrix] Formulation of magenta pigment dispersion 2: | |
| Polyvinyl butyral (Denka Butyral #2000-L, available from Denki Kagaku Kogyo KK; Vicat softening point: 57° C.) | 12.6 parts |
| Pigment Red 57:1 (C.I. No. 15850:1) (Lionol Red 6B-4290G, from Toyo Ink Mgf. Co., Ltd.) | 15.0 parts |
| Pigment dispersant (Solsperse S-20000, from ICI) | 0.6 part |
| n-Propyl alcohol | 79.4 parts |
| [Formulation of Liquid coating composition for magenta image forming layer] | |
| Magenta pigment dispersion described above magenta pigment dispersion 1:magenta pigment dispersion 2 = 95:5 by part | 163 parts |

-continued

| | |
|---|---|
| Polyvinyl butyral (Denka Butyral #2000-L, available from Denki Kagaku Kogyo KK; Vicat softening point: 57° C.) | 4.0 parts |
| Waxes: | |
| (Stearamide (Newtron-2), from Nippon Fine Chemical Co., Ltd.) | 1.0 part |
| (Behenic acid amide (Diamide) BM, from Nippon Kasei Chemical Co., Ltd.) | 1.0 part |
| (Lauramide (Diamide Y), from Nippon Kasei Chemical Co., Ltd.) | 1.0 part |
| (Palmitamide (Daimide) KP, from Nippon Kasei Chemical Co., Ltd.) | 1.0 part |
| (Erucamide (Diamide L-200), from Nippon Kasei Chemical Co., Ltd.) | 1.0 part |
| (Oleamide (Damide O-200), from Nippon Kasei Chemical Co., Ltd.) | 1.0 part |
| Nonionic surface active agent (Chemistat 1100, from Sanyo Chemical Industries, Ltd.) | 0.7 part |
| Rosin (KE-311, from Arakawa Chemical Industries, Ltd.) | 4.6 parts |
| Pentaerythritol tetraacrylate (NK Ester A-TMMT, from Shin-Nakamura Chemical Co., Ltd.) | 2.5 parts |
| Surface active agent (Megafac F-176PF, from Dainippon Ink & Chemicals Inc.; solid content: 20%) | 1.3 part |
| n-Propyl alcohol | 848 parts |
| Methyl ethyl ketone | 246 parts |

The physical properties of the image forming layer thus obtained were as follows.

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 3.5 mmHg (≈0.47 kPa) in practice.

The coefficient of static friction of the image receiving layer, which is preferably of 0.2 or smaller, was 0.08 in practice.

The surface energy was 25 mJ/m$^2$. The water contact angle was 98.80. The reflective optical density was 1.51 while the layer thickness was 0.38 μm. The OD/layer thickness was 3.97.

Preparation of Heat Transfer Sheet C

A heat transfer sheet C was prepared in the same manner as for the heat transfer sheet K as described above, except for replacing the liquid coating composition for black image forming layer by a liquid coating composition for cyan image forming layer prepared according to the following formulation. The thickness of the cyan image forming layer of the heat transfer sheet M was 0.45 μm.

| | |
|---|---|
| [Formulation of cyan pigment dispersion matrix] Formulation of cyan pigment dispersion 1: | |
| Polyvinyl butyral (S-LEC B BL-SH, available from Sekisui Chemical Co., Ltd.) | 12.6 parts |
| Pigment Blue 15:4 (C.I. No. 74160) (Cyanine Blue 700-10FG, from Toyo Ink Mfg. Co., Ltd.) | 15.0 parts |
| Pigment dispersant (PW-36, from Kusumoto Chemicals Ltd.) | 0.8 part |
| n-Propyl alcohol | 110 parts |
| [Formulation of cyan pigment dispersion matrix] Formulation of cyan pigment dispersion 2: | |
| Polyvinyl butyral (S-LEC B BL-SH, available from Sekisui Chemical Co., Ltd.) | 12.6 parts |
| Pigment Red 15 (C.I. No. 74160) (Lionol Blue 7027, from Toyo Ink Mgf. Co., Ltd.) | 15.0 parts |
| Pigment dispersant (PW-36, from Kusumoto Chemicals Ltd.) | 0.8 part |
| n-Propyl alcohol | 110 parts |
| [Formulation of liquid coating composition for image forming layer] | |
| Cyan pigment dispersion described above cyan pigment dispersion 1:cyan pigment dispersion 2 = 90:10 by part | 118 parts |
| Polyvinyl butyral (S-LEC B BL-SH, available from Sekisui Chemical Co., Ltd.) | 5.2 parts |
| Inorganic pigment MEK-ST | 1.3 part |
| Waxes: | |
| (Stearamide (Newtron-2), from Nippon Fine Chemical Co., Ltd.) | 1.0 part |
| (Behenic acid amide (Diamide BM), from Nippon Kasei Chemical Co., Ltd.) | 1.0 part |
| (Lauramide (Diamide Y), from Nippon Kasei Chemical Co., Ltd.) | 1.0 part |
| (Palmitamide (Daimide KP), from Nippon Kasei Chemical Co., Ltd.) | 1.0 part |
| (Erucamide (Diamide L-200), from Nippon Kasei Chemical Co., Ltd.) | 1.0 part |
| (Oleamide (Damide O-200), from Nippon Kasei Chemical Co., Ltd.) | 1.0 part |
| Rosin (KE-311, from Arakawa Chemical Industries, Ltd.) | 2.8 parts |
| Pentaerythritol tetraacrylate (NK Ester A-TMMT, from Shin-Nakamura Chemical Co., Ltd.) | 1.7 parts |
| Surface active agent (Megafac F-176PF, from Dainippon Ink & Chemicals Inc.; solid content: 20%) | 1.7 parts |
| n-Propyl alcohol | 890 parts |
| Methyl ethyl ketone | 247 parts |

The physical properties of the image forming layer thus obtained were as follows.

The surface hardness of the image forming layer, which is preferably 10 g or more measured with a sapphire stylus, was 200 g or more in practice.

The smooster, value of the image forming layer, which is preferably 0.5 to 50 mmHg (≈0.0665 to 6.65 kPa) at 23° C. and 55% RH, was 7.0 mmHg (≈0.93 kPa) in practice.

The coefficient of static friction of the image receiving layer, which is preferably of 0.2 or smaller, was 0.08 in practice.

The surface energy was 25 mJ/$m^2$. The water contact angle was 98.8°. The reflective optical density was 1.59 while the layer thickness was 0.45 μm. The OD/layer thickness was 3.03.

Preparation of Image Receiving Sheet

A liquid coating composition for cushioning layer and a liquid coating composition for image receiving layer were prepared according to the following formulations.

| | |
|---|---|
| 1) Formulation of liquid coating composition for cushioning layer | |
| Vinyl chloride-vinyl acetate copolymer (main binder) (MPR-TSL, available from Nisshin Chemical Industry Co., Ltd.) | 20 parts |
| Plasticizer (Paraplex G-40, available from The C.P. Hall Co.) | 10 parts |
| Surface active agent (fluorine type, coating aid) (Megafac F-177, available from Dainippon Ink & Chemicals, Inc.) | 0.5 part |
| Antistatic agent (quaternary ammonium salt) (SAT-5 Supper (IC), available from Nihon Jynyaku Co., Ltd.) | 0.3 part |
| Methyl ethyl ketone | 60 parts |
| Toluene | 10 parts |
| N,N-Dimethylformamide | 3 parts |
| 2) Formulation of liquid coating composition for image receiving layer | |
| Polyvinyl butyral (S-LEC B BL-SH, available from Sekisui Chemical Co., Ltd.) | 8 parts |
| Antistatic agent (Sanstat 2012A, available from Sanyo Chemical Industries, Ltd.) | 0.7 part |
| n-Propyl alcohol | 20 parts |
| Methanol | 20 parts |
| 1-Methoxy-2-propanol | 50 parts |

(Formation of Image Receiving Layer)

The liquid coating composition for cushioning layer as described above was applied to a white PETP (polyethylene terephthalate) support having a thickness of 130 μm (Lumirror #130E58, available from Toray Industries, Inc.) with a small-width applicator and dried. Next, the liquid coating composition 1 for image receiving layer was applied and dried to give an image receiving sheet. The coating amounts were controlled so as to give the cushion layer had a dry thickness of about 20 μm and the image receiving layer had a thickness of about 2 μm. The white PETP support used as a support is a void-containing PETP layer (thickness: 116 μm; void: 20%) laminated on both sides thereof with a titanium oxide-containing PETP layer (thickness: 7 μm; titanium oxide content: 2%) (total thickness: 130 μm; specific gravity: 0.8). Each of the thus prepared materials was wound into a roll and stored at room temperature for one week before using in image formation with laser light.

The physical properties of the obtained image receiving layer were as follows.

The surface roughness, which is preferably of from 0.4 to 0.01 μm, was 0.02 μm in practice.

The winding of the image receiving layer surface, which is preferably 2 μm or less, was 1.2 μm in practice.

The smooster value of the image forming layer, which is preferably 0.5 to 50 mmHg (≈0.0665 to 6.65 kPa) at 23° C. and 55% RH, was 0.8 mmHg (≈0.11 kPa) in practice.

The coefficient of static friction of the image receiving layer, which is preferably of 0.8 or smaller, was 0.37 in practice.

The surface energy was 29 mJ/$m^2$. The water contact angle was 87.0°.

Formation of Transfer Image

Using Luxel FINALPROOF 5600 supplied by Fuji Photo Film Co., Ltd. shown in FIG. 4 as an image formation system, a transfer image onto printing paper was obtained in accordance with the image formation sequence of the above system and the printing paper transfer method of the system.

The image receiving sheet (56 cm×79 cm) was wound by suction around a recording drum having a diameter of 38 cm through suction holes of 1 mm in diameter of the drum (one hole per 3 cm by 8 cm area). Next, the above-described heat transfer sheet K (black) cut into a size of 61 cm×84 cm was superposed on the image receiving sheet with its four edges extending evenly from the edges of the image receiving sheet while being squeezed with a squeeze roller so that the two sheets were brought into intimate contact while allowing entrapped air to escape and be sucked. The degree of vacuum of the drum, measured with the suction holes closed, was (atmospheric pressure minus 150) mmHg (≈81.13 kPa). The above-described drum was rotated, and the laminate was scanned with semiconductor laser light having a wavelength of 808 nm and a spot diameter of 7 μm on the surface of the light-heat conversion layer, the laser being moving in a direction (sub scan direction) perpendicular to the drum rotating direction (main scan direction) to carry out recording of a laser image (scanning). The laser irradiation was carried out under the following conditions. The laser beams employed were multibeams arranged in a two-dimensional parallelogram consisting of five lines of laser beams arrayed in the main scan direction and three rows of laser beams arrayed in the sub scan direction.

Laser power: 110 mW

Drum rotation: 500 rpm

Sub scanning pitch: 6.35 μm

Environment: 3 conditions including: (1) 18° C., 30% RH;

(2) 23° C., 50% RH; (3) 26° C., 65% RH

The exposure drum preferably has a diameter of 360 mm or longer and a drum of 380 mm in diameter was employed in practice.

The recorded image size was 515 mm×728 mm, and the resolution was 2600 dpi.

After completion of laser recording, the laminate was removed from the drum, and the heat transfer sheet K was stripped by hand off the image receiving sheet. As a result, it was confirmed that the irradiated parts of the image forming layer of the heat transfer sheet K had been exclusively transferred from the heat transfer sheet K to the image receiving sheet.

In the same manner as described above, images were transferred from the above-described heat transfer sheet Y, heat transfer sheet M and heat transfer sheet C to the image receiving sheets. The four-color images thus transferred were re-transferred onto printing paper to form a multicolor image. Thus, multicolor images, which showed excellent image qualities and stable transfer densities, could be obtained by high-energy recording with laser light comprising two-dimensionally arranged multibeams under different temperature/humidity conditions.

Transfer to printing paper was performed by using a heat transfer apparatus provided with an insertion table made of a material having a dynamic frictional coefficient against a polyethylene terephthalate of from 0.1 to 0.7. The transporting speed was 15 to 50 mm/sec. The heat rolls were made of a material having a Vickers hardness of 70 (a preferred Vickers hardness of the material is 10 to 100).

The obtained images were retained in favorable state at the three environmental temperatures/humidities.

Heat transfer sheets with the above system configuration were evaluated as follows.

Deformation Percentage of Light-heat Conversion Layer:

By irradiating the heat transfer sheet C with laser light under the above conditions at 23° C. 50% RH, the deformation percentage was calculated in accordance with the numerical formula (1).

Heat Sensitivity and Change in Sensitivity of Heat Transfer Sheet:

Sensitivity was calculated based on line width. Under an optical microscope, the recorded line width d in a transfer image having a line pattern in the laser-irradiated area was measured. Then the sensitivity was determined in accordance with the following formula.

Change in the recording environment (temperature-humidity) was calculated from the difference between the sensitivity at 26° C. 60% and the sensitivity at 18° C. 30%.

Sensitivity ($mJ/cm^2$)=(laser power)/(line width d×rotation speed of drum)

Transfer Defect:

Recorded image was observed with the naked eye.

Table 3 summarizes the results.

TABLE 3

| | Binder in light-heat conversion layer | Colorant in light-heat conversion layer | Deformation percentage (%) | Change in sensitivity ($mJ/cm^2$) | Transfer defect |
|---|---|---|---|---|---|
| Ex. 3-1 | (6) | (I'-11) | 200 | 25 | No |
| Ex. 3-2 | (6) | (I'-19) | 550 | 19 | No |
| C. Ex. 3-1 | Vylon 200 | NK2014 | 105 | 85 | Yes |

In Table 3, the numbers of binder resins correspond respectively to the numbers of linking group R in the general formula (I) as cited above. The polyamide-imide resin employed in Examples 3-1 and 3-2 are Vylomax HR-11NN (available from TOYOBO) having a mass-average molecular weight of 15,000. NK2014 (available from Nippon Kanko Shikiso)

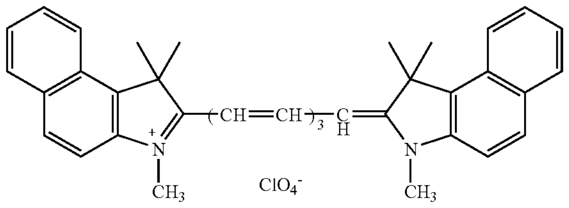

The results given in Table 3 clearly indicate that the multicolor image forming materials according to the present invention with the use of polyamide-imides as the binder in light heat conversion layer and the compounds represented by the general formula (I') as the light-heat converting substance and having a deformation percentage of the light-heat conversion layer exceeding 150% show little change in sensitivity even employed in recording under different environmental conditions and suffer from little transfer defects.

Example 4-1

Formation of Heat Transfer Sheet K (Black)

[Formation of Backcoating Layer]

| [Preparation of liquid coating composition for 1st backcoating layer] | |
|---|---|
| Aqueous dispersion of acrylic resin (Jurymer ET410, available from Nihon Junyaku Co., Ltd.; solid content: 20%) | 2 parts |
| Antistatic agent (aqueous dispersion of tin oxide-antimony oxide; average particle size: 0.1 μm; solid content: 17%) | 7.0 parts |
| Polyoxyethylene phenyl ether | 0.1 part |
| Melamine compound (Sumitex Resin M-3, from Sumitomo Chemical Co., Ltd.) | 0.3 part |
| Distilled water | to make 100 parts |

[Formation of 1st Backcoating Layer]

A biaxially stretched polyethylene terephthalate film having a thickness of 75 μm and an Ra of 0.01 μm on both sides was subjected to corona discharge treatment on one side. The liquid coating composition for 1st backcoating layer was applied to the corona discharge treated side of the support to a dry thickness of 0.03 μm and dried at 180° C. for 30 seconds to form a first backcoating layer. The support used had a Young's modulus of 450 $kg/mm^2$ (≈4.4 GPa) in the machine direction and of 500 $kg/mm^2$ (≈4.9 GPa) in the transverse direction; an F-5 value of 10 $kg/mm^2$ (≈98 MPa) in the machine direction and of 13 $kg/mm^2$ (≈127.4 MPa) in the transverse direction; a thermal shrinkage percentage of 0.3% in the machine direction and of 0.1% in the transverse direction both after heating at 100° C. for 30 minutes; a breaking strength of 20 $kg/mm^2$ (≈196 MPa) in the machine direction and of 25 $kg/mm^2$ (≈245 MPa) in the transverse direction; and an elastic modulus at 20° C. of 400 $kg/mm^2$ (≈3.9 GPa).

[Preparation of Liquid Coating Composition for 2 nd Backcoating Layer]

| [Preparation of liquid coating composition for 2nd backcoating layer] | |
|---|---|
| Polyolefin (Chemipearl S-120, available from Mitsui Chemicals, Inc.; solid content: 27%) | 3.0 parts |
| Antistatic agent (aqueous dispersion of tin oxide-antimony oxide; average particle size: 0.1 μm; solid content: 17%) | 2.0 parts |
| Colloidal silica (Snowtex C, available from Nissan Chemical Industries, Ltd.; solid content: 20%) | 2.0 parts |
| Epoxy compound (Denacol EX-614B, from Nagase Chemical Co., Ltd.) | 0.3 part |
| Distilled water | To make 100 parts |

[Formation of 2nd Backcoating Layer]

The liquid coating composition for 2nd backcoating layer was applied to the first backcoating layer to a dry thickness of 0.03 μm and dried at 170° C. for 30 seconds to form a second backcoating layer.

1) Preparation of Liquid Coating Composition for Light-heat Conversion Layer

| [Formulation of liquid coating composition for light-heat conversion layer] | |
|---|---|
| Infrared absorbing colorant (NK-2919 available from Hayashibara Biochemical Laboratories, Inc.); a cyanine having a structure represented by the above general formula (I) wherein Z is a naphthalene ring, T is $—CH_2—$, L is =CH—CH=CH—CH=CH—M is $—(CH_2)_4—$, and X is $NH_4$) | 10 parts |
| Polymide resin of the formula shown below (Rikacoat SN-20F available from New Japan Chemical Co., Ltd.; thermal decomposition temperature: 510° C.) | 4 parts |

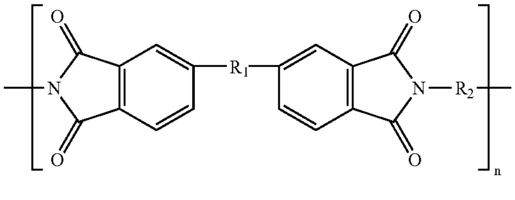

wherein, $R_1$ represents $SO_2$, and $R_2$ represents

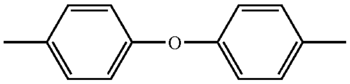

or

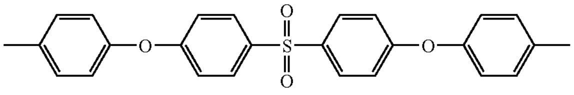

| | |
|---|---|
| N-Methylpyrrolidone (available from Mitsubishi Chemicals Co., Ltd.) | 1900 parts |
| Methyl ethyl ketone | 300 parts |

-continued

| [Formulation of liquid coating composition for light-heat conversion layer] | |
|---|---|
| Matting agent (Seahostar KE-P150, from Nippon Shokubai Co., Ltd.) | 2 parts |
| Surface active agent (Magafac F-176PF, from Dainippon Ink & Chemicals, Inc.) | 0.5 part |

2) Formation of Light-heat Conversion Layer on Support Surface p The resulting liquid coating composition was applied to the other side of the polyethylene terephthalate film (support) with a wire bar and dried in an oven at 120° C. for 2 minutes to form a light-heat conversion layer. The light-heat conversion layer had an optical density (OD) of 1.03 at 808 nm as measured with a UV spectrophotometer UV-240 supplied by Shimadzu Corp. A cut area of the light-heat conversion layer was observed under a scanning electron microscope (SEM) to find that the average layer thickness was 0.3 μm.

3) Preparation of Liquid Coating Compostion for Black Image Forming Layer

The components shown below were put in a kneader and preliminarily dispersed with shear while adding a small amount of the solvent shown. The rest of the solvent was added to the dispersion, followed by further dispersing in a sand mill for 2 hours to prepare black pigment dispersions 1 and 2, respectively.

| [Formulation of black pigment dispersion] | |
|---|---|
| Formulation 1: | |
| Polyvinyl butyral (S-LEC B BL-SH, available from Sekisui Chemical Co., Ltd.) | 12.6 parts |
| Pigment Black 7 (Carbon Black C.I. No. 77266) (Mitsubishi Carbon Black #5, available from Mitsubishi Chemical Corp.; PVC blackness: 1) | 4.5 parts |
| Dispersant (Solsperse S-20000, from ICI) | 0.8 part |
| n-Propyl alcohol | 79.4 parts |
| Formulation 2: | |
| Polyvinyl butyral (S-LEC B BL-SH, available from Sekisui Chemical Co., Ltd.) | 12.6 parts |
| Pigment Black 7 (Carbon Black C.I. No. 77266) (Mitsubishi Carbon Black MA100; PVC blackness: 10) | 10.5 parts |
| Dispersant (Solsperse S-20000, from ICI) | 0.8 part |
| n-Propyl alcohol | 79.4 parts |

The components shown below were mixed while agitating with a stirrer to prepare a liquid coating composition for black image forming layer.

| [Formulation of coating composition for black image forming layer] | |
|---|---|
| Black pigment dispersion black pigment dispersion 1:black pigment dispersion 2 = 70:30 by part | 185.7 parts |
| Polyvinyl butyral (S-LEC B BL-SH, available from Sekisui Chemical Co., Ltd.) | 11.9 parts |

-continued

| [Formulation of coating composition for black image forming layer] | |
|---|---|
| Waxes: | |
| Stearamide (Newtron-2, from Nippon Fine Chemical Co., Ltd.) | 1.7 parts |
| Behenic acid amide (Diamide BM, from Nippon Kasei Chemical Co., Ltd.) | 1.7 parts |
| Lauramide (Diamide Y, from Nippon Kasei Chemical Co., Ltd.) | 1.7 parts |
| Palmitamide (Diamide KP, from Nippon Kasei Chemical Co., Ltd.) | 1.7 parts |
| Erucamide (Diamide L-200, from Nippon Kasei Chemical Co., Ltd.) | 1.7 parts |
| Oleamide (Diamide O-200, from Nippon Kasei Chemical Co., Ltd.) | 1.7 parts |
| Rosin (KE-311, from Arakawa Chemical Industries, Ltd.; resin acid content: 80 to 97% (composed of abietic acid 30 to 40%, neoabietic acid 10 to 20%, dihydro-abietic acid 14%, and tetrahydroabietic acid 14%))) | 11.4 parts |
| Surface active agent (Megafac F-176PF, from Dainippon Ink & Chemicals Inc.; solid content: 20%) | 2.1 parts |
| Inorganic pigment (MEK-K, 30% MEK solution available from Nissan Chemical Industries, Ltd.) | 7.1 parts |
| n-Propyl alcohol | 1050 parts |
| Methyl ethyl ketone | 295 parts |

The particle size distribution of the resulting coating composition for black image forming layer was measured with a laser scattering particle size distribution analyzer. As a result, the average particle size was 0.25 μm, and the proportion of particles of 1 μm or greater was 0.5%.

4) Formation of Black Image Forming Layer on Light-heat Conversion Layer Surface The above-described liquid coating solution for black image forming layer was applied on the surface of the above-described light-heat conversion layer with a wire bar for 1 minute and then dried in an oven at 100° C. for 2 minutes. Thus, a black image forming layer was formed on the light-heat conversion layer. By the above-described procedure, a heat transfer sheet having a light-heat conversion layer and a black image forming layer formed on a support in this order (hereinafter referred to as the heat transfer sheet K; hereinafter those having a yellow image forming layer, a magenta image forming layer and a cyan image forming layer will be referred as respectively to the heat transfer sheet Y, the heat transfer sheet M and the heat transfer sheet C) was constructed.

The optical density (OD) of the heat transfer sheet K measured with Macbeth Densitomether Model TD-904 (W-filter) was 0.91. The layer thickness of the black image forming layer was 0.60 μm on average.

The physical properties of the image forming layer thus obtained were as follows.

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 9.3 mmHg (≈1.24 kPa) in practice.

The coefficient of static friction of the image receiving layer, which is preferably of 0.2 or smaller, was 0.08 in practice.

Preparation of Heat Transfer Sheet Y

A heat transfer sheet Y was prepared in the same manner as for the heat transfer sheet K as described above, except for replacing the liquid coating composition for black image forming layer by a liquid coating composition for yellow image forming layer prepared according to the following formulation. The thickness of the yellow image forming layer of the heat transfer sheet Y was 0.42 μm.

| | |
|---|---|
| [Formulation of yellow pigment dispersion matrix] Formulation of yellow pigment dispersion 1: | |
| Polyvinyl butyral (S-LEC B BL-SH, from Sekisui Chemical Co., Ltd.) | 7.1 parts |
| Pigment Yellow 180 (C.I. No. 21290) (Novoperm Yellow P-HG, from Clariant (Japan) KK) | 12.9 parts |
| Pigment dispersant (Solsperse S-20000, from ICI) | 0.6 part |
| n-Propyl alcohol | 79.4 parts |
| [Formulation of yellow pigment dispersion matrix] Formulation of yellow pigment dispersion 2: | |
| Polyvinyl butyral (S-LEC B BL-SH, from Sekisui Chemical Co., Ltd.) | 7.1 parts |
| Pigment Yellow 139 (C.I. No. 56298) (Novoperm Yellow M2R 70, from Clariant (Japan) KK) | 12.9 parts |
| Pigment dispersant (Solsperse S-20000, from ICI) | 0.6 parts |
| n-Propyl alcohol | 79.4 parts |
| [Liquid coating composition for yellow image forming layer] | |
| Yellow pigment dispersion matrix described above yellow pigment dispersion 1:yellow pigment dispersion 2 = 95:5 (by part) | 126 parts |
| Polyvinyl butyral (S-LEC B BL-SH, available from Sekisui Chemical Co., Ltd.) | 4.6 parts |
| Waxes: | |
| (Stearamide (Newtron-2), from Nippon Fine Chemical Co., Ltd.) | 0.7 part |
| (Behenic acid amide (Diamide BM), from Nippon Kasei Chemical Co., Ltd.) | 0.7 part |
| (Lauramide (Diamide Y), from Nippon Kasei Chemical Co., Ltd.) | 0.7 part |
| (Palmitamide (Daimide KP), from Nippon Kasei Chemical Co., Ltd.) | 0.7 part |
| (Erucamide (Diamide L-200), from Nippon Kasei Chemical Co., Ltd.) | 0.7 part |
| (Oleamide (Diamide O-200), from Nippon Kasei Chemical Co., Ltd.) | 0.7 part |
| Nonionic surface active agent (Chemistat 1100, from Sanyo Chemical Industries, Ltd.) | 0.4 part |
| Rosin (KE-311, from Arakawa Chemical Industries, Ltd.; resin acid content: 80 to 97% (composed of abietic acid 30 to 40%, neoabietic acid 10 to 20%, dihydroabietic acid 14%, and tetrahydroabietic acid 14%)) | 2.4 parts |

-continued

| | |
|---|---|
| Surface active agent (Magafac F-176PF, from Dainippon Ink & Chemicals, Inc.; solid content: 20%) | 0.8 part |
| n-Propyl alcohol | 793 parts |
| Methyl ethyl ketone | 198 parts |

The physical properties of the image forming layer thus obtained were as follows.

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 2.3 mmHg (≈0.31 kPa) in practice.

The coefficient of static friction of the image receiving layer, which is preferably of 0.2 or smaller, was 0.1 in practice.

Preparation of Heat Transfer Sheet M

A heat transfer sheet M was prepared in the same manner as for the heat transfer sheet K as described above, except for replacing the liquid coating composition for black image forming layer by a liquid coating composition for magenta image forming layer prepared according to the following formulation. The thickness of the magenta image forming layer of the heat transfer sheet M was 0.38 μm.

| [Formulation of magenta pigment dispersion matrix] Formulation of magenta pigment dispersion 1: | |
|---|---|
| Polyvinyl butyral (Denka Butyral #2000-L, available from Denki Kagaku Kogyo KK; Vicat softening point: 57° C.) | 12.6 parts |
| Pigment Red 57:1 (C.I. No. 15850:1) (Symuler Brilliant Carmine 6B-229, from Dainippon Ink & Chemicals Inc.) | 15.0 parts |
| Pigment dispersant (Solsperse S-20000, from ICI) | 0.6 part |
| n-Propyl alcohol | 80.4 parts |
| [Formulation of magenta pigment dispersion matrix] Formulation of magenta pigment dispersion 2: | |
| Polyvinyl butyral (Denka Butyral #2000-L, available from Denki Kagaku Kogyo KK; Vicat softening point: 57° C.) | 12.6 parts |
| Pigment Red 57:1 (C.I. No. 15850:1) (Lionel Red 6B-4290G, from Toyo Ink Mgf. Co., Ltd.) | 15.0 parts |
| Pigment dispersant (Solsperse S-20000, from ICI) | 0.6 part |
| n-Propyl alcohol | 79.4 parts |
| [Formulation of Liquid coating composition for magenta image forming layer] | |
| Magenta pigment dispersion described above magenta pigment dispersion 1:magenta pigment dispersion 2 = 95:5 by part | 163 parts |
| Polyvinyl butyral (Denka Butyral #2000-L, available from Denki Kagaku Kogyo KK; Vicat softening point: 57° C.) | 4.0 parts |

-continued

| Waxes: | |
|---|---|
| (Stearamide (Newtron-2), from Nippon Fine Chemical Co., Ltd.) | 1.0 part |
| (Behenic acid amide (Diamide) BM, from Nippon Kasei Chemical Co., Ltd.) | 2.0 parts |
| (Palmitamide (Daimide) KP, from Nippon Kasei Chemical Co., Ltd.) | 1.0 part |
| (Erucamide (Diamide L-200), from Nippon Kasei Chemical Co., Ltd.) | 1.0 part |
| (Oleamide (Damide O-200), from Nippon Kasei Chemical Co., Ltd.) | 1.0 part |
| Nonionic surface active agent (Chemistat 1100, from Sanyo Chemical Industries, Ltd.) | 0.7 part |
| Rosin (KE-311, from Arakawa Chemical Industries, Ltd.; resin acid content: 80 to 97% (composed of abietic acid 30 to 40%, neoabietic acid 10 to 20%, dihydroabietic acid 14%, and tetrahydroabietic acid 14%)) | 4.6 parts |
| Pentaerythritol tetraacrylate (NK Ester A-TMMT, from Shin-Nakamura Chemical Co., Ltd.) | 2.5 parts |
| Surface active agent (Megafac F-176PF, from Dainippon Ink & Chemicals Inc.; solid content: 20%) | 1.3 part |
| n-Propyl alcohol | 848 parts |
| Methyl ethyl ketone | 246 parts |

The physical properties of the image forming layer thus obtained were as follows.

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 3.5 mmHg (≈0.47 kPa) in practice.

The coefficient of static friction of the image receiving layer, which is preferably of 0.2 or smaller, was 0.08 in practice.

Preparation of Heat Transfer Sheet C

A heat transfer sheet C was prepared in the same manner as for the heat transfer sheet K as described above, except for replacing the liquid coating composition for black image forming layer by a liquid coating composition for cyan image forming layer prepared according to the following formulation. The thickness of the cyan image forming layer of the heat transfer sheet M was 0.45 μm.

| [Formulation of cyan pigment dispersion matrix] Formulation of cyan pigment dispersion 1: | |
|---|---|
| Polyvinyl butyral (S-LEC B BL-SH, available from Sekisui Chemical Co., Ltd.) | 12.6 parts |
| Pigment Blue 15:4 (C.I. No. 74160) (Cyanine Blue 700-10FG, from Toyo Ink Mfg. Co., Ltd.) | 15.0 parts |

-continued

| | |
|---|---|
| Pigment dispersant (PW-36, from Kusumoto Chemicals Ltd.) | 0.8 part |
| n-Propyl alcohol | 110 parts |
| [Formulation of cyan pigment dispersion matrix] Formulation of cyan pigment dispersion 2: | |
| Polyvinyl butyral (S-LEC B BL-SH, available from Sekisui Chemical Co., Ltd.) | 12.6 parts |
| Pigment Blue 15 (C.I. No. 74160) (Lionel Blue 7027, from Toyo Ink Mgf. Co., Ltd.) | 15.0 parts |
| Pigment dispersant (PW-36, from Kusumoto Chemicals Ltd.) | 0.8 part |
| n-Propyl alcohol | 110 parts |
| [Formulation of liquid coating composition for cyan image forming layer] | |
| Cyan pigment dispersion described above cyan pigment dispersion 1:cyan pigment dispersion 2 = 90:10 by part | 118 parts |
| Polyvinyl butyral (S-LEC B BL-SH, available from Sekisui Chemical Co., Ltd.) | 5.2 parts |
| Inorganic pigment MEK-ST | 1.3 part |
| Waxes: | |
| (Stearamide (Newtron-2), from Nippon Fine Chemical Co., Ltd.) | 1.0 part |
| (Behenic acid amide (Diamide BM), from Nippon Kasei Chemical Co., Ltd.) | 1.0 part |
| (Lauramide (Diamide Y), from Nippon Kasei Chemical Co., Ltd.) | 1.0 part |
| (Palmitamide (Daimide KP), from Nippon Kasei Chemical Co., Ltd.) | 1.0 part |
| (Erucamide (Diamide L-200), from Nippon Kasei Chemical Co., Ltd.) | 1.0 part |
| (Oleamide (Damide O-200), from Nippon Kasei Chemical Co., Ltd.) | 1.0 part |
| Rosin (KE-311, from Arakawa Chemical Industries, Ltd.; resin acid content: 80 to 97% (composed of abietic acid 30 to 40%, neoabietic acid 10 to 20%, dihydroabietic acid 14%, and tetrahydroabietic acid 14%)) | 2.8 parts |
| Pentaerythritol tetraacrylate (NK Ester A-TMMT, from Shin-Nakamura Chemical Co., Ltd.) | 1.7 parts |
| Surface active agent (Megafac F-176PF, from Dainippon Ink & Chemicals Inc.; solid content: 20%) | 1.7 parts |
| n-Propyl alcohol | 890 parts |
| Methyl ethyl ketone | 247 parts |

The physical properties of the image forming layer thus obtained were as follows.

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 7.0 mmHg (≈0.93 kPa) in practice.

The coefficient of static friction of the image receiving layer, which is preferably of 0.2 or smaller, was 0.08 in practice.

Example 4-2

A heat transfer sheet was prepared in the same manner as in Example 4-1, except for replacing the polyimide resin in the liquid coating composition for light-heat conversion layer by a polyamide-imide resin (Vylomax HR-11NN; available from TOYOBO).

Comparative Example 4-1

A heat transfer sheet was prepared in the same manner as in Example 4-1, except for replacing the infrared absorbing colorant in the liquid coating composition for light-heat conversion layer by a cyanine colorant represented by the following formula (NK-2014, available from Nippon Kanko Shikiso).

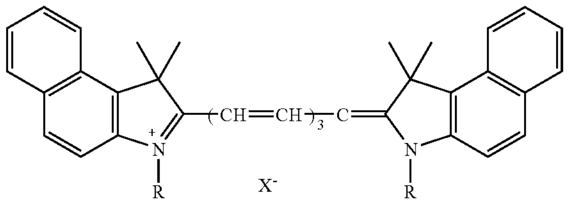

wherein R represents $CH_3$; while $X^-$ represents $ClO_4^-$.

Comparative Example 4-2

A heat transfer sheet was prepared in the same manner as in Example 4-2, except for replacing the infrared absorbing colorant in the liquid coating composition for light-heat conversion layer by a cyanine colorant represented by the above formula (NK-2014, available from Hayashibara Biochemical Laboratories, Inc.).

Preparation of Image Receiving Sheet

A liquid coating composition for cushioning layer and a liquid coating composition for image receiving layer were prepared according to the following formulations.

| | |
|---|---|
| 1) Formulation of liquid coating composition for cushioning layer | |
| Vinyl chloride-vinyl acetate copolymer (main binder) (MPR-TSL, available from Nisshin Chemical Industry Co., Ltd.) | 20 parts |
| Plasticizer (Paraplex G-40, available from The C.P. Hall Co.) | 10 parts |
| Fluorine-type surface active agent (coating aid) (Megafac F-177, available from Dainippon Ink & Chemicals, Inc.) | 0.5 part |
| Antistatic agent (quaternary ammonium salt) (SAT-5 Supper (IC), available from Nihon Jynyaku Co., Ltd.) | 0.3 part |

-continued

| | |
|---|---|
| Methyl ethyl ketone | 60 parts |
| Toluene | 10 parts |
| N,N-Dimethylformamide | 3 parts |
| 2) Formulation of liquid coating composition for image receiving layer | |
| Polyvinyl butyral (S-LEC B BL-SH, available from Sekisui Chemical Co., Ltd.) | 8 parts |
| Antistatic agent (Sanstat 2012A, available from Sanyo Chemical Industries, Ltd.) | 0.7 part |
| Surface active agent (Megafac F-177, from Dainippon Ink & Chemicals Inc.) | 0.1 part |
| n-Propyl alcohol | 20 parts |
| Methanol | 20 parts |
| 1-Methoxy-2-propanol | 50 parts |

The liquid coating composition for cushioning layer as described above was applied to a white PETP (polyethylene terephthalate) support having a thickness of 130 μm (Lumirror #130E58, available from Toray Industries, Inc.) with a small-width applicator and dried. Next, the liquid coating composition for image receiving layer was applied and dried to give an image receiving sheet. The coating amounts were controlled so as to give the cushion layer had a dry thickness of about 20 μm and the image receiving layer had a thickness of about 2 μm. The white PETP support used as a support is a void-containing PETP layer (thickness: 116 μm; void: 20%) laminated on both sides thereof with a titanium oxide-containing PETP layer (thickness: 7 μm; titanium oxide content: 2%) (total thickness: 130 μm; specific gravity: 0.8). Each of the thus prepared materials was wound into a roll and stored at room temperature for one week before using in image formation with laser light.

The physical properties of the obtained image receiving layer were as follows.

The surface roughness, which is preferably of from 0.4 to 0.01 μm, was 0.02 μm in practice.

The winding of the image receiving layer surface, which is preferably 2 μm or less, was 1.2 μm in practice.

The smooster value of the image forming layer, which is preferably 0.5 to 50 mmHg (≈0.0665 to 6.65 kPa) at 23° C. and 55% RH, was 0.8 mmHg (≈0.11 kPa) in practice.

The coefficient of static friction of the image receiving layer, which is preferably of 0.8 or smaller, was 0.37 in practice.

Formation of Transfer Image

The image receiving sheet (56 cm×79 cm) formed above was wound by suction around a recording drum having a diameter of 38 cm through suction holes of 1 mm in diameter of the drum (one hole per 3 cm by 8 cm area). Next, the above-described heat transfer sheet K (black) cut into a size of 61 cm×84 cm was superposed on the image receiving sheet with its four edges extending evenly from the edges of the image receiving sheet while being squeezed with a squeeze roller so that the two sheets were brought into intimate contact while allowing entrapped air to escape and be sucked. The degree of vacuum of the drum, measured with the suction holes closed, was (atmospheric pressure minus 150) mmHg (≈81.13 kPa). The above-described drum was rotated, and the laminate was scanned with semiconductor laser light having a wavelength of 808 nm and a spot diameter of 7 μm on the surface of the light-heat conversion layer, the laser being moving in a direction (sub scan direction) perpendicular to the drum rotating direction (main scan direction) to carry out recording of a laser image (scanning). The laser irradiation was carried out under the following-conditions. The laser beams employed were multibeams arranged in a two-dimensional parallelogram consisting of five lines of laser beams arrayed in the main scan direction and three rows of laser beams arrayed in the sub scan direction.

Laser power: 217 mJ/$m^2$

Environment: 23° C., 50% RH

The exposure drum preferably has a diameter of 360 mm or longer and a drum of 380 mm in diameter was employed in practice.

The recorded image size was 515 mm×728 mm, and the resolution was 2483 dpi.

After completion of laser recording, the laminate was removed from the drum, and the heat transfer sheet K was stripped by hand off the image receiving sheet. As a result, it was confirmed that the irradiated areas of the image forming layer of the heat transfer sheet K had been exclusively transferred from the heat transfer sheet K to the image receiving sheet.

In the same manner as described above, images were transferred from the above-described heat transfer sheet Y, heat transfer sheet M and heat transfer sheet C to the image receiving sheets. The four-color images thus transferred were re-transferred onto printing paper to form a multicolor image. Thus, multicolor images, which showed excellent image qualities and stable transfer densities, could be obtained by high-energy recording with laser light comprising two-dimensionally arranged multibeams under different temperature/humidity conditions.

Transfer to printing paper was performed by using a heat transfer apparatus provided with an insertion table made of a material having a dynamic frictional coefficient against a polyethylene terephthalate of from 0.1 to 0.7. The transporting speed was 15 to 50 mm/sec. The heat rolls were made of a material having a Vickers hardness of 70 (a preferred Vickers hardness of the material is 10 to 100).

<Measurement of Reflection Spectrum>

The transfer image recorded on the image receiving sheet was further transferred onto Tokuryo Art (DDCP-Art) paper using a laminator (CA600T available from Fuji Photo Film Co., Ltd.) and then the reflection spectrum was measured by using UV spectrophotometer UV-2100 supplied by Shimadzu Corp (post-recording). Without recording image by laser irradiation, the image forming layers of individual colors were transferred onto the image receiving sheet as such with the use of the above laminator. Next, the image forming layers having been transferred onto the image receiving sheet were transferred onto the Tokuryo Art paper and the reflection spectrum was measured as described above (pre-printing). Table 4 shows the reflectance (%) at cyan color (460 nm) showing the maximum difference between post-printing reflectance and pre-printing reflectance in the visual region.

<Measurement of Color Difference>

The chromaticity before exposure was measured by using X-rite 938 available form X-rite after recording image by laser irradiation and transferring the image to Tokuryo Art paper. The chromaticity after exposure was measured in the same manner after irradiating the above image transferred onto the Tokuryo Art paper with a light source of 30000 Lux until no change in chromaticity arose any more. As in the above-described case, a color difference was calculated from the chromaticity before exposure and the chromaticity after exposure using a cyan color showing the most remarkable change. Table 1 shows the results.

<Naked Eye Test>

After recording image by laser irradiation, the image was transferred onto Tokuryo Art paper. Then the image transferred onto the Tokuryo Art paper was exposed to a light source of 30000 Lux for 0.5 hour while one half of the image being covered with a light-blocking sheet and the other half being exposed. Then it was observed with the naked eye whether or not the boundary of the covered part and the exposed part was visible. Table 4 shows the results in symbols (O and X).

O: the boundary being invisible.

X: the boundary being visible.

TABLE 4

| | Pre-recording (a) | Post-recording (b) | Δ (a − b) | Color difference | Naked eye test |
|---|---|---|---|---|---|
| Ex. 4-1 | 89.2% | 84.1% | 5.1 | 0.8 | O |
| Ex. 4-2 | 89.6% | 83.0% | 6.6 | 1.1 | O |
| C.Ex.4-2 | 88.4% | 77.1% | 11.3 | 3.3 | X |
| C. Ex. 4-2 | 88.9% | 76.6% | 12.3 | 3.5 | X |

The results shown in Table 4 clearly shows that the images formed by using the multicolor image forming materials according to the present invention and transferred onto printing paper are excellent in light resistance.

INDUSTRIAL APPLICABILITY

In order to overcome new problems occurring in the laser heat transfer systems and achieve improved image qualities based on the thin film transfer techniques, the present inventors successfully developed a laser heat transfer recording system for DDCP products capable of providing sharpened dots in the thin film heat transfer method utilizing various techniques as described above which comprises a multicolor image forming material of halftone dot-printing, pigment type and B2 size, an output unit and a high-quality CMS software. That is, it has been successfully achieved by the present invention to provide a system configuration allowing the full exhibition of a material having a high resolution. More specifically speaking, the present invention can provide contract proofs usable as a substitute for galley proofs and analog-type color proofs fitting for the tendency toward the film-less CTP age. These proofs of the invention can reproduce colors approximating to the final printings and analog-type color proofs which are satisfactorily accepted by clients. The present invention can provide a DDCP system with the use of the same pigment colorants as used in printing inks which enables transfer to printing papers without moire. According to the present invention, moreover, a digital color proof system enabling transfer to printing papers, using the same pigment colorants as used in printing inks and allowing printing of a high approximation in a large size (A2/B2 or larger) can be provided. The present invention provides a system whereby transfer onto printing papers can be carried out by halftone recording by the laser thin film heat transfer method with the use of pigment colorants.

Furthermore, the present invention can provide a multicolor image forming material being excellent in stability with time of a liquid coating solution for light-heat conversion layer, being excellent in the sensitivity and light-resistance of heat transfer sheet, being capable of forming images, which have excellent image qualities and stable transfer density, on an image receiving sheet even in the case of high-energy laser recording with multibeam laser light under various temperature and humidity conditions while showing no recording error such as film fogging caused by the transfer of the light-heat conversion layer together with the image forming layer to the image receiving sheet after recording.

The invention claimed is:

1. A multicolor image forming system comprising an image receiving sheet containing an image receiving layer and at least four heat transfer sheets each containing at least a light-heat conversion layer and an image forming layer formed on a support, each of the heat transfer sheets being adapted to be superposed on the image receiving sheet with the image forming layer facing the image receiving layer and irradiated with laser light to transfer a laser-irradiated area of the image forming layer to the image receiving layer of the image receiving sheet to record an image, wherein the light-heat conversion layer contains a polyamide-imide comprising repeating units represented by the following general formula (I) as a binder

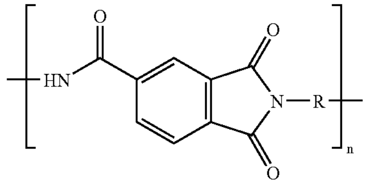

(I)

wherein R represents a divalent linking group.

2. The multicolor image forming system according to claim 1, wherein a colorant represented by the following general formula (I') is used as a light-heat converting substance in the light-heat conversion layer:

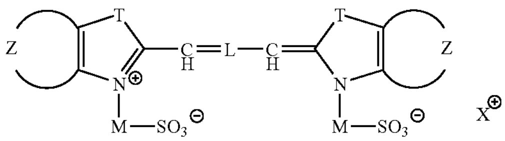

(I')

wherein Z represents an atomic group for forming a benzene ring, a naphthalene ring or a heterocyclic aromatic ring;

T represents —O—, —S—, —Se, —N($R^1$)—, —C($R^2$)($R^3$)— or —C($R^4$)=C($R^5$)—, in which $R^1$, $R^2$ and $R^3$ each independently represent an alkyl group, an alkenyl group or an aryl group, and $R^4$ and $R^5$ each independently represent a hydrogen atom, a halogen atom, an alkyl group, an aryl group, an alkoxy group, an aryloxy group, a carboxyl group, an acyl group, an acylamino group, a carbamoyl group, a sulfamoyl group or a sulfonamido group;

L represents a trivalent linking group formed by five or seven methine groups bonded to each other via conjugated double bonds;

M represents a divalent linking group; and $X^+$ represents a cation.

3. The multicolor image forming system according to claim 1, wherein the polyamide-imide has a glass transition temperature of 260° C. of higher.

4. The multicolor image forming system according to claim 1, wherein the polyamide-imide has a 5% mass reduction temperature determined by a TGA method of 400° C. or higher.

5. The multicolor image forming system according to claim 1, wherein a degree of deformation (deformation percentage) calculated in accordance with the following numerical formula (1) in the laser-irradiated area of the light-heat conversion layer observed under a laser microscope is 150% or more:

$$\text{deformation percentage } (\%)=\{(a+b)/(b)\}\times 100 \quad \text{Numerical formula (1)}$$

wherein a stands for a cross-section area of the light-heat conversion layer having been enlarged after irradiation; and b stands for a cross-sectional area of the light-heat conversion layer before irradiation.

6. The multicolor image forming system according to claim 1, wherein the binder in the light-heat conversion layer has a cohesive energy density of 27 or more.

7. The multicolor image forming system according to claim 1, wherein a ratio of optical density (OD) to layer thickness (μm) (OD/layer thickness) of the light-heat conversion layer is 0.57 or more.

8. The multiple color image forming system according to claim 1, wherein a resolution of a recorded image is 2000 dpi or higher.

9. The multiple color image forming system according to claim 1, wherein the number-average molecular weight, as determined by gel permeation chromatography and expressed in terms of polystyrene, of the polyamide-imide represented by general formula (I) is in the range of from 3000 to 50000.

10. The multiple color image forming system according to claim 1, wherein the number-average molecular weight, as determined by gel permeation chromatography and expressed in terms of polystyrene, of the polyamide-imide represented by general formula (I) is in the range of from 10000 to 25000.

* * * * *